United States Patent
Murooka

(10) Patent No.: US 11,069,745 B2
(45) Date of Patent: *Jul. 20, 2021

(54) MEMORY DEVICE

(71) Applicant: TOSHIBA MEMORY CORPORATION, Minato-ku (JP)

(72) Inventor: Kenichi Murooka, San Jose, CA (US)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/787,225

(22) Filed: Feb. 11, 2020

(65) Prior Publication Data
US 2020/0176514 A1    Jun. 4, 2020

Related U.S. Application Data

(63) Continuation of application No. 16/172,088, filed on Oct. 26, 2018, now Pat. No. 10,600,845, which is a
(Continued)

(51) Int. Cl.
*H01L 27/24* (2006.01)
*G11C 7/10* (2006.01)
(Continued)

(52) U.S. Cl.
CPC ............ *H01L 27/2481* (2013.01); *G11C 5/02* (2013.01); *G11C 5/06* (2013.01); *G11C 5/063* (2013.01);
(Continued)

(58) Field of Classification Search
None
See application file for complete search history.

(56) References Cited

U.S. PATENT DOCUMENTS 6,649,953 B2    11/2003  Cha
6,759,707 B2 *   7/2004  Prall ................... H01L 27/115
                                                         257/314
(Continued)

FOREIGN PATENT DOCUMENTS

JP    2007-536680    10/2007
JP    2008-181978     8/2008
(Continued)

OTHER PUBLICATIONS

Office Action dated Jun. 16, 2015 in Japanese Patent Application No. 2012-197238 (with English translation).

*Primary Examiner* — James G Norman
(74) *Attorney, Agent, or Firm* — Oblon, McClelland, Maier & Neustadt, L.L.P.

(57) ABSTRACT

According to one embodiment, a memory device includes first to third interconnects, memory cells, and selectors. The first to third interconnects are provided along first to third directions, respectively. The memory cells includes variable resistance layers formed on two side surfaces, facing each other in the first direction, of the third interconnects. The selectors couple the third interconnects with the first interconnects. One of the selectors includes a semiconductor layer provided between associated one of the third interconnects and associated one of the first interconnects, and gates formed on two side surfaces of the semiconductor layer facing each other in the first direction with gate insulating films interposed therebetween.

20 Claims, 64 Drawing Sheets

Related U.S. Application Data continuation of application No. 15/650,526, filed on Jul. 14, 2017, now Pat. No. 10,141,374, which is a continuation of application No. 15/152,342, filed on May 11, 2016, now Pat. No. 9,741,766, which is a continuation of application No. 14/472,094, filed on Aug. 28, 2014, now Pat. No. 9,368,160, which is a continuation of application No. 13/313,186, filed on Dec. 7, 2011, now Pat. No. 8,891,277.

(51) Int. Cl.

| | | |
|---|---|---|
| *G11C 13/00* | (2006.01) | |
| *G11C 5/02* | (2006.01) | |
| *G11C 5/06* | (2006.01) | |
| *H01L 21/768* | (2006.01) | |
| *H01L 29/66* | (2006.01) | |
| *H01L 45/00* | (2006.01) | |

(52) U.S. Cl.
CPC ........ *G11C 7/1006* (2013.01); *G11C 13/0002* (2013.01); *G11C 13/003* (2013.01); *G11C 13/004* (2013.01); *G11C 13/0007* (2013.01); *G11C 13/0023* (2013.01); *G11C 13/0026* (2013.01); *G11C 13/0028* (2013.01); *G11C 13/0069* (2013.01); *G11C 13/0097* (2013.01); *H01L 21/768* (2013.01); *H01L 27/249* (2013.01); *H01L 27/2454* (2013.01); *H01L 29/66666* (2013.01); *H01L 45/1233* (2013.01); *H01L 45/146* (2013.01); *H01L 45/147* (2013.01); *H01L 45/149* (2013.01); *H01L 45/1608* (2013.01); *G11C 2213/31* (2013.01); *G11C 2213/32* (2013.01); *G11C 2213/35* (2013.01); *G11C 2213/71* (2013.01); *G11C 2213/78* (2013.01); *H01L 45/04* (2013.01); *H01L 45/1226* (2013.01)

(56) References Cited

U.S. PATENT DOCUMENTS

| | | | |
|---|---|---|---|
| 7,952,163 B2 | 5/2011 | Baek et al. | |
| 8,084,830 B2 | 12/2011 | Kanno et al. | |
| 8,254,160 B2 | 8/2012 | Murooka et al. | |
| 8,295,077 B2 | 10/2012 | Murooka | |
| 8,406,034 B2 | 3/2013 | Murooka | |
| 8,891,277 B2 * | 11/2014 | Murooka | G11C 13/0007 365/63 |
| 8,963,115 B2 | 2/2015 | Murooka | |
| 8,971,093 B2 | 3/2015 | Murooka | |
| 9,224,459 B1 | 12/2015 | Murooka | |
| 9,368,160 B2 * | 6/2016 | Murooka | H01L 27/2481 |
| 9,741,766 B2 | 8/2017 | Murooka | |
| 10,141,374 B2 * | 11/2018 | Murooka | G11C 13/0097 |
| 10,600,845 B2 * | 3/2020 | Murooka | G11C 13/0023 |
| 2004/0090815 A1 | 5/2004 | Tajiri | |
| 2008/0265235 A1 | 10/2008 | Kamigaichi | |
| 2009/0141547 A1 | 6/2009 | Jin et al. | |
| 2009/0273054 A1 | 11/2009 | Kim et al. | |
| 2010/0027316 A1 | 2/2010 | Yoon et al. | |
| 2010/0259960 A1 | 10/2010 | Samachisa | |
| 2010/0259961 A1 * | 10/2010 | Fasoli | G11C 13/0011 365/51 |
| 2010/0259962 A1 | 10/2010 | Yan et al. | |
| 2011/0261606 A1 | 10/2011 | Sandhu et al. | |
| 2011/0261607 A1 | 10/2011 | Tang et al. | |
| 2012/0147644 A1 | 6/2012 | Scheuerlein | |
| 2012/0147645 A1 | 6/2012 | Scheuerlein | |
| 2012/0147646 A1 | 6/2012 | Scheuerlein | |
| 2012/0147647 A1 | 6/2012 | Scheuerlein | |
| 2012/0147648 A1 | 6/2012 | Scheuerlein | |
| 2012/0147649 A1 | 6/2012 | Samachisa et al. | |
| 2012/0147650 A1 | 6/2012 | Samachisa et al. | |
| 2012/0147651 A1 | 6/2012 | Scheuerlein et al. | |
| 2012/0147652 A1 | 6/2012 | Scheuerlein | |
| 2012/0147689 A1 * | 6/2012 | Scheuerlein | G11C 13/0026 365/230.03 |
| 2013/0043455 A1 | 2/2013 | Bateman | |
| 2015/0103581 A1 | 4/2015 | Murooka | |

FOREIGN PATENT DOCUMENTS

| | | |
|---|---|---|
| JP | 4299882 B2 | 7/2009 |
| JP | 2010-287872 | 12/2010 |
| JP | 2011-129639 | 6/2011 |
| JP | 4719233 B2 | 7/2011 |

* cited by examiner

| | Write | Erase | Read |
|---|---|---|---|
| SSG_s | Vg_w | Vg_e | Vg_r |
| SSG_n | Vg_w | Vg_e | Vg_r |
| SSG_u | 0 | 0 | 0 |
| GBL_s | Vw | +1 | Vr+Vo |
| GBL_u | Vw/2 | (Ve/2)+1 | Vr+Vo |
| WL_s | 0 | Ve+1 | Vo |
| WL_u | Vw/2 | (Ve/2)+1 | Vr+Vo |

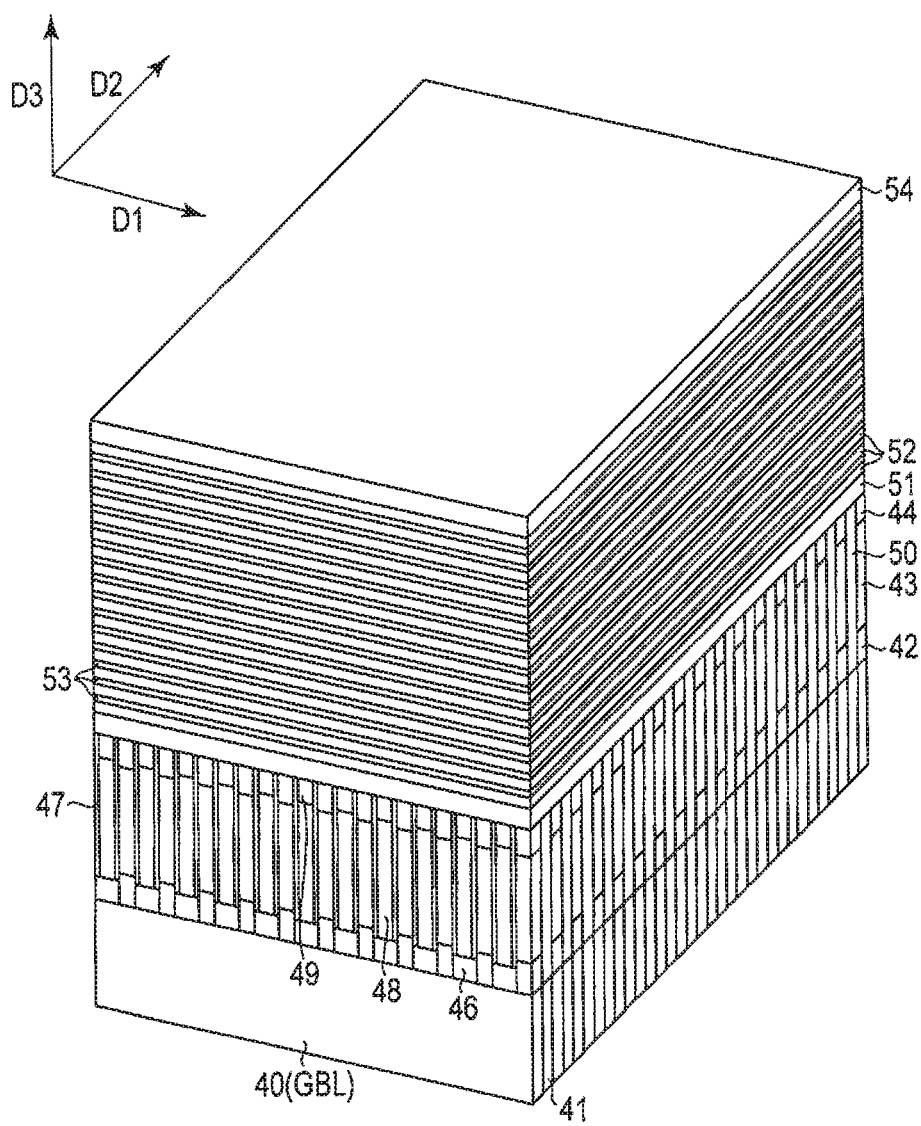
F I G. 19

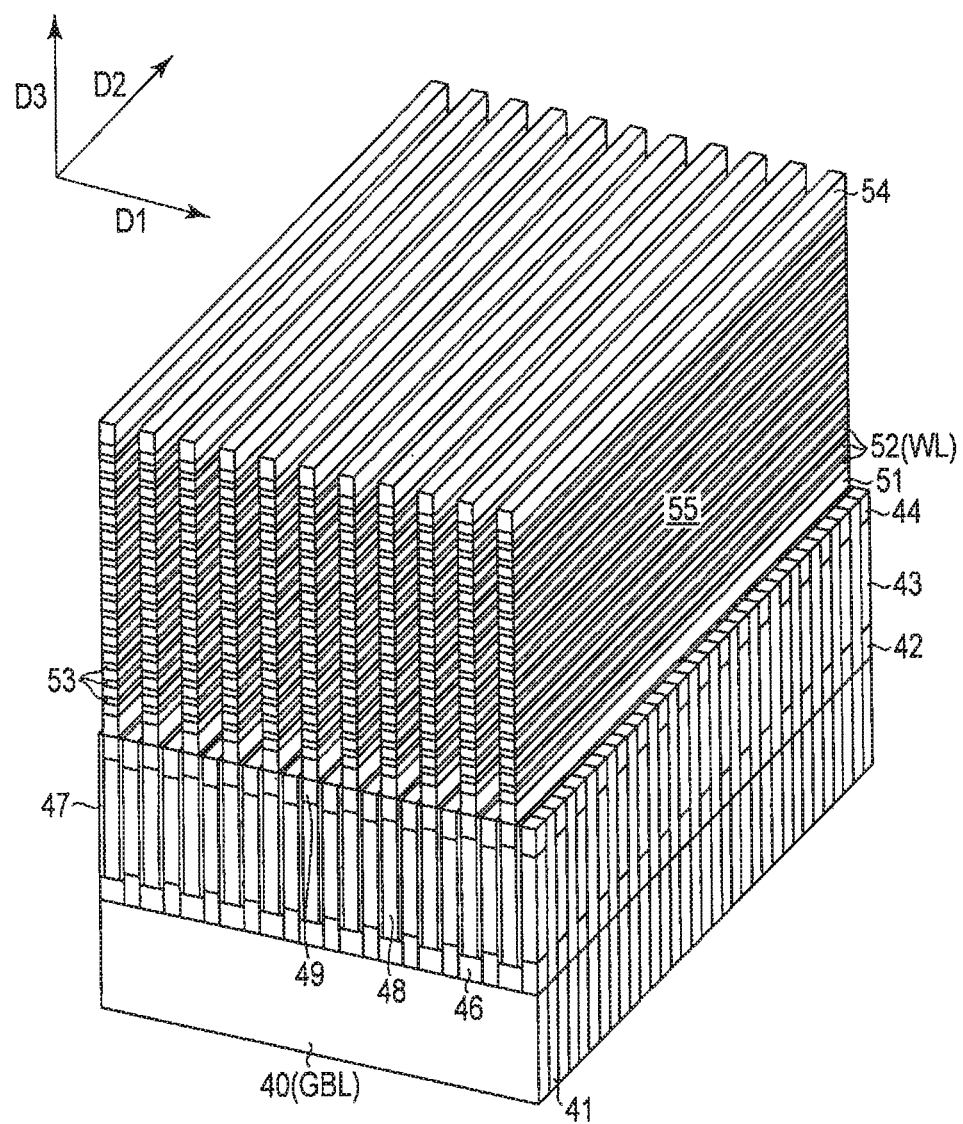
F I G. 20

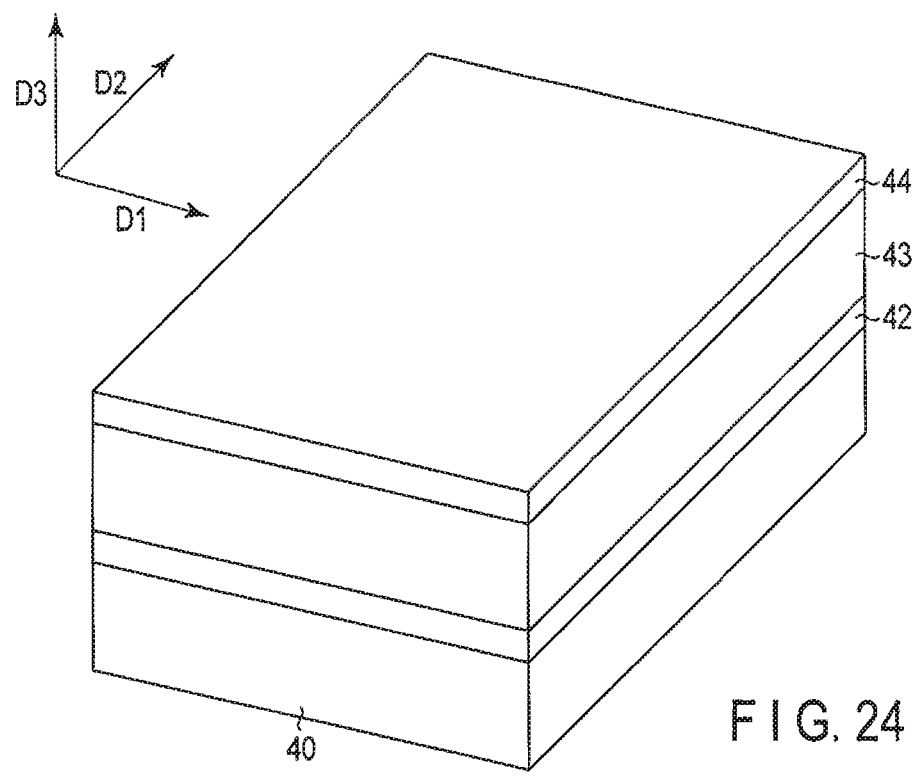
F I G. 24
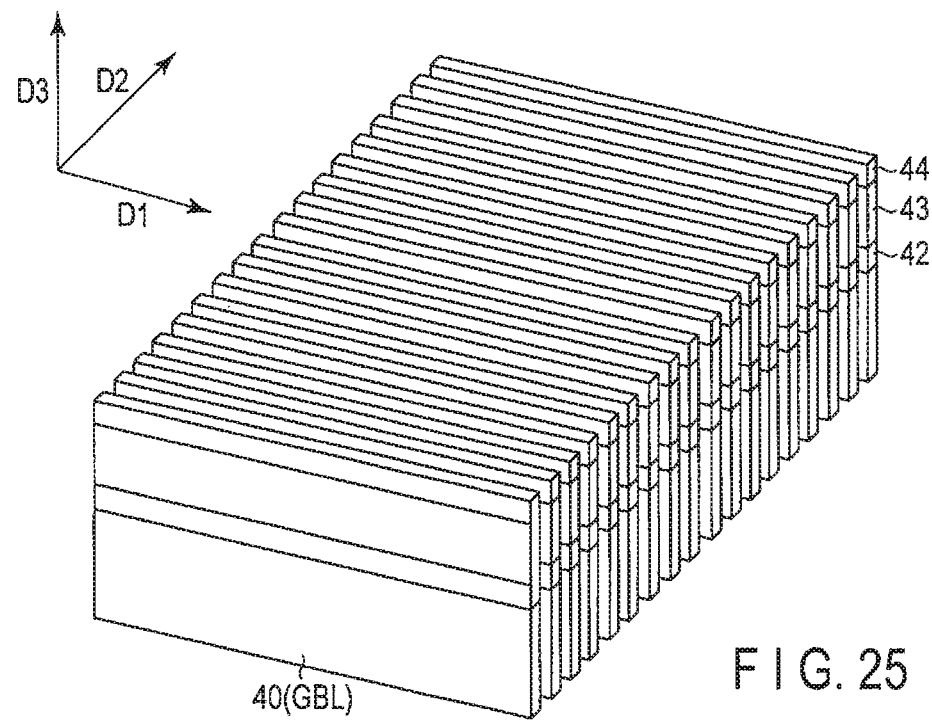
F I G. 25

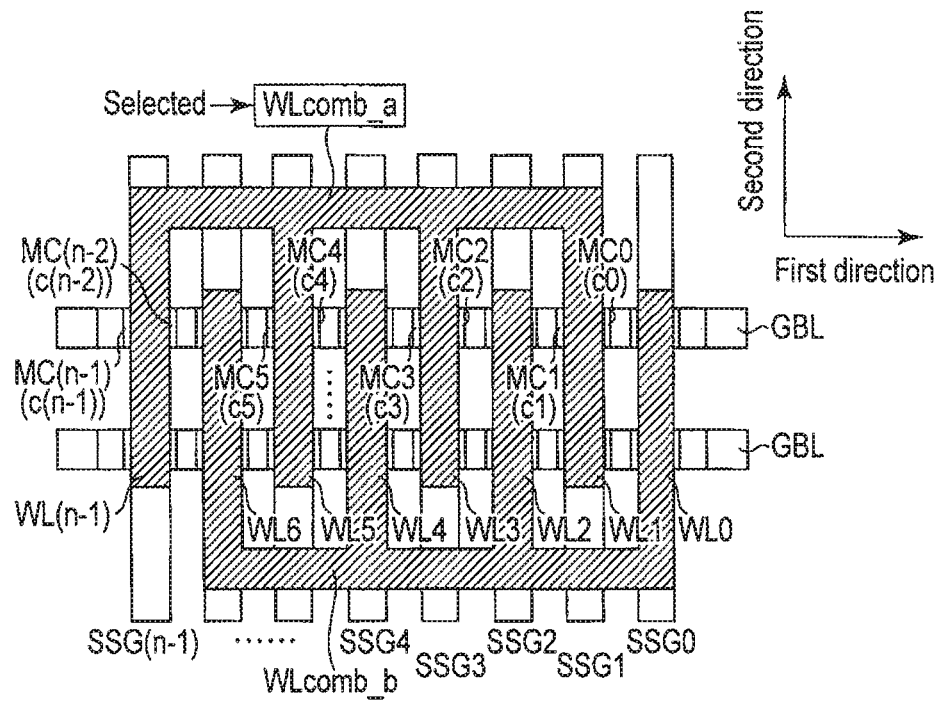
F I G. 31
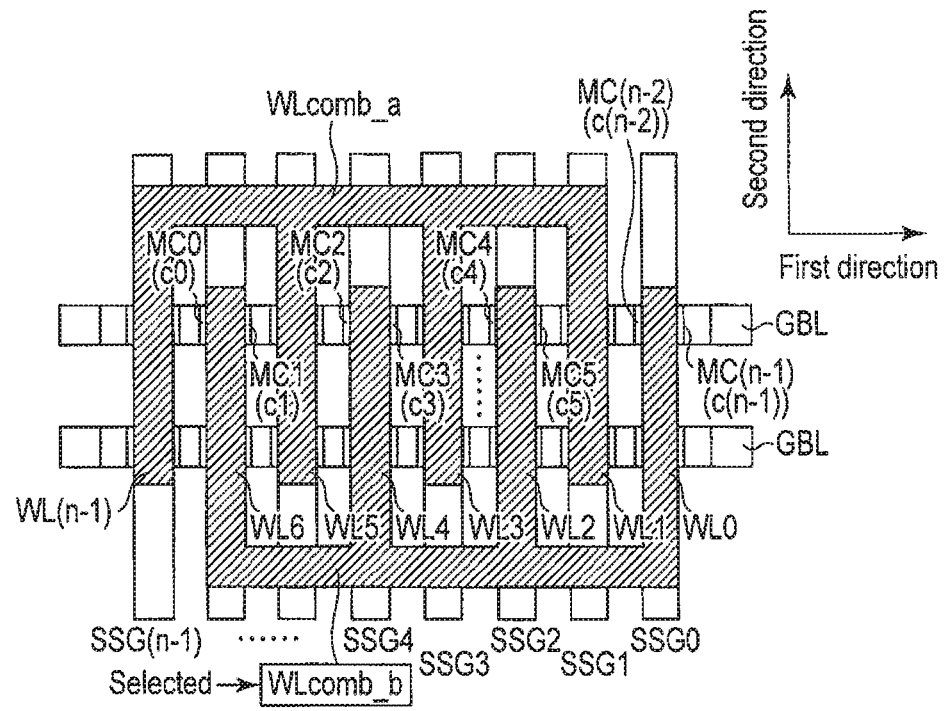
F I G. 32

Conversion example of binary (SLC) data

Ex. 1)
Data value d : ( 1, 1, 0, 0, 1, 1, 0, 1 )   (d0, d1, d2, ..., d7)

Cell value c : ( 1, 0, 0, 0, 1, 0, 0, 1 )   (c0, c1, c2, ..., c7)

Read value : ( 1, 1, 0, 0, 1, 1, 0, 1 )

Ex. 2)
Data value d : ( 1, 0, 0, 1, 1, 0, 1, 0 )

Cell value c : ( 1, ①, ①, 0, 1, ①, 0, 0 )

Read value : ( 1, ⓪, ⓪, 1, 1, ⓪, 1, 0 )

FIG. 34

Conversion example of multi-level (MLC) data

Ex. 3)
Data value d : ( 1, 3, 1, 2, 3, 0, 2, 0 )   (d0, d1, d2, ..., d7)

Cell value c : ( 1, 2, ③, ③, 0, 0, 2, ② )   (c0, c1, c2, ..., c7)

Read value : ( 1, 3, ①, ②, 3, 0, 2, ⓪ )

FIG. 35

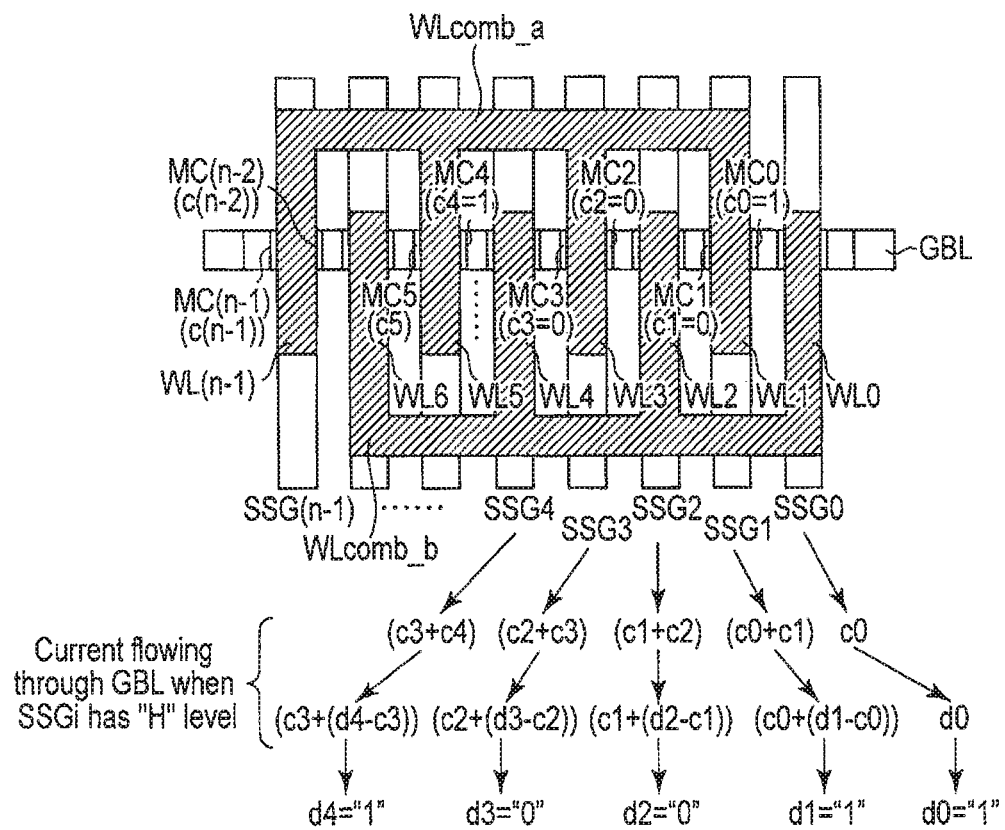
F I G. 36

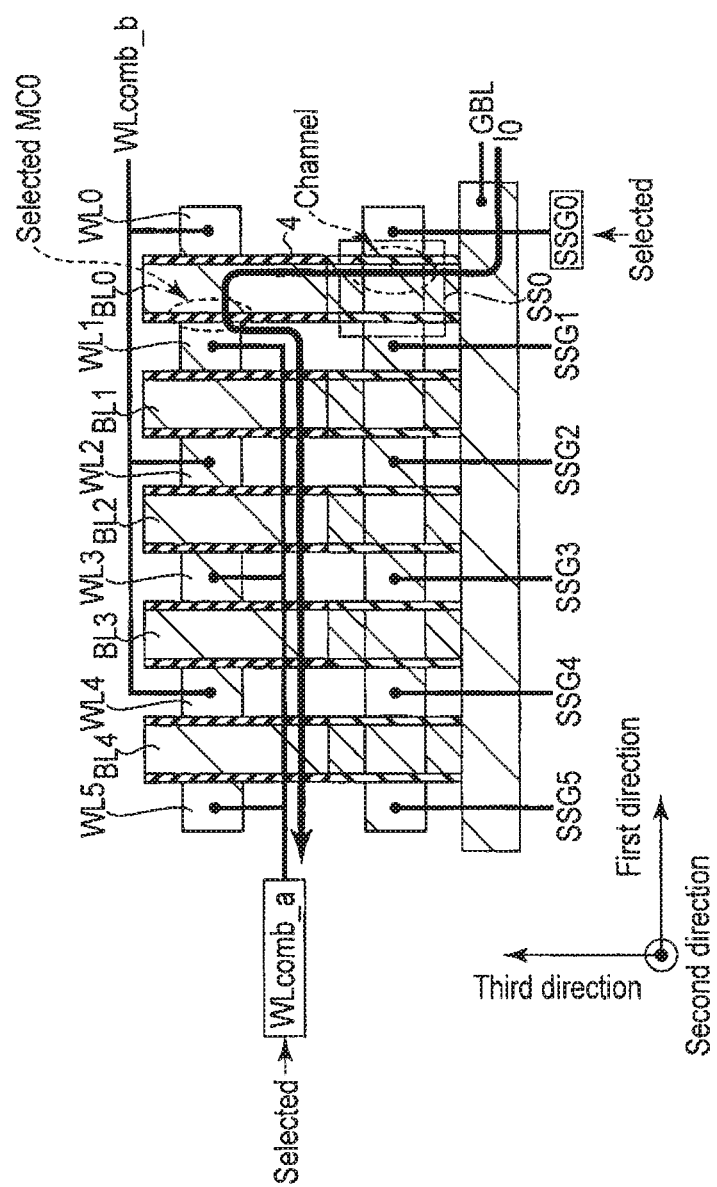
F I G. 37

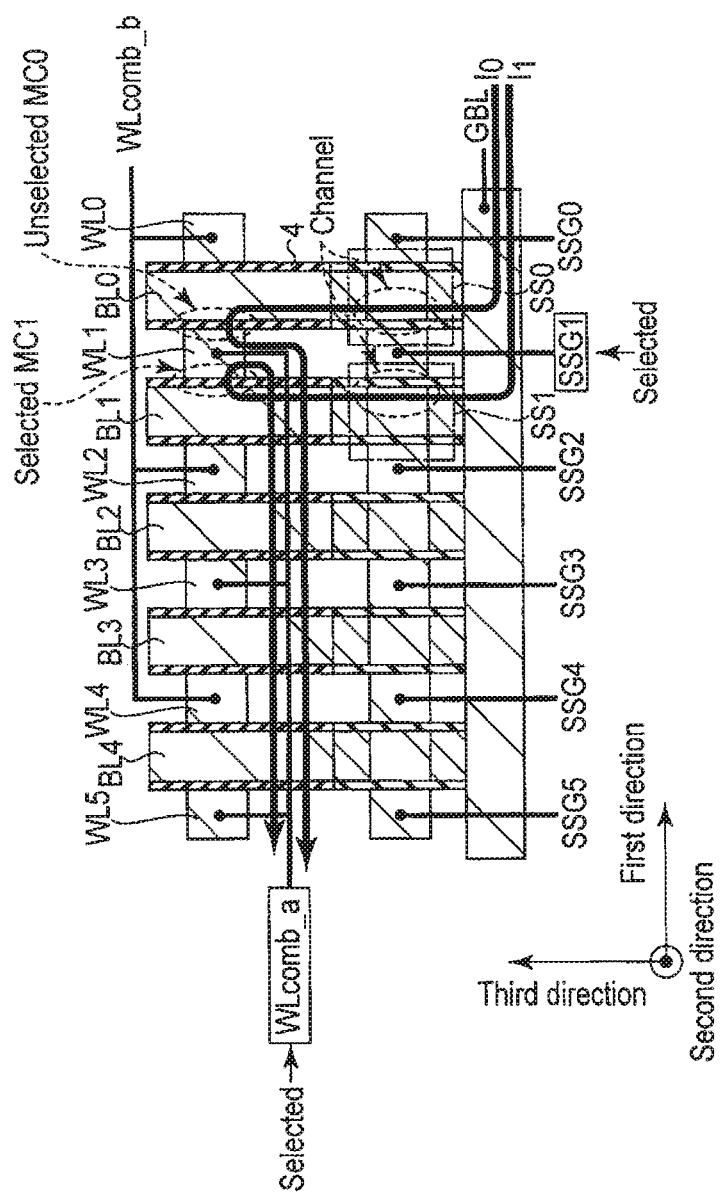
F I G. 38

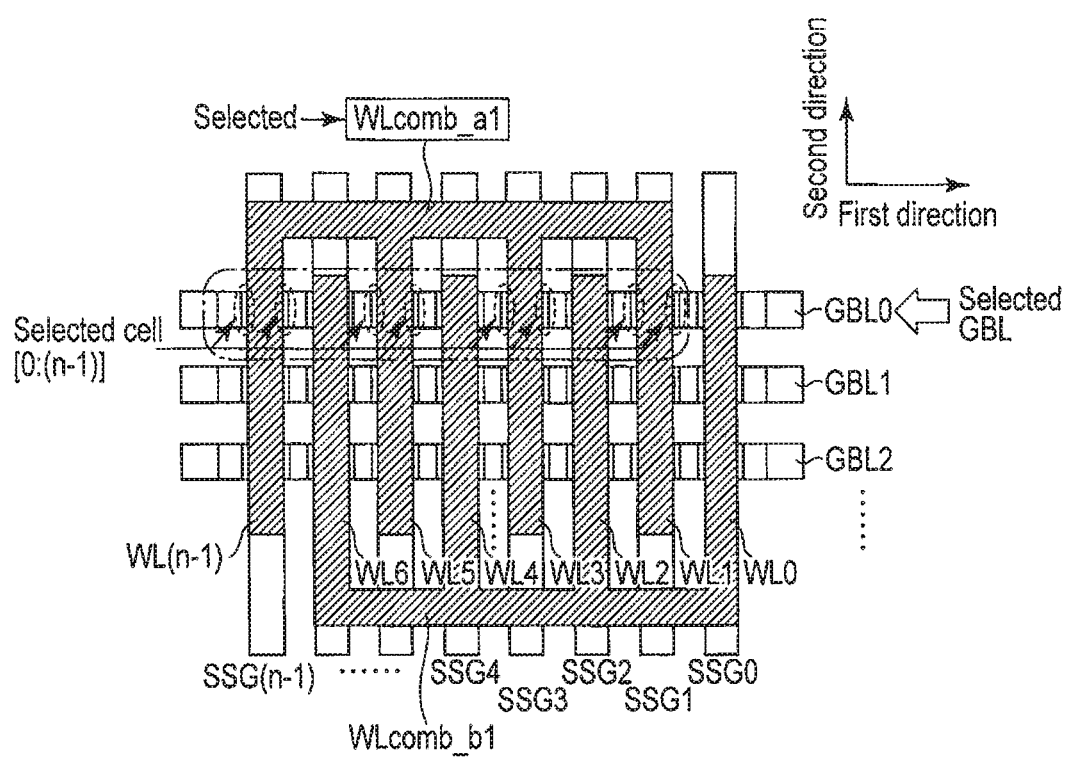
F I G. 44
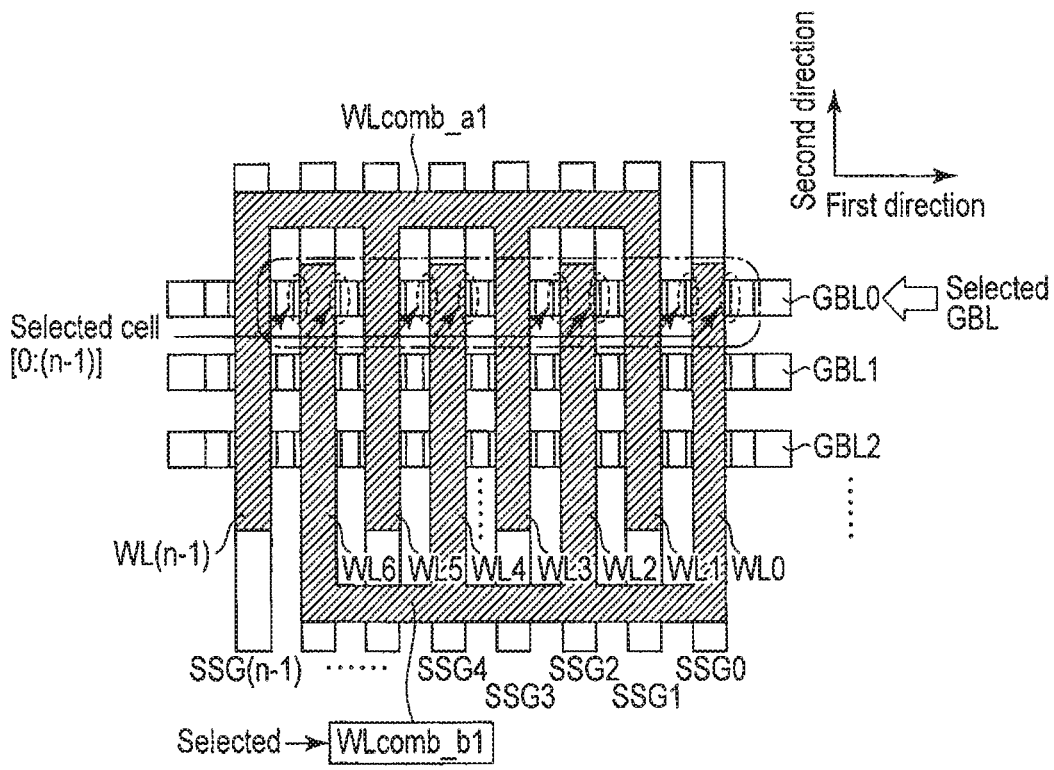
F I G. 45

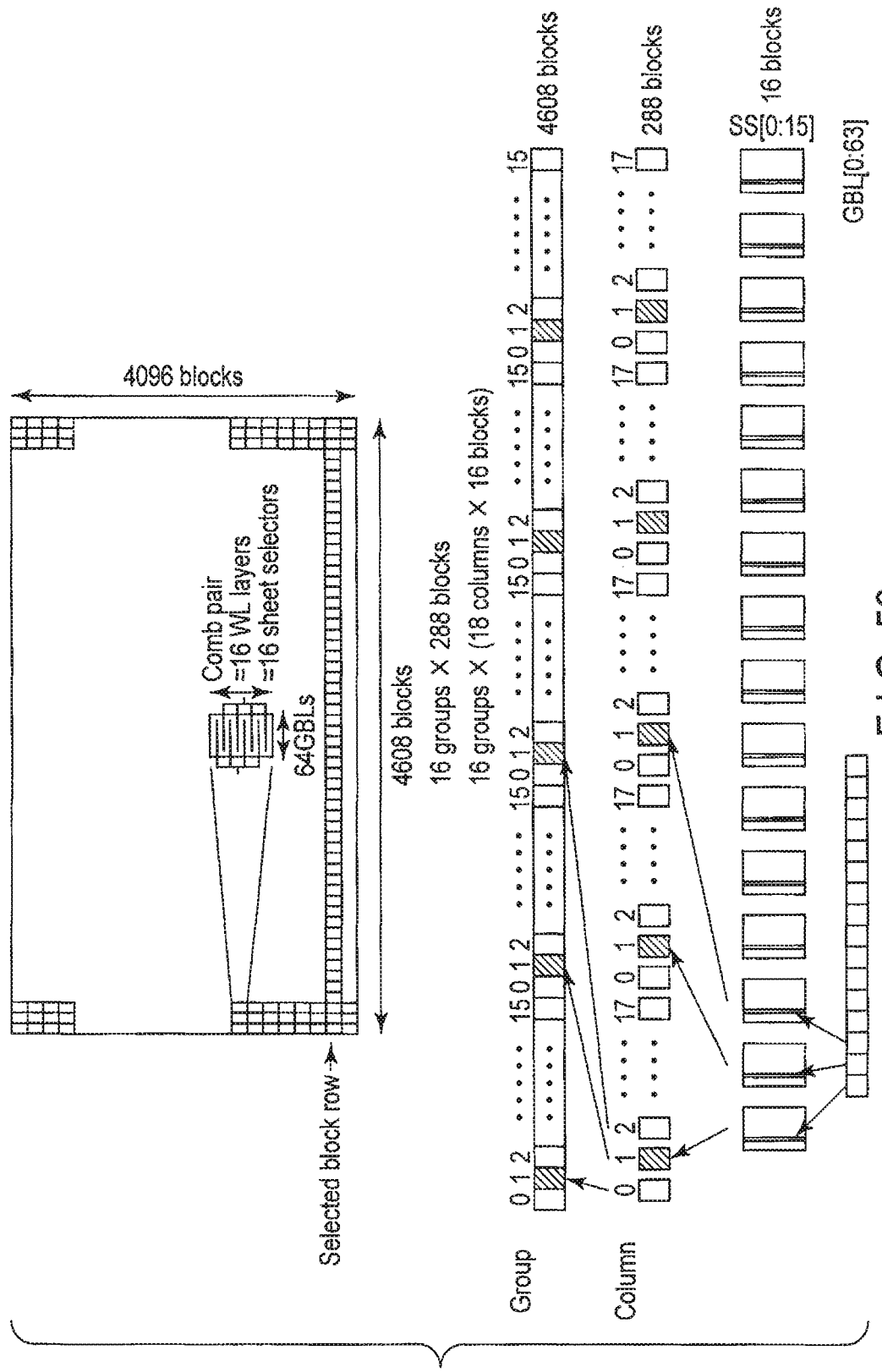
F I G. 53

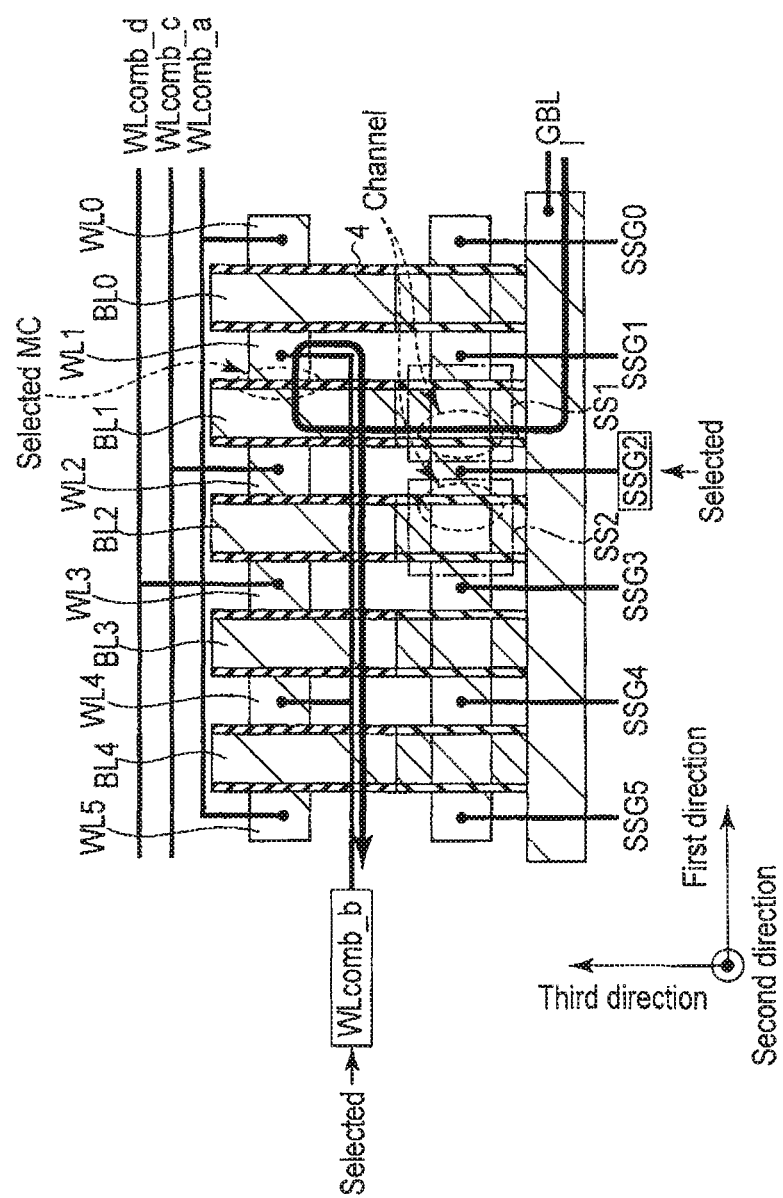
F I G. 57

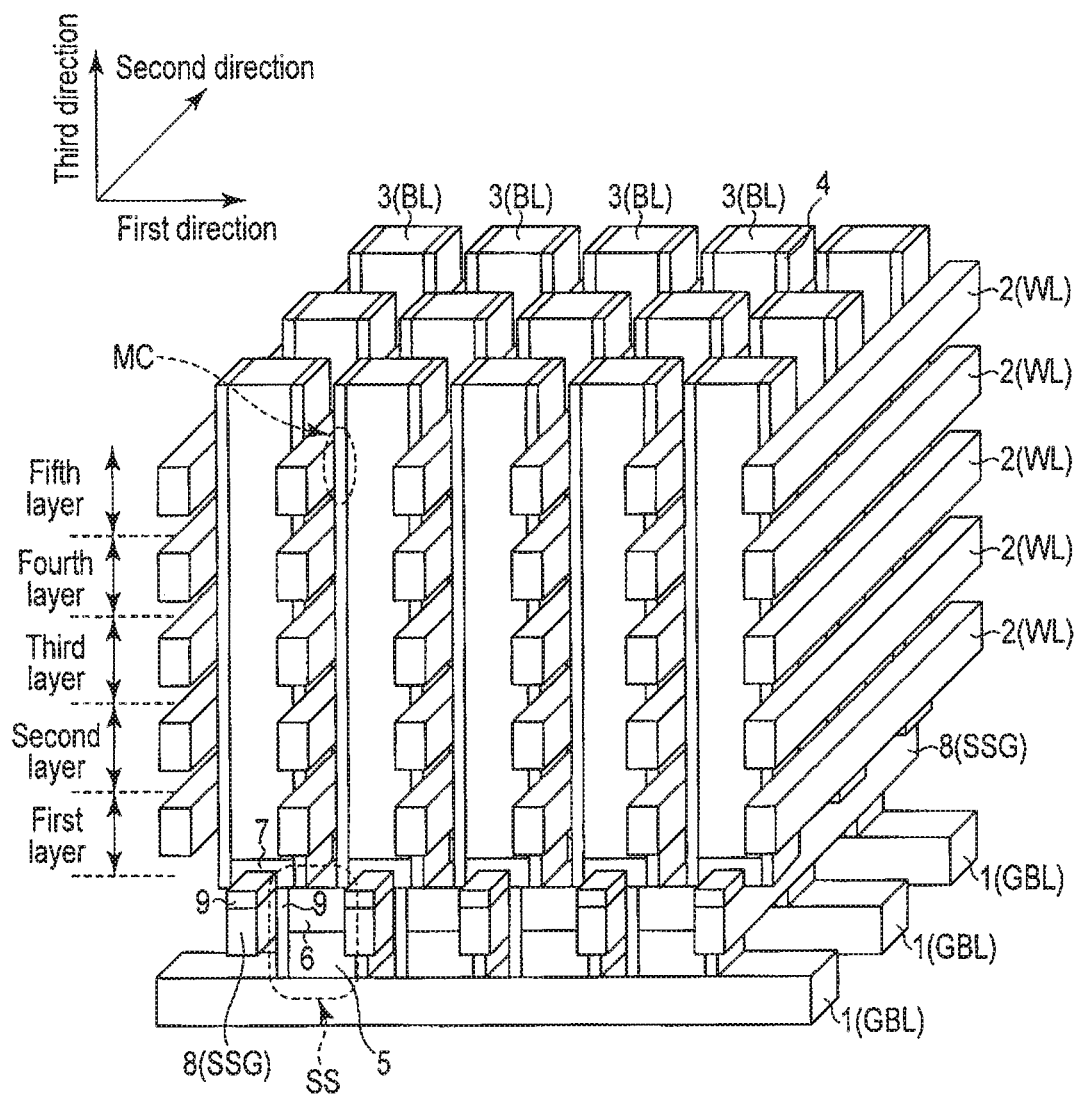
F I G. 61

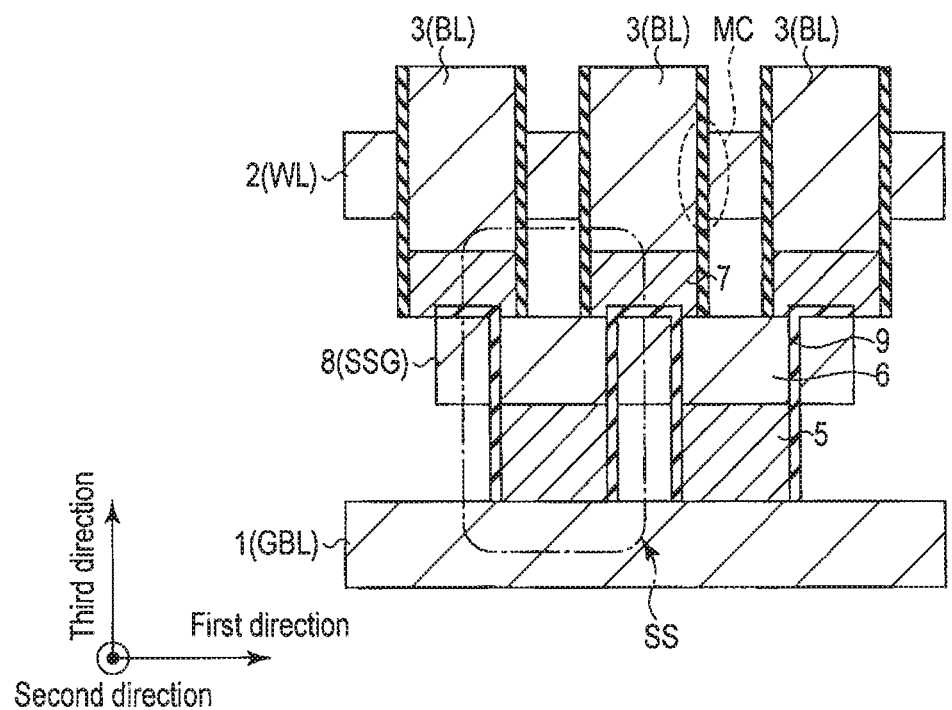
F I G. 62
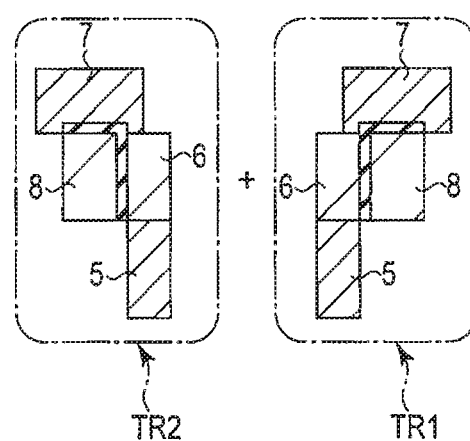
F I G. 63

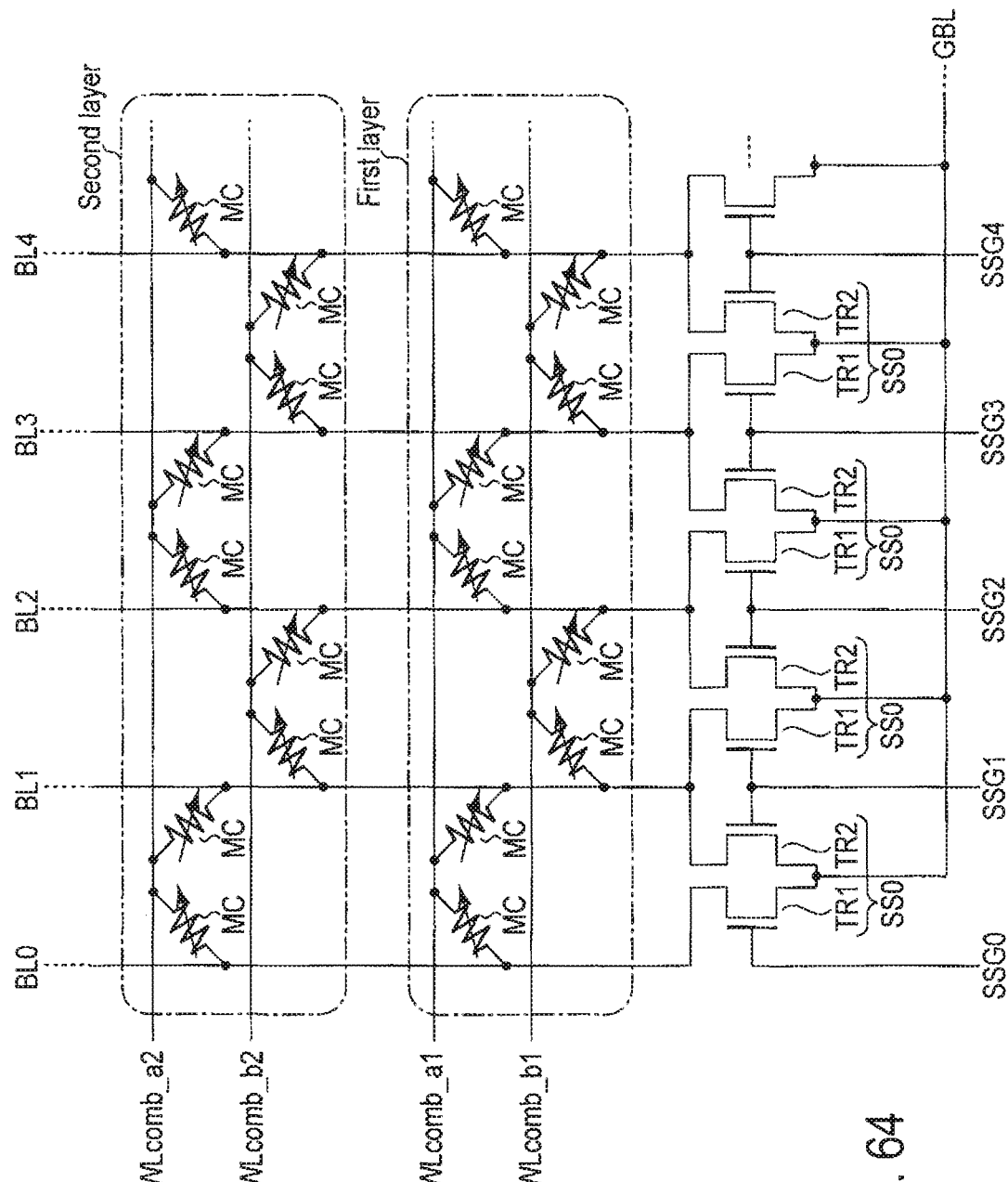
F I G. 64

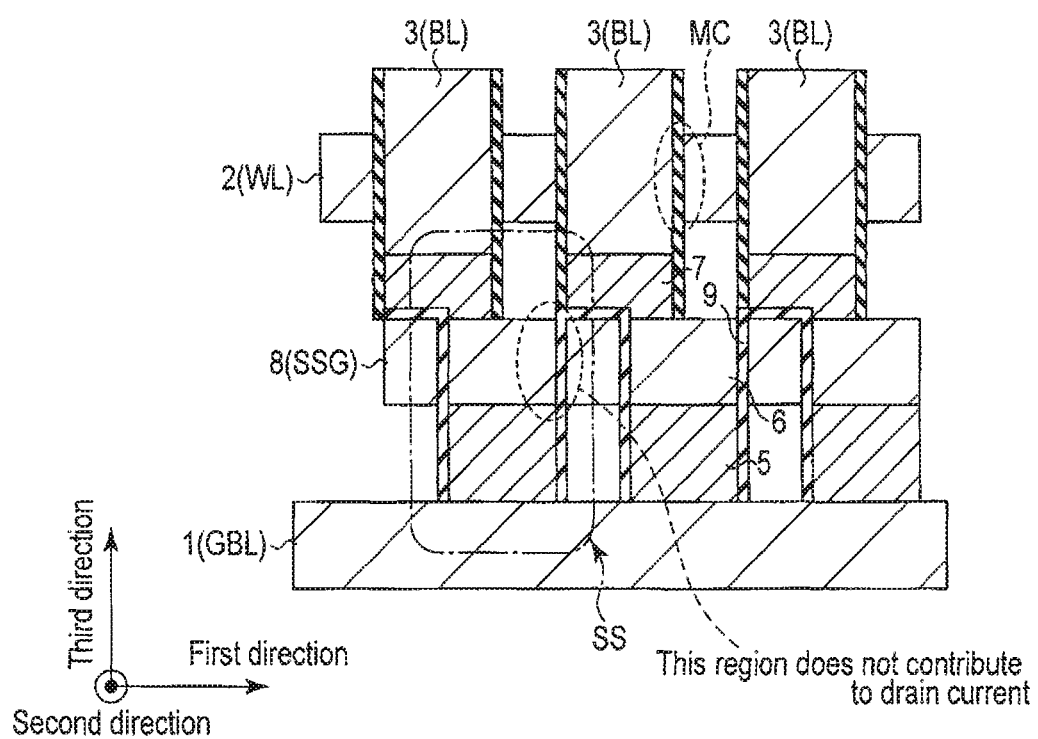
F I G. 69

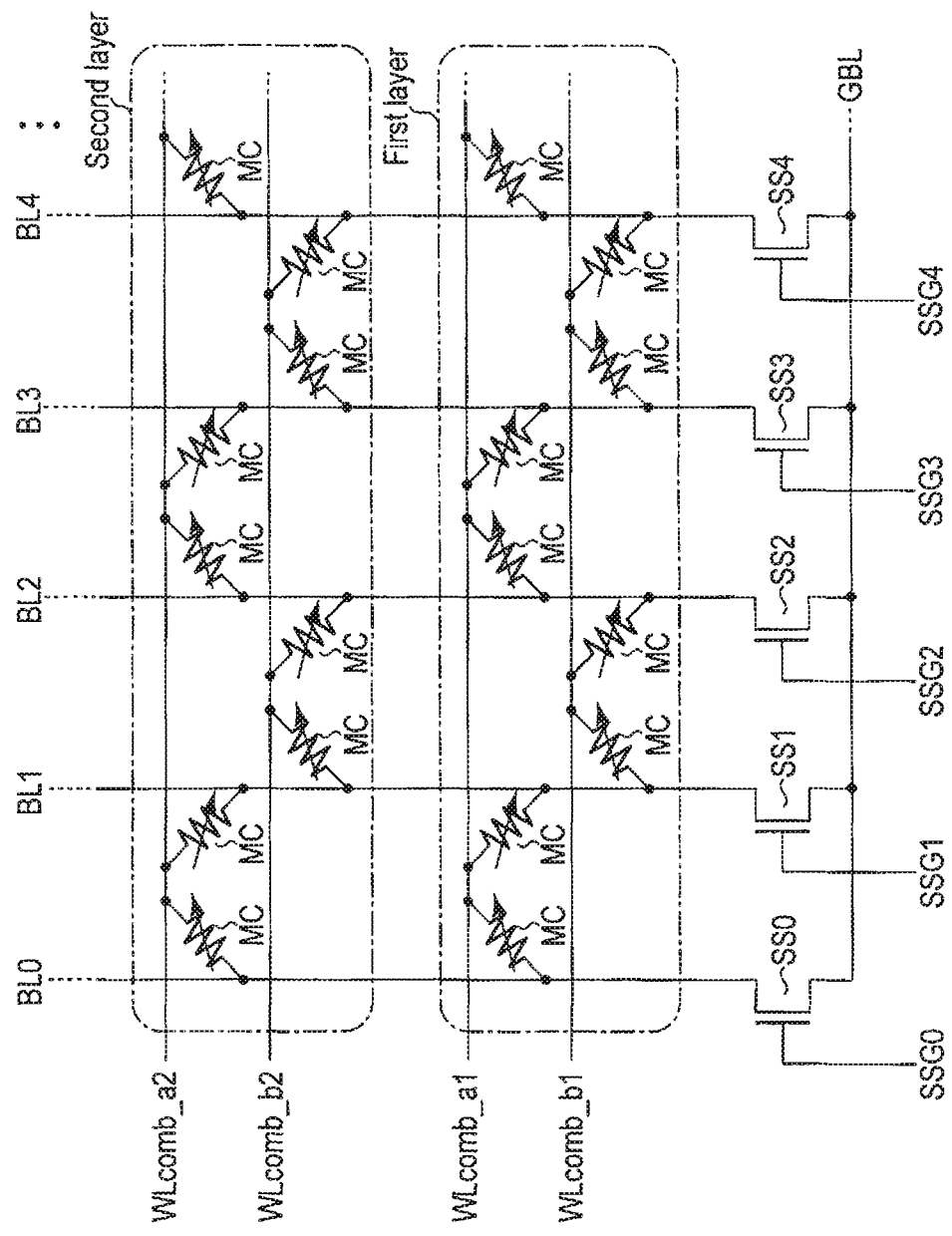
F I G. 70

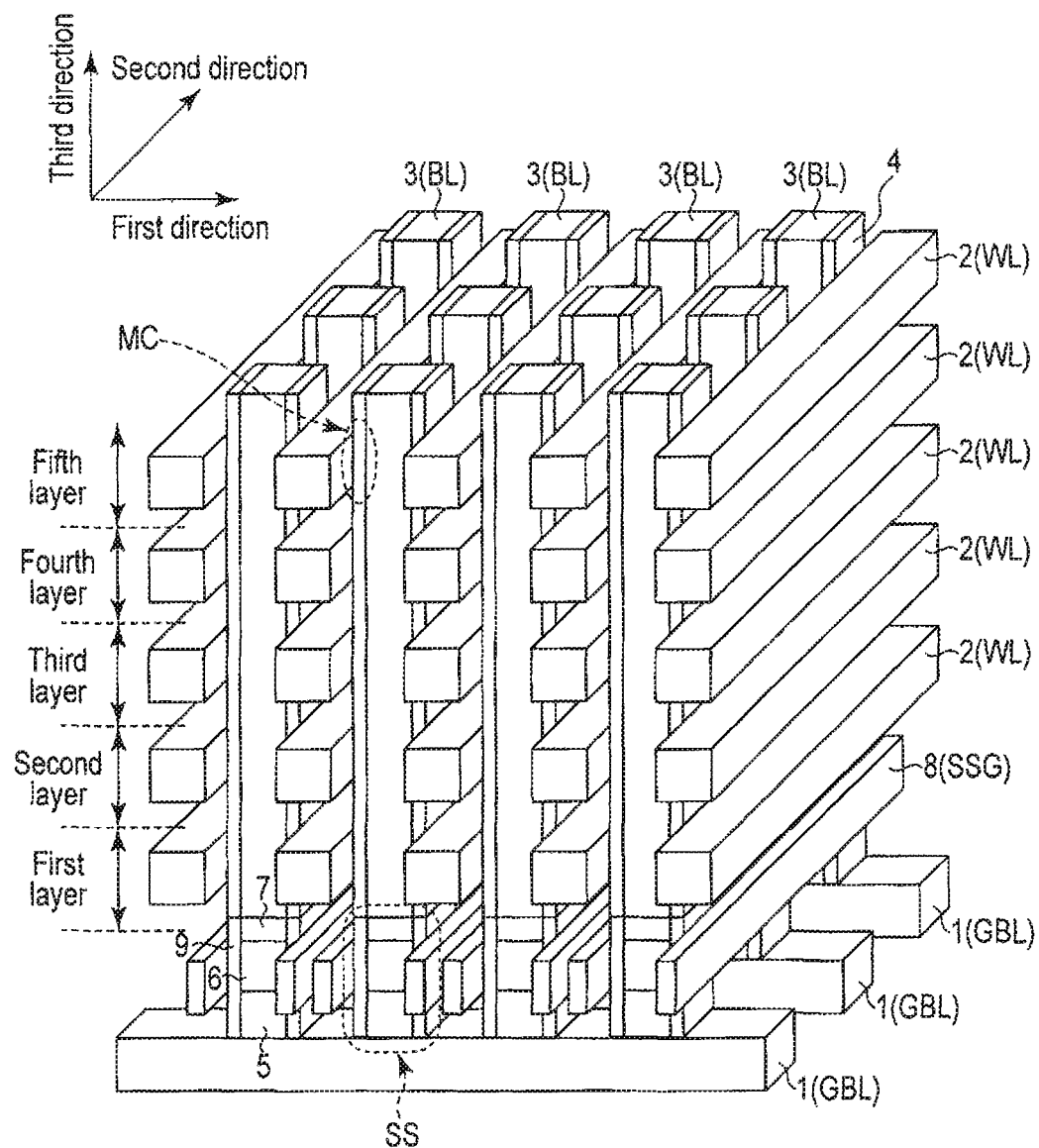
F I G. 73

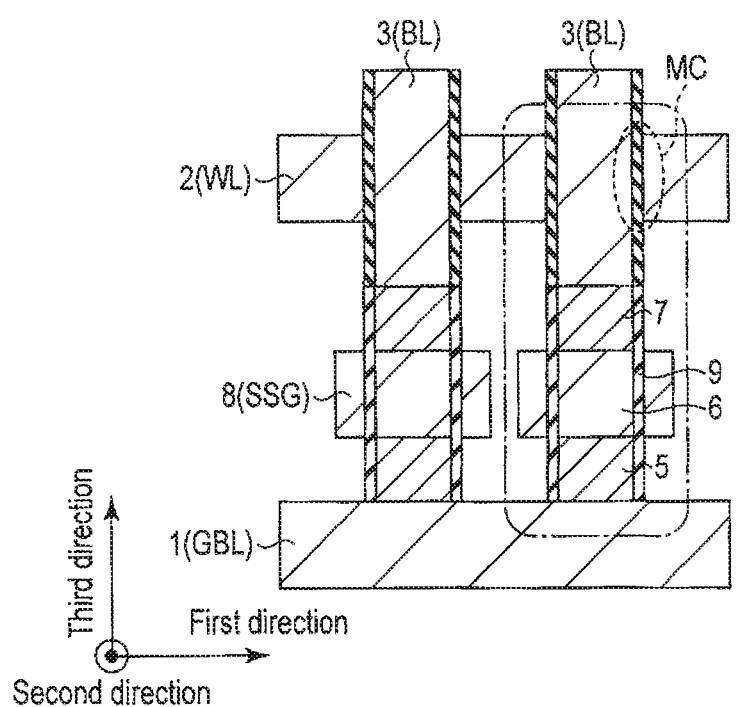
F I G. 74

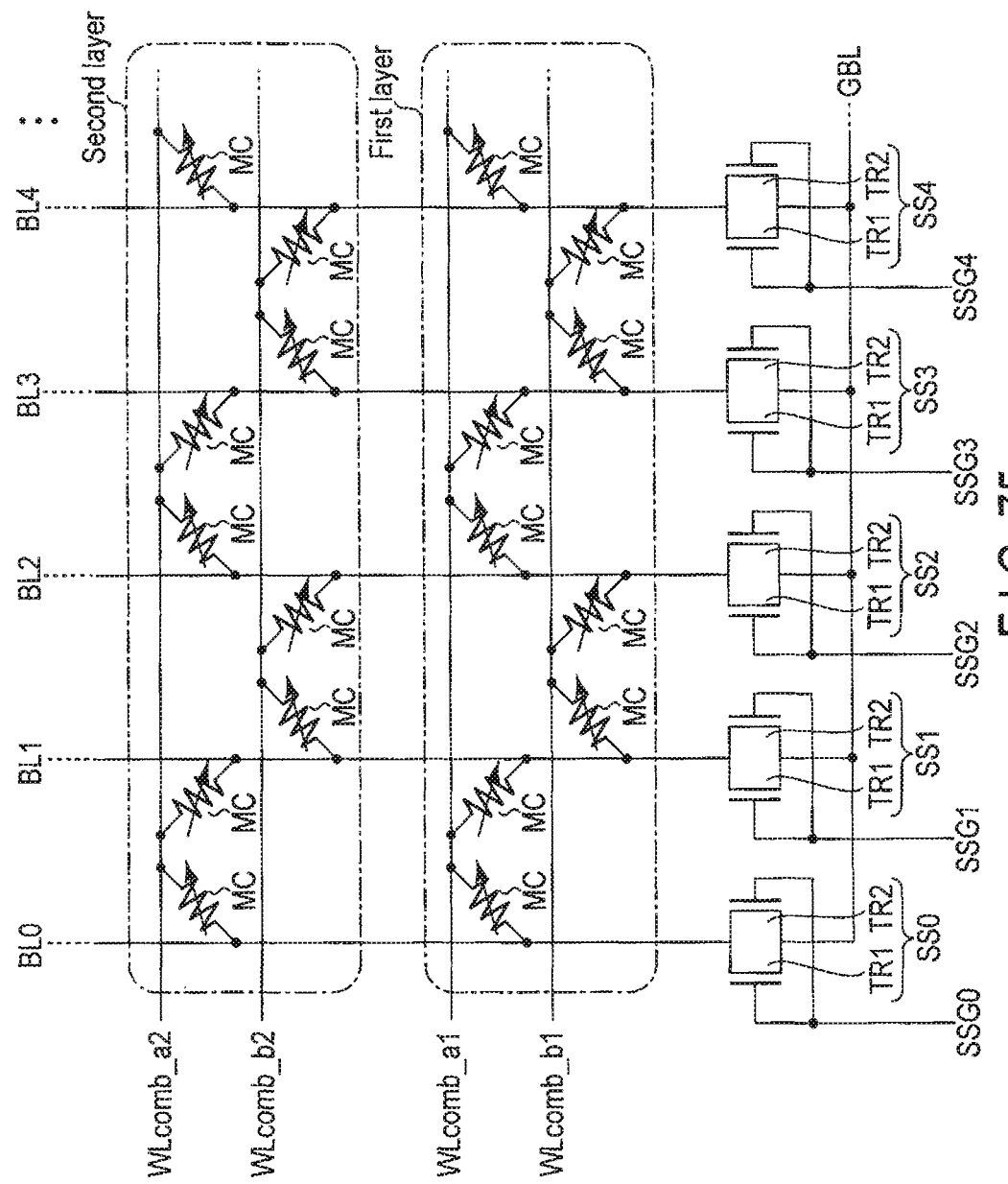
F I G. 75

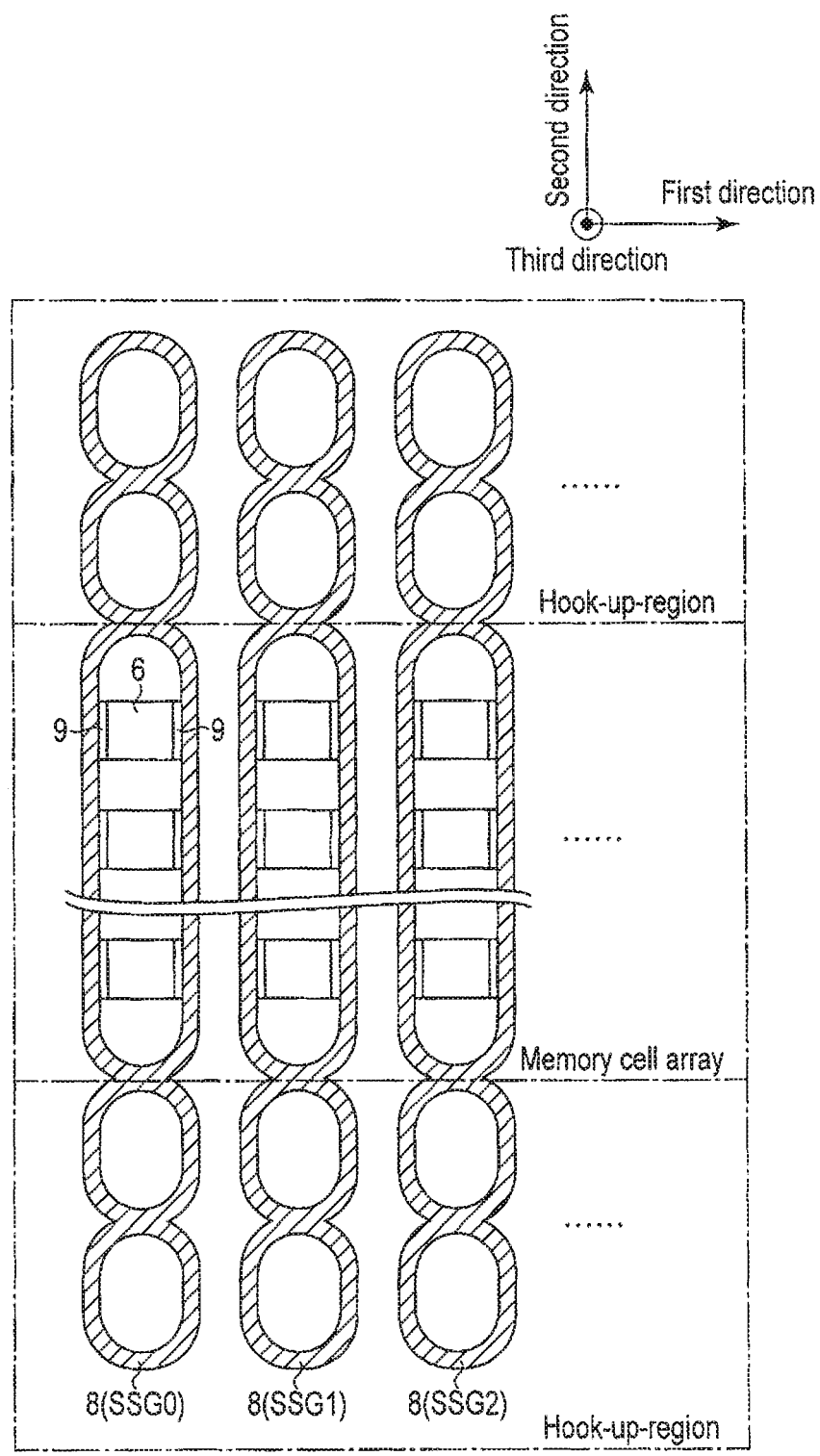
F I G. 76

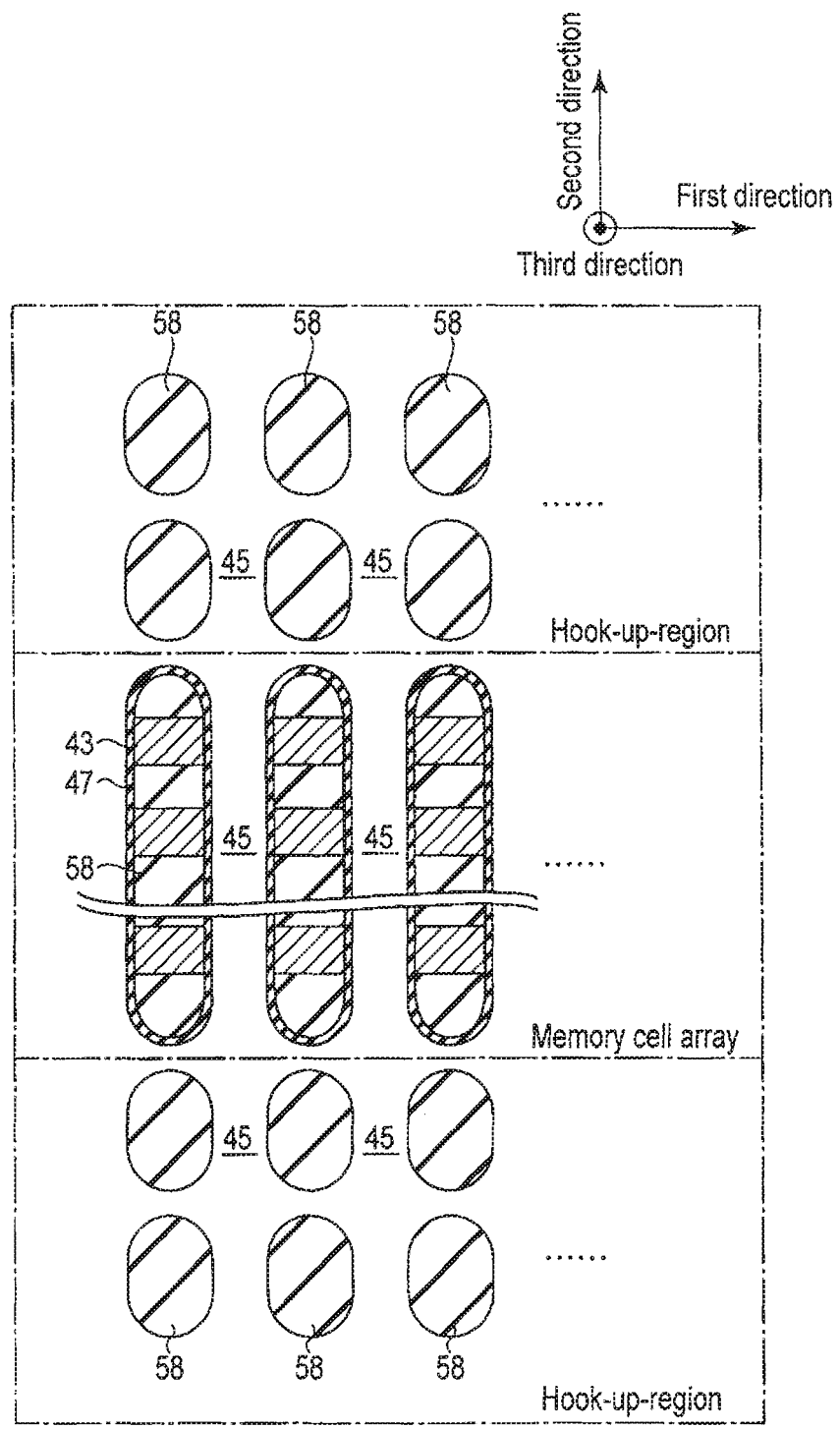
F I G. 78

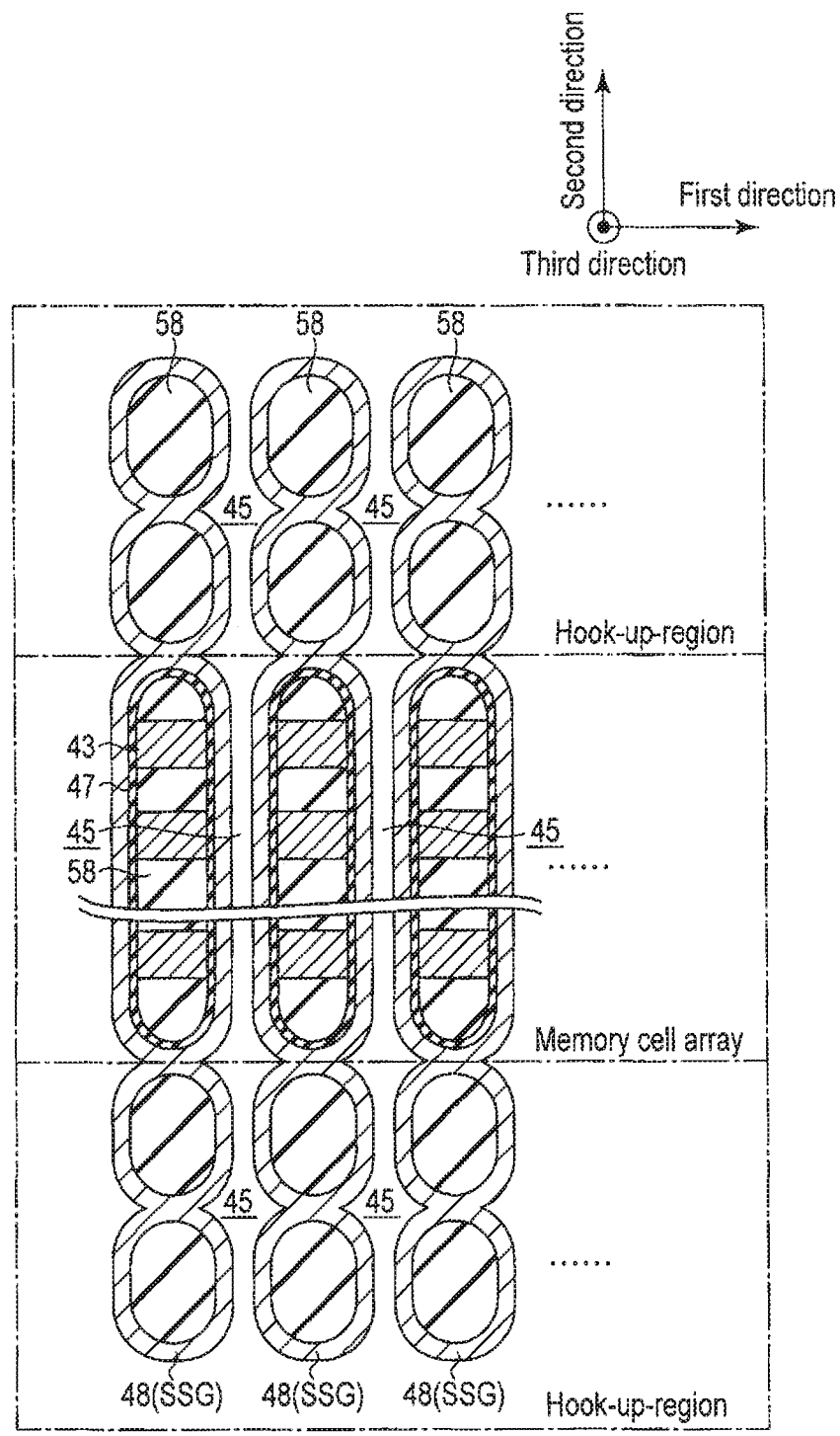
F I G. 79

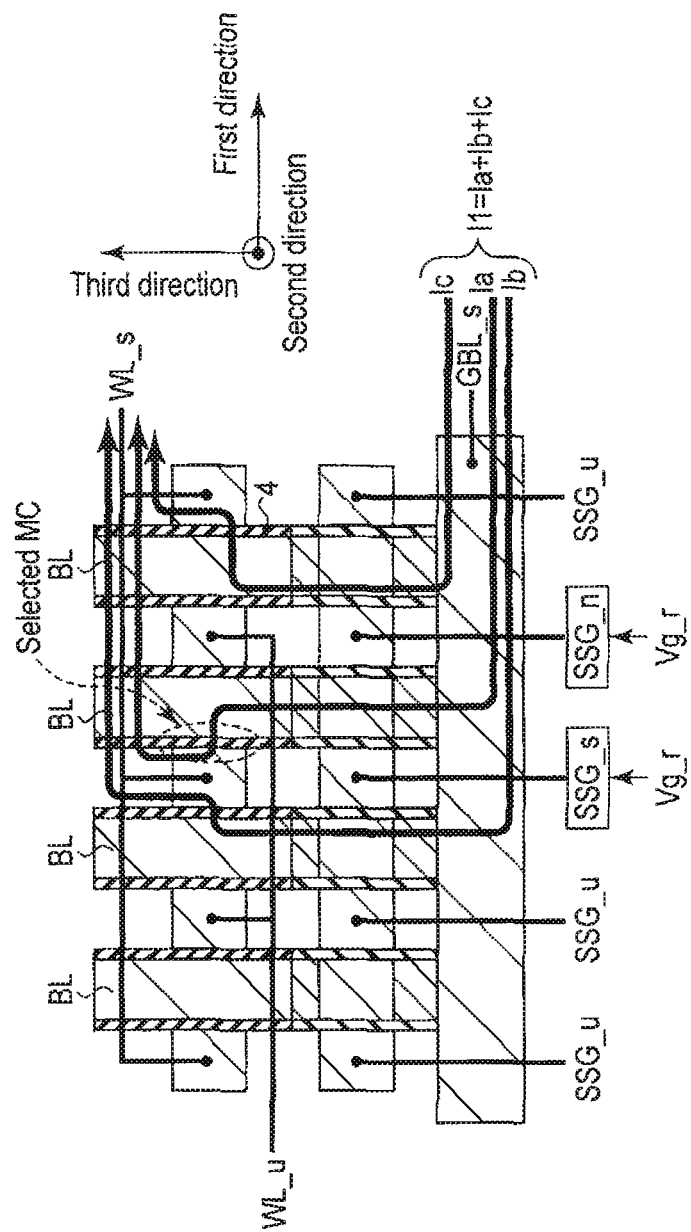
F I G. 82

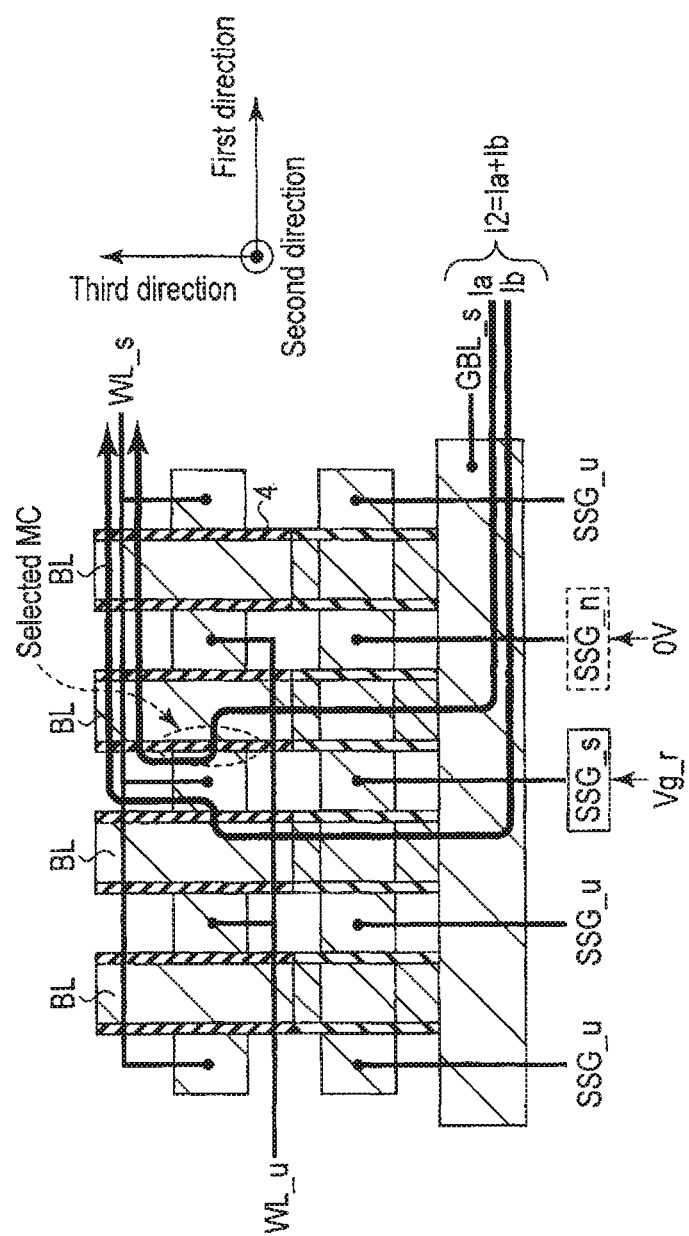
F I G. 83

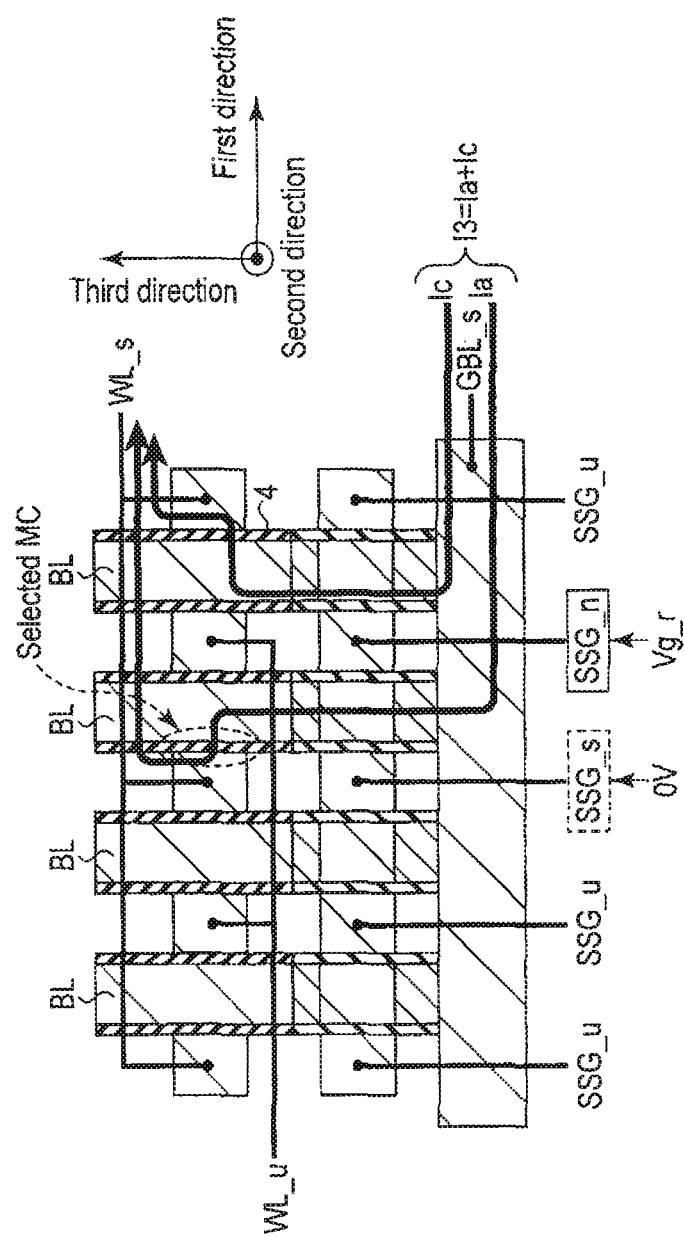
F I G. 84

MEMORY DEVICE

CROSS-REFERENCE TO RELATED APPLICATIONS

This application is a continuation of and claims the benefit of priority under 35 U.S.C. § 120 from prior U.S. patent application Ser. No. 16/172,088, filed Oct. 26, 2018, which is a continuation of and claims the benefit of priority under 35 U.S.C. § 120 from prior U.S. patent application Ser. No. 15/650,526, filed Jul. 14, 2017, which is a continuation application and claims the benefit of priority under 35 U.S.C. § 120 from prior U.S. patent application Ser. No. 15/152,342, filed May 11, 2016, which is a continuation of and claims the benefit of priority under 35 U.S.C. § 120 from prior U.S. patent application Ser. No. 14/472,094, filed Aug. 28, 2014, which is a continuation of and claims the benefit of priority under 35 U.S.C. § 120 from prior U.S. application Ser. No. 13/313,186, filed on Dec. 7, 2011. The entire contents of each of which are incorporated herein by reference.

FIELD

Embodiments described herein relate generally to a memory device.

BACKGROUND

In recent years, there has been suggested a memory called a resistive RAM (ReRAM), in which each of memory cells is formed with a non-ohmic element typified by a diode and a variable resistance material. The memory cells of the ReRAM do not use any MOSFET. Therefore, the memory cells are expected in that they enable the achievement of a high integration beyond a conventional trend.

BRIEF DESCRIPTION OF THE DRAWINGS

FIG. 11 to FIG. 23 are perspective views successively showing fabricating steps of a memory device according to a second embodiment;

FIG. 24 to FIG. 30 are perspective views successively showing the fabricating steps of the memory device according to the second embodiment;

FIG. 31 and FIG. 32 are plan views of a memory cell array according to a third embodiment;

FIG. 34 and FIG. 35 are schematic diagrams showing data conversion examples according to the third embodiment;

FIG. 36 is a plan view of the memory cell array according to the third embodiment;

FIG. 37 to FIG. 39 are sectional views of the memory cell array according to the third embodiment;

FIG. 44 and FIG. 45 are plan views of the memory cell array according to the fourth embodiment;

FIG. 53 to FIG. 55 are schematic diagrams showing a data assigning method according to the fifth embodiment;

FIG. 57 is a sectional view of a memory cell array according to the sixth embodiment;

FIG. 61 and FIG. 62 are a perspective view and a sectional view of a memory cell array according to a seventh embodiment;

FIG. 63 is a schematic diagram of a selection element according to the seventh embodiment;

FIG. 64 and FIG. 65 are a circuit diagram and a sectional view of the memory cell array according to the seventh embodiment;

FIG. 68 and FIG. 69 are a perspective view and a sectional view of a memory cell array according to an eighth embodiment;

FIG. 70 and FIG. 71 are a circuit diagram and a sectional view of the memory cell array according to the eighth embodiment;

FIG. 73 and FIG. 74 are a perspective view and a sectional view of a memory cell array according to a ninth embodiment;

FIGS. 75 and 76 are a circuit diagram and a plan view of the memory cell array according to the ninth embodiment;

FIG. 77 to FIG. 79 are plan views successively showing fabricating steps of a selection element according to the ninth embodiment;

FIG. 82 to FIG. 84 are sectional views of a memory cell array according to the tenth embodiment.

DETAILED DESCRIPTION

In general, according to one embodiment, a memory device includes: a plurality of first interconnects; a plurality of second interconnects; a plurality of third interconnects; a plurality of memory cells; and a plurality of selectors. The respective first interconnects are provided along a first direction. The respective second interconnects are provided along a second direction different from the first direction. The respective third interconnects are provided along a third direction different from the first and second directions. The memory cells includes variable resistance layers formed on two side surfaces, facing each other in the first direction, of the third interconnects and coupled with the mutually different second interconnects. The selectors couple the third interconnects with the first interconnects. One of the selectors includes a semiconductor layer provided between associated one of the third interconnects and associated one of the first interconnects, and gates formed on two side surfaces of the semiconductor layer facing each other in the first direction with gate insulating films interposed therebetween.

First Embodiment

Hereinafter, a memory device according to a first embodiment will be described with respect to an ReRAM as an example.

1. Re: Structure of Memory Cell Array

Figure 1:
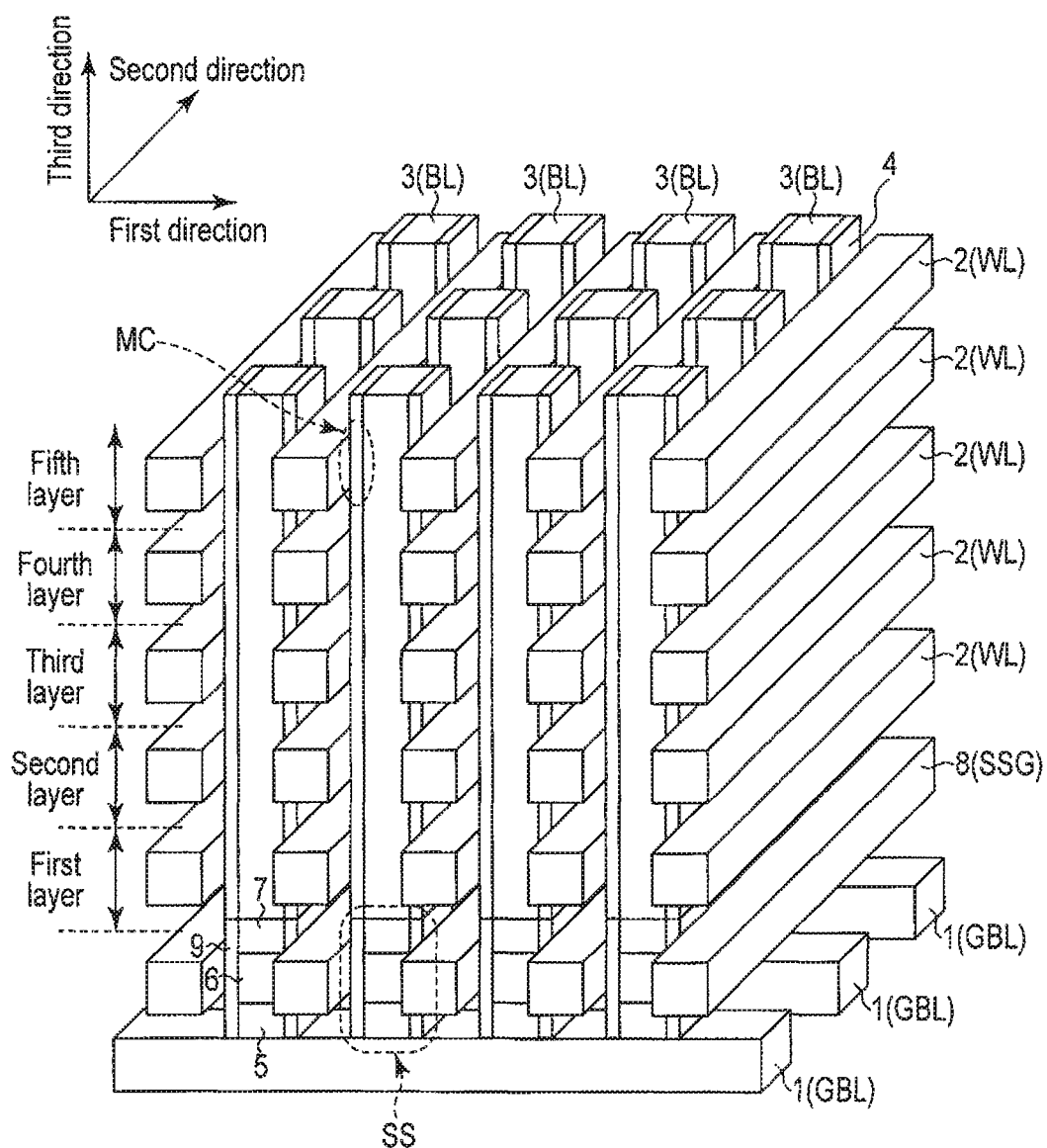
FIG. 1 and FIG. 2 are a perspective view and a sectional view of a memory cell array according to a first embodiment.

FIG. 1 is a perspective view showing a structure of a memory cell array of a semiconductor memory device according to the present embodiment.

As shown, global column lines 1, row lines 2 and column lines 3 are provided in the memory cell array. The global column lines 1 are formed in parallel with one another along a first direction, and are arranged in a lowermost layer of the memory cell array. The row lines 2 are formed in parallel with one another along a second direction orthogonal to the first direction, and are provided at positions higher than the global column lines 1. Moreover, layers of the row lines 2 (a first layer, a second layer, a third layer, and the like of FIG. 1) are provided in a third direction (a normal direction of a plane where the global column lines 1 are arranged) which is orthogonal, to both of the first direction and the second direction. The column lines 3, each of which is formed between the adjacent row lines 2, are formed in parallel with one another along the third direction. Furthermore, an end (a lower end of each of the column lines 3 is electrically connected to one of the global column lines 1. More specifically, in a two-dimensional plane formed in the first and second directions, the column lines 3 arranged in the same column along the first direction are electrically connected to the same global column line 1.

A memory cell MC including a variable resistance element is formed between each of the row lines 2 and each of the column lines 3. In the present example, a variable resistance material 4 is disposed on the whole side surface of the column line 3 (the surface thereof facing the row line 2), and this material functions as the memory cell MC. It is to be noted that the variable resistance material 4 in the present example is provided on two side surfaces (the two side surfaces which face the row lines 2) of the bit line 3 which face each other in the first direction, and are not provided on two side surfaces (the two side surfaces which do not face the row lines 2) which face each other in the second direction in two sets of the facing side surfaces of the bit line 3.

A selection element (sheet selector) SS is provided between the global column line 1 and the corresponding column line. The selection element SS includes a source region 5 formed on the global column line 1, a silicon layer (a channel region) 6 formed on the source region 5, and a drain region 7 formed on the silicon layer 6. Furthermore, a selection gate line 8 along the second direction is formed between the adjacent silicon layers 6. The selection gate line 8 is disposed in parallel with the row lines 2. Furthermore, a gate insulating film 9 is formed between the selection gate line 8 and the silicon layer 6.

It is to be noted that hereinafter, the global column lines 1, the row lines 2 and the column lines 3 are referred to as the global bit lines GBL, the word lines WL, and the bit lines BL, respectively, in the same manner as in a usual MOS type memory device.

Figure 2:
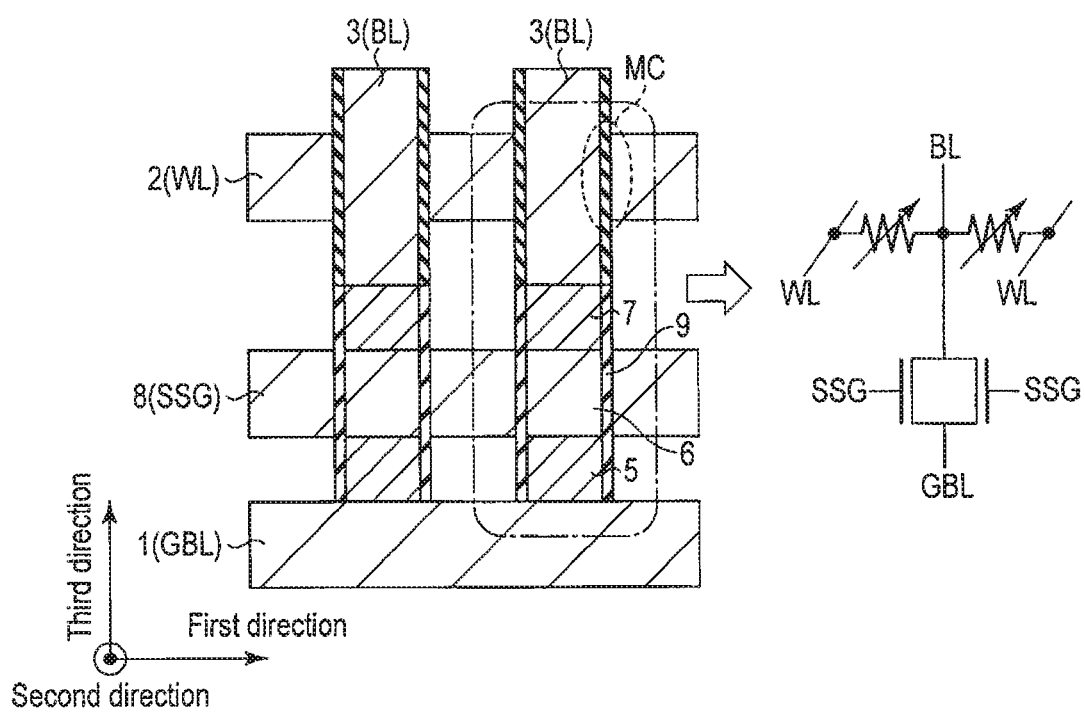

FIG. 2 shows a sectional view of the memory cell array and an equivalent circuit of a partial region of the array, and shows a structure of the partial region in a plane formed in the first direction and the third direction of FIG. 1. As shown, the source region 5, the channel region 6 and the drain region 7 for the selection element SS are successively stacked on one of the global bit lines GBL. Moreover, the gate insulating film 9 is formed on each side surface of this stacked structure. Moreover, the selection gate line 8 (SSG) is provided between the channel regions 6 disposed adjacent in the first direction. The source region 5, the channel region 6, the drain region 7, the gate insulating film 9 and the selection gate line 8 (SSG) form an MOS transistor which functions as the selection element SS. That is, the selection element SS includes two gates connected to different selection gate lines SSG, respectively, for one set of the source region 5, the channel region 6 and the drain region. In other words, it can be considered that one bit line BL is provided with two MOS transistors, and these transistors share the source region 5, the channel region 6 and the drain region 7, but the gates are connected to the different selection gate lines SSG. Moreover, the selection elements SS which are associated with the different bit lines BL and disposed adjacent in the first direction share the gate (the selection gate line SSG).

The pillar-shaped bit lines BL are formed on the drain region 7 of each of the selection elements SS. Moreover, the variable resistance material A which functions as the memory cell MC is disposed on the side surfaces of the bit lines BL. Furthermore, the word lines WL are formed in a region between the bit lines BL adjacent in the first direction. The variable resistance material 4 is formed by using, for example, HfO as the material so that the material contacts with the bit lines BL and the word lines WL. The variable resistance material 4 typified fay this HfO is a material which transits between at least two resistance values of a low resistance state (LRS) and a high resistance state (HRS). Moreover, it is known that the variable resistance material of the high resistance state transits to the low resistance state when a predetermined or larger voltage is applied and that the variable resistance material of the low resistance state transits to the high resistance state when a predetermined or larger current flows. In particular, an element which performs the transition from the high resistance state to the low resistance state and the transition from the low resistance state to the high resistance state when the voltage is applied with different polarities is called a bipolar operation element. The variable resistance material 4 which performs such an operation can be formed by using a thin film including at least one of materials such as $TiO_2$, $ZnMn_2O_4$, NiO, $SrZrO_3$, $Pr_{0.7}Ca_{0.3}MnO_3$ and carbon in addition to HfO.

As described above, the memory cells MC each including the variable resistance material 4 provided between the word line 1 and the bit line 2 are arranged with, for example, a three-dimensional matrix arrangement in the memory cell array. In the present structure, the word lines WL and the bit lines BL simply form a line and space pattern. Moreover, it is required that the word lines WL and the bit lines BL is in an orthogonally positional relation, but any fluctuation in the word line direction and the bit line direction does not have to be taken into consideration. Therefore, about a positioning accuracy in the memory cells during fabrication, it is not necessary to be remarkably nervous, and the fabrication can easily be performed. Moreover, this structure is a highly integrated structure where one bit of information can be stored in a region of $2F^2$.

Figure 3:
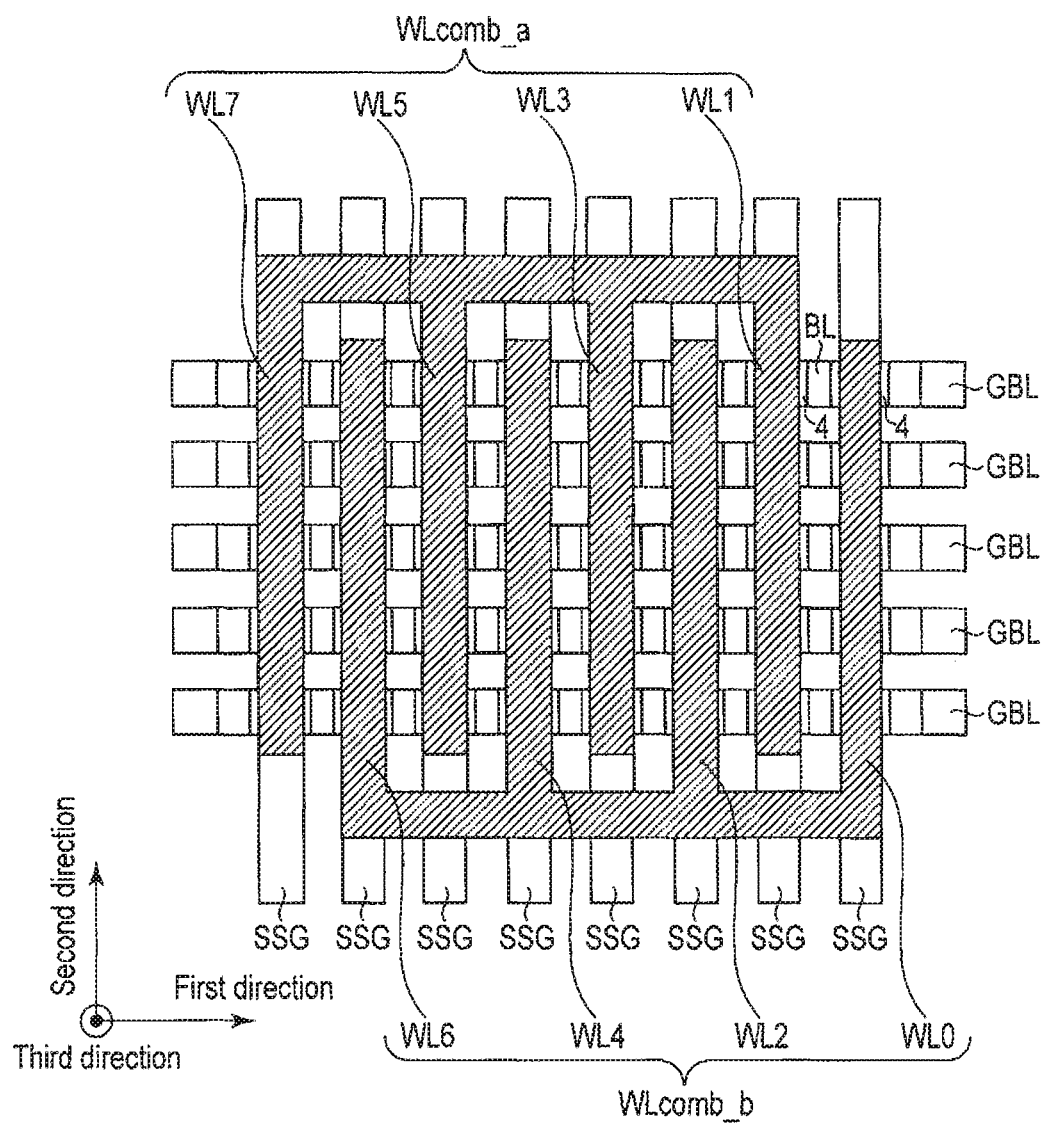
FIG. 3 is a plan view of the memory cell array according to the first embodiment.

FIG. 3 is a plan view of the memory cell array showing a structure of a partial region in the plane formed in the first direction and the second direction of FIG. 1, and is especially a view for explaining a planar pattern of the word lines WL. That is, FIG. 3 shows the pattern of the word lines WL in one of the layers of FIG. 1. In FIG. 3, a shaded region shows the word lines WL.

As shown, the word lines WL are alternately connected in common. In other words, the memory cell array includes two sets of word lines WL each having a comb-like structure, and a linear region along the second direction of the word lines WL alternately belong to one of the comb-like structures. Furthermore, the present structure can be considered as follows. That is, when the word lines WL are labeled as WL0, WL1, WL2, ... WL7 in order from the right side of the drawing sheet of FIG. 3, the same voltage is electrically applied to the odd word lines WL1, WL3, ... WL7 (or these word lines are connected in common). On the other hand, the same voltage is electrically applied even to the even word lines WL0, WL2, ... WL6 (or these word lines are connected in common). Moreover, a different voltage can be applied between the odd word line and the even word line (or the odd word lines and the even word lines are separated). Hereinafter, the set of the odd word lines is called the word line group WLcomb_a, and the set of the even word lines is called the word line group WLcomb_b. Moreover, when both the groups are not distinguished, each group is simply called the word line group WLcomb.

It is to be noted that FIG. 3 shows a case where eight word lines, five global bit lines GBL and 45 bit lines BL are included, but this is merely an illustration, and these numbers of the lines can appropriately be selected.

2. Re: The Overall Structure of Semiconductor Memory Device

Figure 4:
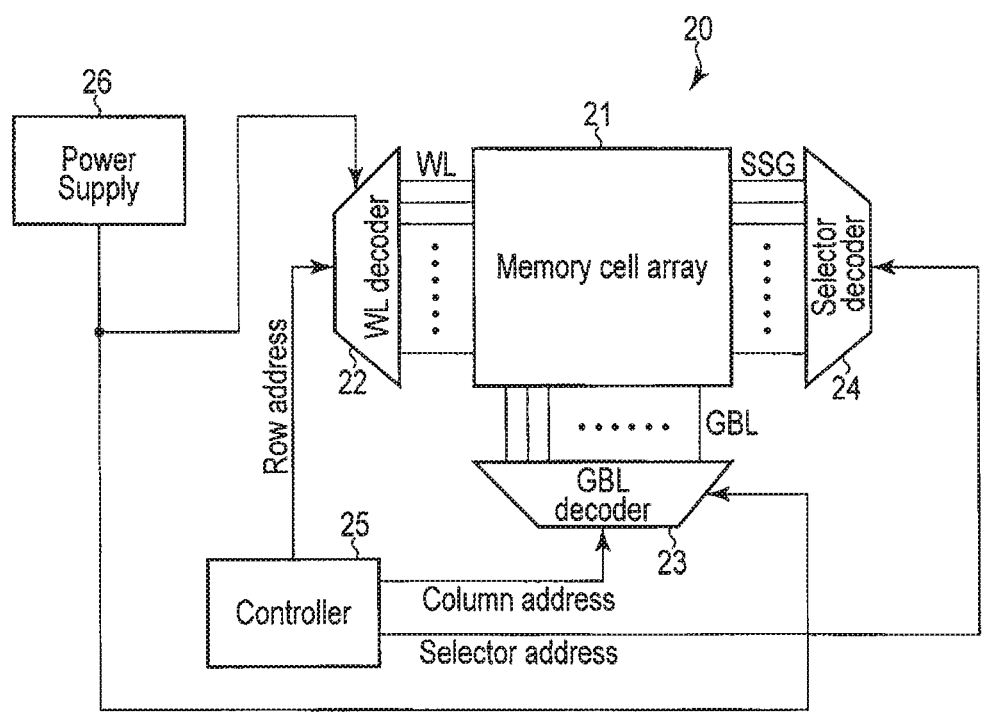
FIG. 4 is a block diagram of a memory device according to the first embodiment.

Next, the overall structure of a semiconductor memory device according to the present embodiment will be described with reference to FIG. 4. FIG. 4 is a block diagram of the semiconductor memory device according to the present embodiment.

As shown, a semiconductor memory device 20 includes a memory cell array 21, a WL decoder 22, a GBL decoder 23, a selector decoder 24, a controller 25 and a power supply 26.

Figure 5:
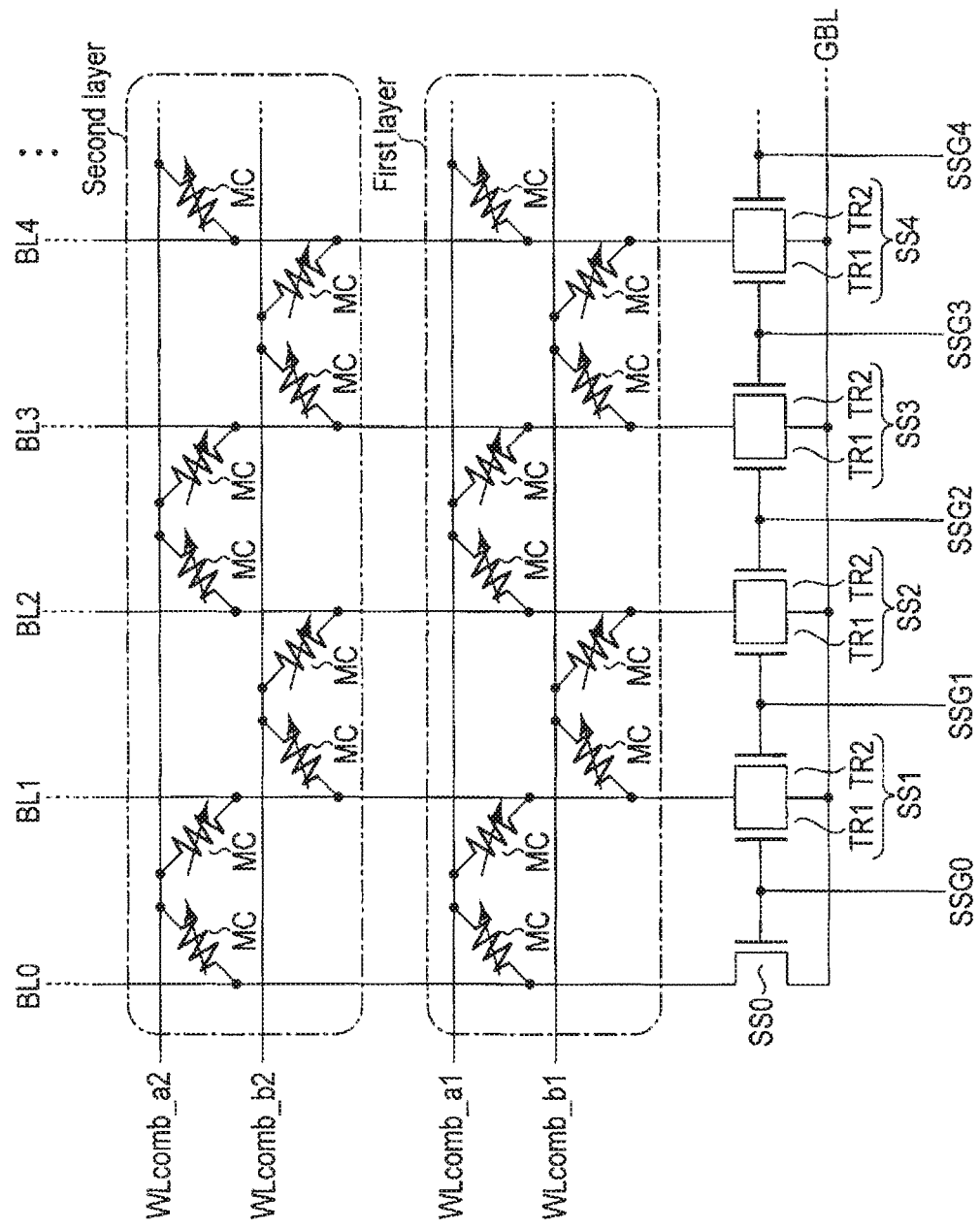
FIG. 5 is a circuit diagram of the memory cell array according to the first embodiment.

The memory cell array 21 his the structure described with reference to FIG. 1 and FIG. 2. FIG. 5 is an equivalent circuit diagram of the memory cell array 21. As shown, the memory cells MC including variable resistance elements (the variable resistance material 4 of FIGS. 1 and 2) are arranged in a matrix in the memory cell array 21. In the memory cell MC, an end of the variable resistance element is connected to one of the bit lines BL (BL0, BL1, ... ), and the other end thereof is connected to one of the word line groups WLcomb (WLcomb_a, WLcomb_b). It is to be noted that in FIG. 5, the word line groups WLcomb_a and WLcomb_b are denoted with WLcomb_ai and WLcomb_bi, respectively, but this i indicates a number of a layer where the word line group is formed (indicates the ordinal number of the layer, indicates the first layer by i=1, and indicates the second layer by i=2, and the same applies to the subsequent layers). Moreover, each of the bit lines BL is connected to the corresponding global bit line GBL via the corresponding selection element SS (SS0, SS1, SS2, ... ). Furthermore, the gates of the adjacent selection elements SS are connected to a common selection gate line SSGj (j is a natural number). The selection element SS can be regarded as a set of two MOS transistors TR1 and TR2 sharing a source and a drain and connected in parallel. Moreover, the transistor TR1 of one selection element SS shares the gate with the transistor TR2 of the adjacent selection element SS, and the transistor TR2 shares the gate with the transistor TR1 of the other adjacent selection element SS. However, the selection element SS positioned at an endmost portion is constituted only of the transistor TR1 or TR2.

The three-dimensional stacked type memory cell array of FIG. 1 has the structure of FIG. 5. That is, FIG. 5 corresponds to FIG. 1 showing a memory cell array included in the two-dimensional plane formed in the first direction and the third direction. These memory cell arrays are arranged along the second direction. At this time, the word lines WLcomb_ai, the word lines WLcomb_bi and the selection gate lines SSGj are connected in common among the memory cell arrays shown in FIG. 5. Conversely, the bit lines BL and the global bit lines GBL are separated among the memory cell arrays.

Returning to FIG. 4, the description will be continued. The WL decoder 22 includes a word line selection unit and a word line driver. Moreover, the word line selection unit selects the word line WL on the basis of a WL address received from the controller 25. Moreover, the word line driver applies, to the selected word line and unselected word line, a voltage required to read, write and erase data.

The GBL decoder 23 includes a global bit line selection unit and a global bit line driver. Moreover, the global bit line selection unit selects the global bit line GBL on the basis of a column address received from the controller 25. Moreover, the global bit line driver applies, to the selected global bit line and unselected global bit line, the voltage required to read, write and erase the data.

The selector decoder 24 includes a selector selection unit and a selection gate line driver. Moreover, the selector selection unit selects the selection gate line SSG on the basis of a sheet address received from the controller 25. Furthermore, the selection gate line driver applies, to the selected selection gate line and unselected selection gate line, the voltage required to read, write and erase the data.

It is to be noted that "the sheet" indicates a set of the memory cells selected by one of the selection gate lines. That is, the set of the memory cells which are present in the plane formed in the second direction and the third direction in FIG. 1 is the sheet.

The controller 25 controls the operation of the whole semiconductor memory device 20. Moreover, the controller transmits the above-mentioned required address to the WL decoder 22, the GBL decoder 23 and the selector decoder 24. Furthermore, when the data is written, the controller 25 instructs the WL decoder 22, the GBL decoder 23 and the selector decoder 24 to apply the required voltage in order to change the resistance state of the variable resistance element of the selected memory cell MC. Moreover, when the data is read, the controller instructs the WL decoder 22, the GBL decoder 23, and the selector decoder 24 to apply the required voltage in order to detect the resistance value of the variable resistance element of the selected memory cell MC as a memory state of the memory cell MC. Furthermore, the controller 25 includes a not-shown sense amplifier, and senses and amplifies the data read through the global bit line GBL by a sense amplifier.

The power supply 26 generates a predetermined voltage set required to read, write and erase the data. The voltage generated by the power supply 26 is given to the word line WL and the bit line BL. For example, when the data is written, a large potential difference is applied between the selected word line and the selected bit line, so that the resistance state of the variable resistance element transits. Moreover, when the data is read, a potential difference is applied between the selected word line and the selected bit line in such a range that any transition of the resistance state does not occur, so that a current flowing through the bit lines or the word lines is detected.

Figures 6, 7:
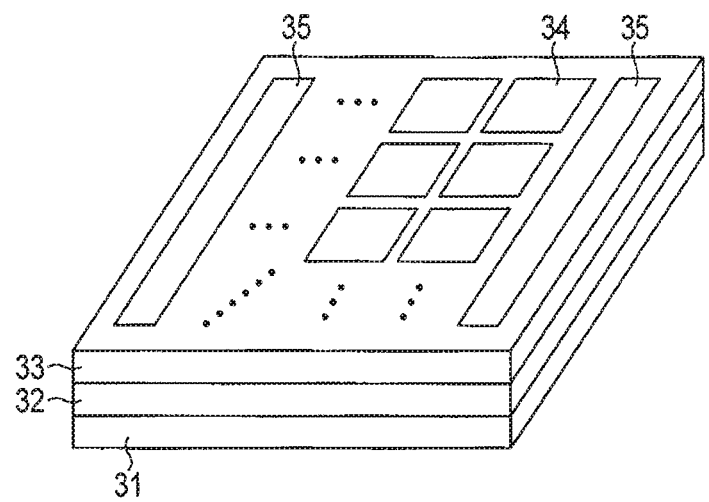
FIG. 6 is an appearance view of the memory device according to the first embodiment.
FIG. 7 is a diagram showing biases during an operation of the memory device according to the first embodiment.

FIG. 6 is an appearance view of the semiconductor memory device according to the present embodiment. As shown, a CMOS circuit 32 including an interconnect layer by a usually used process is formed on a silicon substrate 31. Further on the CMOS circuit 32, a layer 33 including memory cell portions 34 is formed. Each of the memory cell portions 34 of FIG. 6 corresponds to the memory cell array of FIG. 1, and interconnects are formed by, for example, a 24 nm design rule. Moreover, a portion called a peripheral circuit in a usual memory and including the decoders 22 to 24 and the controller 25 of FIG. 4 is included in the CMOS circuit 32 of FIG. 6.

It is to be noted that the CMOS circuit 32 excluding portions for connecting to the memory cell portions 34 can be designed and prepared by, for example, a design rule of 90 nm which is more relaxing than the memory cell portions 34. Moreover, the layer 33 includes portions for electrically connecting to the CMOS circuit 52 around each of the memory cell portions 34, and unit blocks including the memory cell portions 34 and the peripheral connecting portions are arranged in the matrix. Furthermore, in the layer 33, through holes are formed, and in ends of the layer 33, there are formed input/output portions 35 of the present device including terminals electrically coupled with input/output portions of the CMOS circuit 32 via these through holes.

According to such a structure, a function corresponding to a protection film of the CMOS circuit 32 can be performed by insulators formed in the memory cell portions 34. On the other hand, the memory cell portions 34 and the CMOS circuit 32 are coupled each other in a vertical direction to a substrate surface, which enables the shortening of an operation time or the noticeable increase of the number of simultaneously readable/writable cells without involving the increase of chip areas. It is to be noted that the input/output portions 35 of the device are bonded to a lead frame in a packaging step in the same manner as in a usual semiconductor device.

3. Re: Operation

Figure 8:
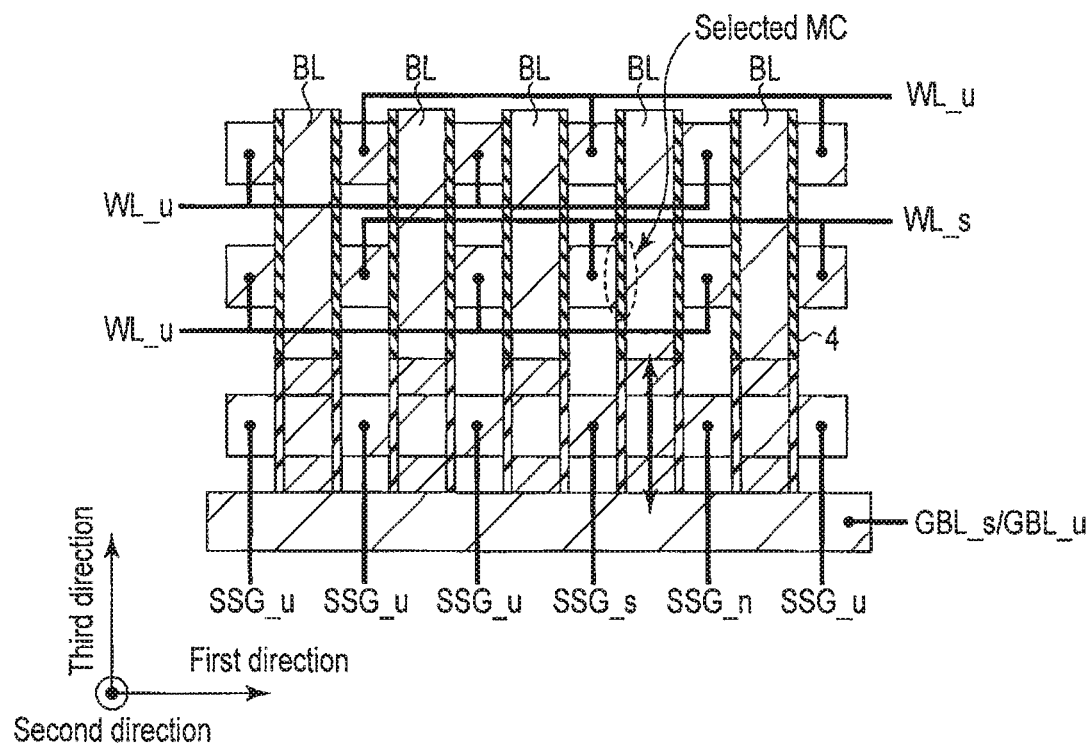
FIG. 8 is a sectional view of the memory cell array according to the first embodiment.

Next, an operation of the semiconductor memory device according to the present embodiment will be described. FIG. 1 shows a bias state of each signal line during the operation of the semiconductor memory device according to the present embodiment. Moreover, FIG. 8 is a sectional view of the memory cell array, and shows the plane formed in the first direction and the third direction in FIG. 1.

In the following description, the selected global bit lines GBL is labeled as GBL_s, and the unselected global line is labeled as GBL_u. Moreover, the selected word lines WL is labeled as WL_s, and the unselected word line is labeled as WL_u. Further among the selection gate lines SSG, two selection elements SS corresponding to the bit line BL connected to the selected memory cell MC are selected, and labeled as SSG_s and SSG_n. The other selection gate lines SSG are unselected, and labeled as SSG_u.

3.1 Writing Operation

First, a writing operation of storing information in the memory cells will be described.

During the writing operation, the GBL decoder 23 applies a writing voltage Vw (>0 V) to the selected global bit line GBL_s, and applies a half (Vw/2) of the writing voltage to the unselected global bit line GBL_u.

Moreover, the WL decoder 22 applies 0 V to the selected word line WL_s, and applies (Vw/2) to the unselected word line WL_u.

Furthermore, the selector decoder 24 applies a writing gate voltage Vg_w (>0 V) to both of two selection gate lines SSG_s and SSG_n, and applies 0 V to the other selection gate lines SSG_u.

Consequently, in the selection element SS connected to the selected bit line BL, a channel is formed by the two selection gate lines SSG_s and SSG_n, and the line GBL_s transfers a writing voltage Vw to the selected memory cell MC. On the other hand, 0 V is transferred from WL_s to the selected memory cell MC. In consequence, when a potential difference Vw is applied across the variable resistance element of the memory cell MC, the data is written in the memory cell MC.

3.2 Erasing Operation

Next, an erasing operation of information held in the memory cells will continuously be described with reference to FIG. 7 and FIG. 3.

During the erasing operation, considering that the element performs a bipolar operation, the WL decoder 22 applies a voltage (Ve1), obtained by adding an offset voltage of 1 V to an erasing voltage Ve, to the selected word line WL_s, and applies ((Ve/2)+1) to the unselected word line WL_u.

Moreover, the GBL decoder 23 applies the offset voltage of 1 V to the selected global bit line GBL_s, and applies ((Ve/2)+1) to the unselected global bit line GBL_u.

Furthermore, the selector decoder 24 applies an erasing gate voltage Vg_e to both of the selection gate lines SSG_s and SSG_n, and applies 0 V to the other selection gate lines SSG_u.

In consequence, the voltage Ve is transferred to the selected memory cell MC in the same manner as in the writing. Moreover, when a potential difference Ve is applied across the variable resistance element, the data is erased.

3.3 Reading Operation

Next, an operation of reading the information from the memory cells will continuously be described with reference to FIG. 7 and FIG. 8.

During the reading operation, the GBL decoder 23 applies a voltage (Vr+Vo), obtained by adding an offset voltage Vo to a reading voltage Vr, to the selected global bit line GBL_s and the unselected global bit GBL_u.

Moreover, the WL decoder 22 applies the offset voltage Vo to the selected word line WL_s, and applies (Vr+Vo) to the unselected word line WL_u.

Furthermore, the selector decoder 24 applies a reading gate voltage Vg_r to both of the selection gate lines SSG_s and SSG_n, and applies 0 V to the other selection gate lines SSG_u.

In consequence, the voltage Vr is transferred to the selected memory cell MC in the same manner as in the writing. Moreover, the data read from the selected memory cell MC is transferred to GBL_s via the selection element SS.

4. Effect of the Present Embodiment

According to the structure of the present embodiment, an integration degree of the memory cell array can be enhanced. Hereinafter, the present effect will be described in detail.

In recent years, with the high integration of a semiconductor device, a circuit pattern of an LSI element has increasingly been miniaturized. This miniaturization of the pattern requires not only the reduction of a line width but also the enhancement of a dimensional or positional accuracy of the pattern. This also applies to the memory device. As to the memory device, it has continuously been requested that In memory cells formed by making full use of an accurate processing technology, a predetermined amount of a charge required for storage is held in a smaller region.

Heretofore, various types of memories such as a DRAM, SRAM and a flash memory have been fabricated. All these memories hold the predetermined amount of the charge to store data. Therefore, with the miniaturization of the pattern, there are severe restrictions on fluctuations of the memory cells, and the like. In consequence, a large burden is also imposed on a lithography technology which forms these patterns, which becomes a factor to raise a lithography step cost. Moreover, the lithography step cost occupies a large part of the present mass production cost. Therefore, the burden on the above lithography step becomes the factor for raising a product cost as it is.

On the other hand, in recent years, there has been suggested a memory called an ReRAM in which each memory cell is formed by a non-ohmic element typified by a diode and a variable resistance material, as a technology which conquers such a problem. In this ReRAM, it is not necessary to use an MOSFET in the memory cell, and hence it has been expected that higher integration in excess of a conventional trend can be achieved. Furthermore, the ReRAM has a structure which facilitates three-dimensional stacking. Therefore, it is expected that the integration degree can noticeably be enhanced as compared with a conventional memory in which an only two-dimensional plane is utilized.

Figures 9, 10:
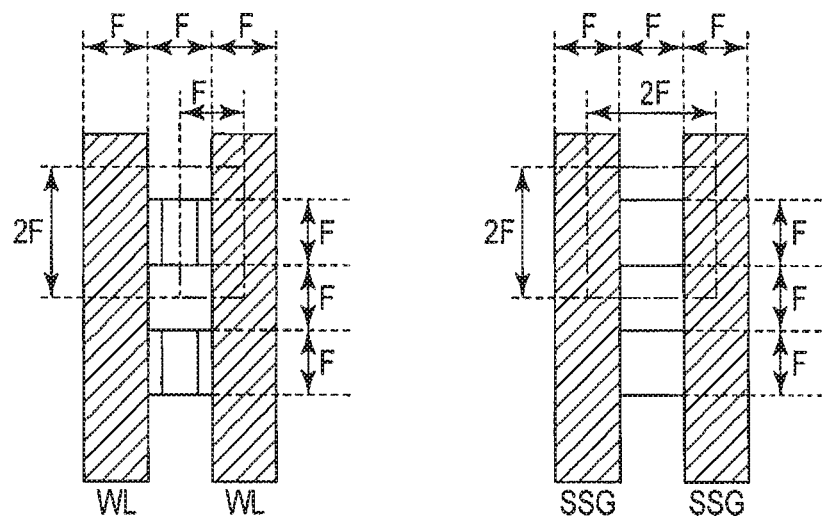
FIG. 9 and FIG. 10 are plan views of the memory cell array according to the first embodiment.

FIG. 9 is a plan view of the memory cell MC according to the present embodiment, and corresponds to a plane formed in the first direction and the second direction of FIG. 1. As shown, when a line width and a space of the word lines and a width of each bit line BL along the second direction are formed with a minimum processing dimension F of a photolithography technology, a size of one memory cell MC is $2F^2$ with a vertical size of 2F and a horizontal size of F in FIG. 9.

However, when a hierarchical bit line structure where bit lines are connected to a global bit line is used, it is actually difficult to form the memory cell with a size of $2F^2$. This is caused by the selection element SS. The selection element SS switches the connection between the bit line BL and the global bit line GBL, and is usually realized by an MOS transistor.

The selection element SS is positioned immediately under the memory cell MC. Therefore, if the memory cell MC is formed with the size of $2F^2$, the size of the selection element SS, accordingly, has to be reduced. However, when a usual planar type MOS transistor realizes the selection element SS, it has been difficult to satisfy this requirement.

In the present embodiment, however, the source region 5, the channel region 6 and the drain region 7 are stacked in the same width as that of the bit line BL, and the gates SSG are provided on side surfaces, to realize the selection element SS. In consequence, a size of the selection element SS per bit line BL becomes $4F^2$. This behavior is shown in FIG. 10.

FIG. 10 is a plan view of the selection element SS according to the present embodiment, and corresponds to the plane formed in the first direction and the second direction of FIG. 1. As shown, the size of the selection element SS becomes $4F^2$. Moreover, a region occupied by this element corresponds to a region where two memory cells MC are arranged.

Consequently, the size of the selection element SS is reduced, therefore the size of the memory cell MC can be decreased, so that the integration degree of the memory cell array can be enhanced.

Moreover, according to the present embodiment, any negative voltage is not used, but operation reliability can be enhanced. This is because the offset voltage is used during the erasing operation as described in the above section 3.2. That is, when the potential of GBL_s is set to a value which is about 1 V higher than SSG_u, it is possible to noticeably save a leak current to the unselected cell, because of characteristics of the selection element SS. In this case, when a reference of a bias is set to a positive voltage of 0 V to 1 V, the use of the negative voltage can be avoided. When the negative voltage is used, a circuit for generating the negative voltage is required, and an area of the circuit is comparatively large. In the present embodiment, however, this negative voltage generation circuit is not used, but the leak current is lowered, so that the operation reliability of the semiconductor memory device can be enhanced. It is to be noted that the offset voltage during the erasing is not limited to 1 V, and can appropriately be selected in accordance with a requested performance or the like.

Furthermore, according to the present embodiment, it is possible to realize the lowering of power consumption and/or the raising of an operation speed. This is because the offset voltage is used during the reading operation as described above in section 3.3. Usually, the data is read from the memory cell immediately after performing the writing or the erasing, and it is confirmed whether or not the memory cell obtains a desired resistance value. In consequence, when the resistance value is different from the desired range, the writing or the erasing is additionally performed. Moreover, the voltage required for the writing or the erasing is larger than the voltage required for the reading.

Thus, according to the present embodiment, the reference of the bias during the reading is set at a positive voltage Vo in place of 0 V. That is, a value of the voltage for use in the reading is brought close to that of the voltage for use in the writing and erasing. Therefore, when the device transitions from the writing and erasing operation to the reading operation, or in the opposite case, a large voltage difference is prevented from being made between bias conditions of both the operations. Moreover, a voltage change of a node with a large parasitic capacity can be lowered. Therefore, the increase of an unnecessary power consumption and the delay of an operation time can be suppressed.

It is to be noted that the parasitic capacity of the global bit line GBL is largest in the present embodiment. Therefore, the voltage to be applied to the global bit line GBL is preferably set so that the values thereof become as equal as possible during the writing or erasing and during the reading.

The number of the unselected global bit lines is larger than that of the selected global bit lines. Therefore, the offset voltage Vo may be preferably set so that (Vw/2) becomes substantially equal to (Vr+Vo) during the writing and ((Ve/2)*1) becomes substantially equal to (Vr+Vo) during the erasing, whereby the potential of the unselected global bit line does not noticeably change.

It is to be noted that only one word line WL is usually selected from the memory cell array, but the global bit lines GBL may simultaneously be selected. In consequence, the number of simultaneously writable/eraseable/readable bits increases, and a band width can be increased.

Second Embodiment

Next, a memory device according to a second embodiment will be described. The present embodiment relates to a fabricating method of an ReRAM described in the above first embodiment.

1. First Fabricating Method

First, a first fabricating method will be described with reference to FIG. 11 to FIG. 23. FIG. 11 to FIG. 23 are perspective views successively showing fabricating steps of a memory cell array of an ReRAM described in the first embodiment.

First, a usual CMOS circuit 32 which controls an operation of the ReRAM is formed on, for example, a silicon substrate 31. Next, an interlayer insulating film is formed on the silicon substrate 31 to cover the CMOS circuit 32. FIG. 11 to FIG. 23 show a structure positioned in layers above this interlayer insulating film.

Figure 11:
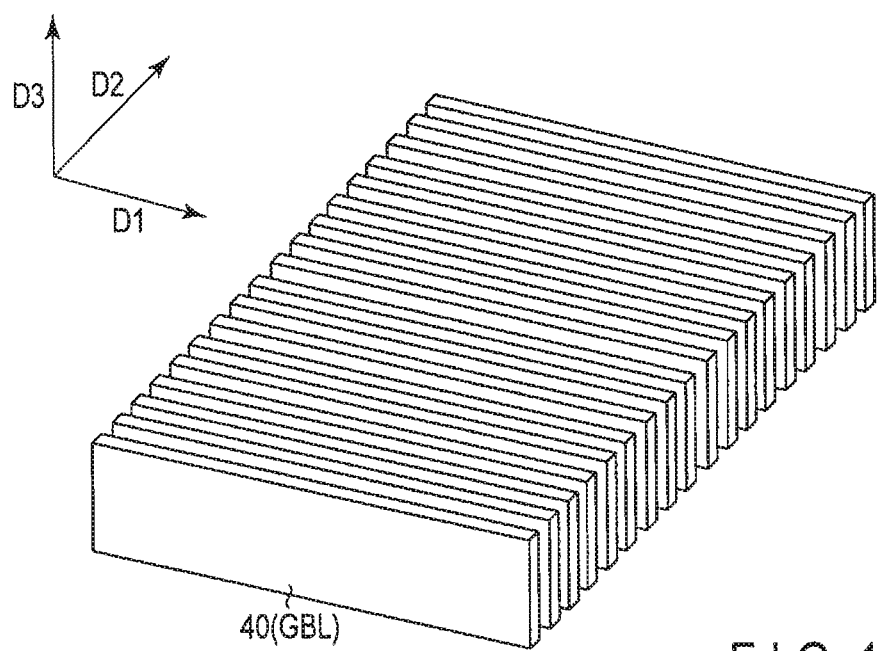

Next, as shown in FIG. 11, a global bit line film 40 is formed on the interlayer insulating film. The global bit line film corresponds to the global bit line GBL described with reference to FIG. 1. As an example, the global bit line film 40 is formed by using tungsten (W) and a TiN film as a barrier metal in a material. Afterward, the global bit line film 40 is patterned by a photolithography technology and an RTF technology, in consequence, the global bit line 40 (GBL) having a stripe shape along a first direction (D1) is formed. It is to be noted that a line width and adjacent space of the global bit line GBL are, for example, about 24 nm, a film thickness thereof is, for example, about 150 nm, and a sheet resistance is, for example, about 1.5 ohms.

Figure 12:
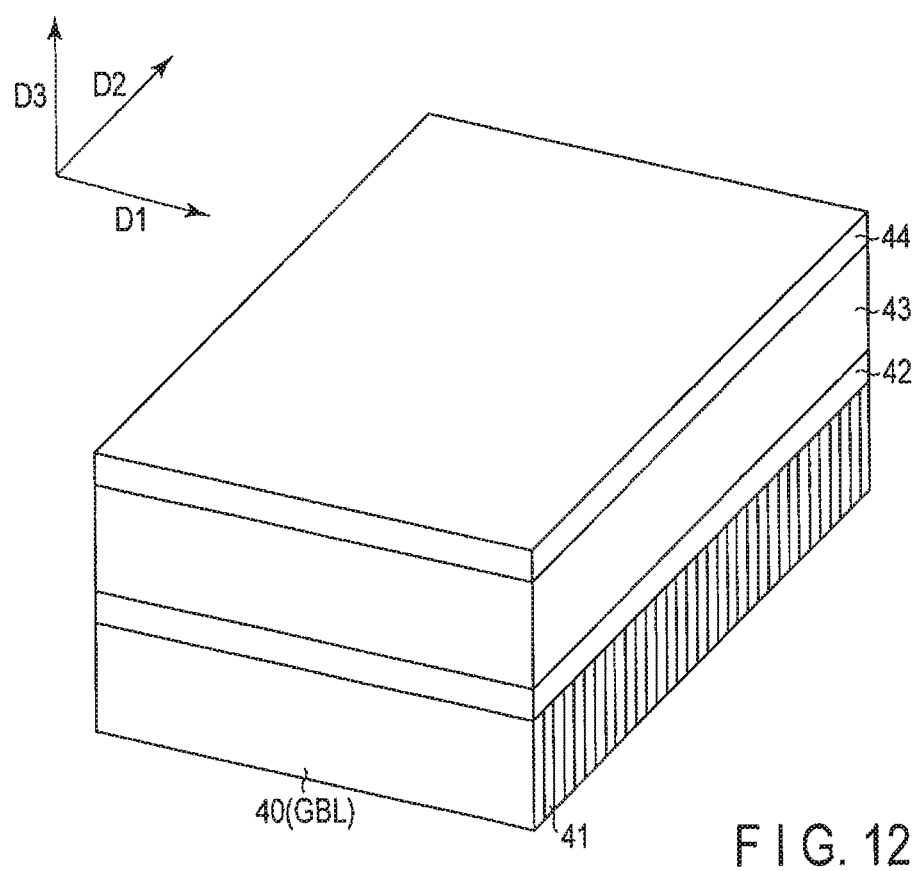

Next, as shown in FIG. 12, an interlayer insulating film 41 is formed on the whole surface. Continuously, the interlayer insulating film 41 is polished by a CMP process or the like, to expose the upper surface of the global bit line 40. Through the present step, the interlayer insulating film 41 fills in a region between the adjacent global bit lines 40. Continuously, an $n^+$-type silicon layer 42, a $p^+$-type silicon layer 43 and an $n^+$-type silicon layer 44 are successively formed on the global bit lines 40 and the interlayer insulating film 41. The silicon layers 42 to 44 correspond to the source region 5, the channel region 6 and the drain region 7 described with reference to FIG. 1, respectively. The silicon layers 42 and 44 have an impurity concentration of, for example, about $1\times10^{20}$ cm$^{-3}$, and a film thickness of, for example, about 40 nm. The silicon layer 43 has an impurity concentration of, for example, about $1\times10^{18}$ cm$^{-3}$, and a film thickness of, for example, about 120 nm. Afterward, annealing is performed on conditions of about 750° C. and 60 seconds, to crystallize the silicon layers 42 to 44.

Figure 13:
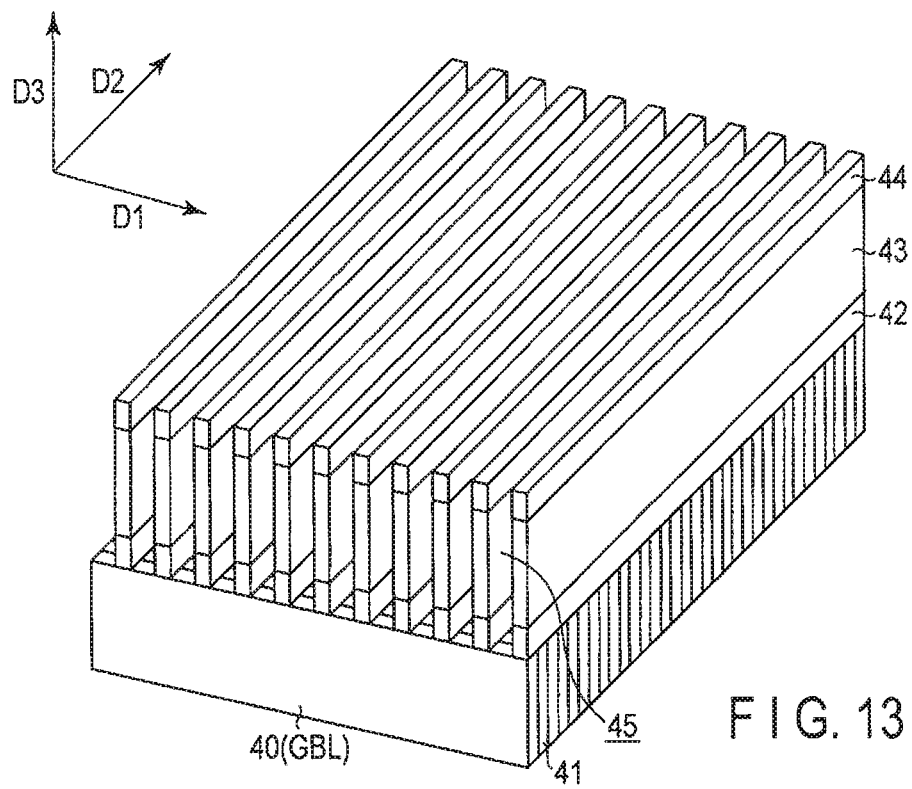

Next, as shown in FIG. 13, the silicon layers 42 and 43 are patterned in the stripe shape along a second direction (D2) by using the photolithography technology and RIE technology. It is to be noted that this patterning step is performed on conditions that a line width is about 19 nm and an adjacent space is about 29 nm (a half pitch is 24 nm). In bottom portions of grooves 45 made by the present step, the global bit lines 40 and the interlayer insulating film 41 are exposed.

Figure 14:
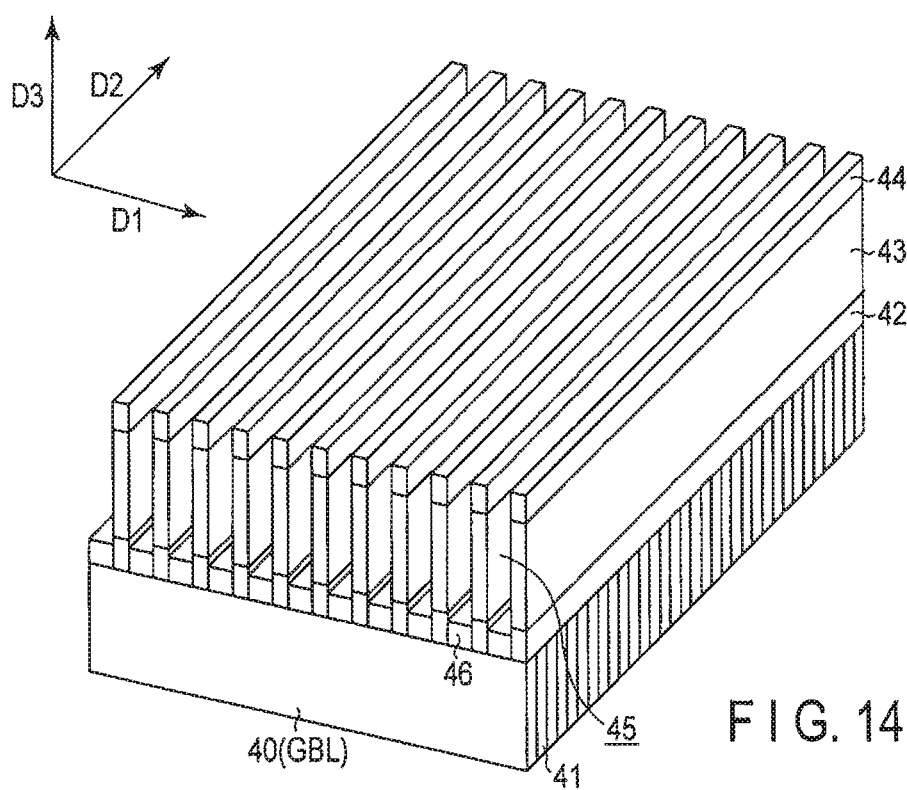

Next, as shown in FIG. 14, an insulating film 46 (e.g., a silicon oxide film) is formed on the whole surface. Continuously, the insulating film 46 is etched back, whereby the insulating film 46 remains only in the bottom portions of the grooves 45. The remaining insulating film 46 has a film thickness of, for example, about 30 nm. Therefore, part of the silicon layer 42 and the side surfaces of the silicon layers 43 and 44 are exposed in the grooves 45.

Figure 15:
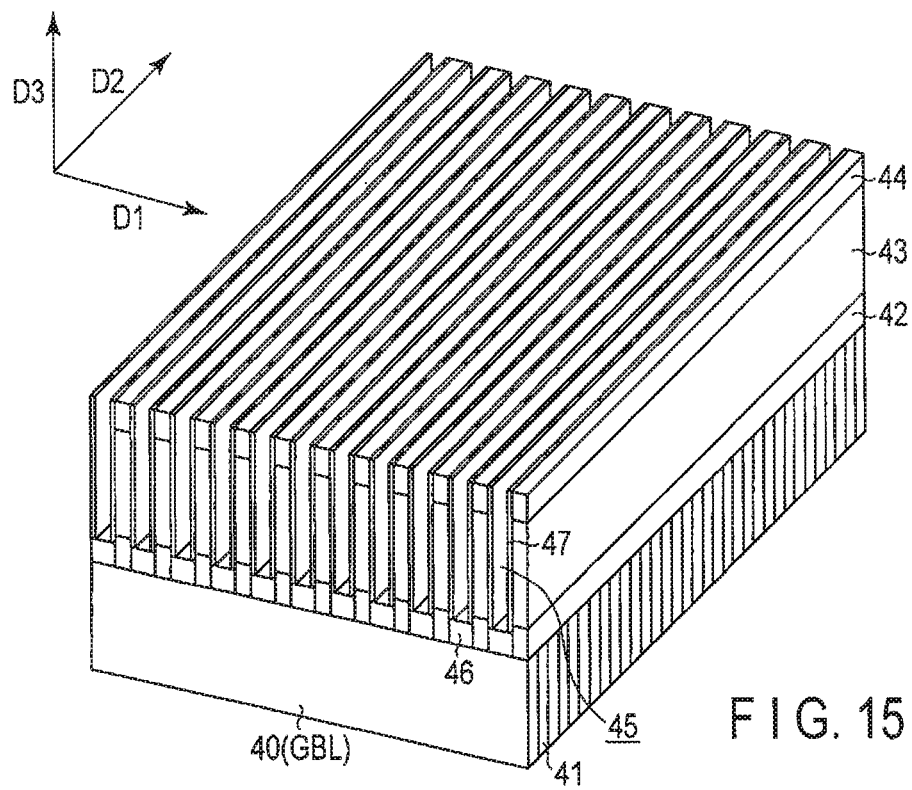

Next, as shown in FIG. 15, an insulating film 47 is formed on the whole surface. The insulating film 47 corresponds to the gate insulating film 9 described with reference to FIG. 1. Continuously, the upper surface of the silicon layer 44 and the insulating film 47 on the insulating film 46 are removed, whereby the insulating film 47 remains only on the side surfaces of the grooves 45.

Figure 16:
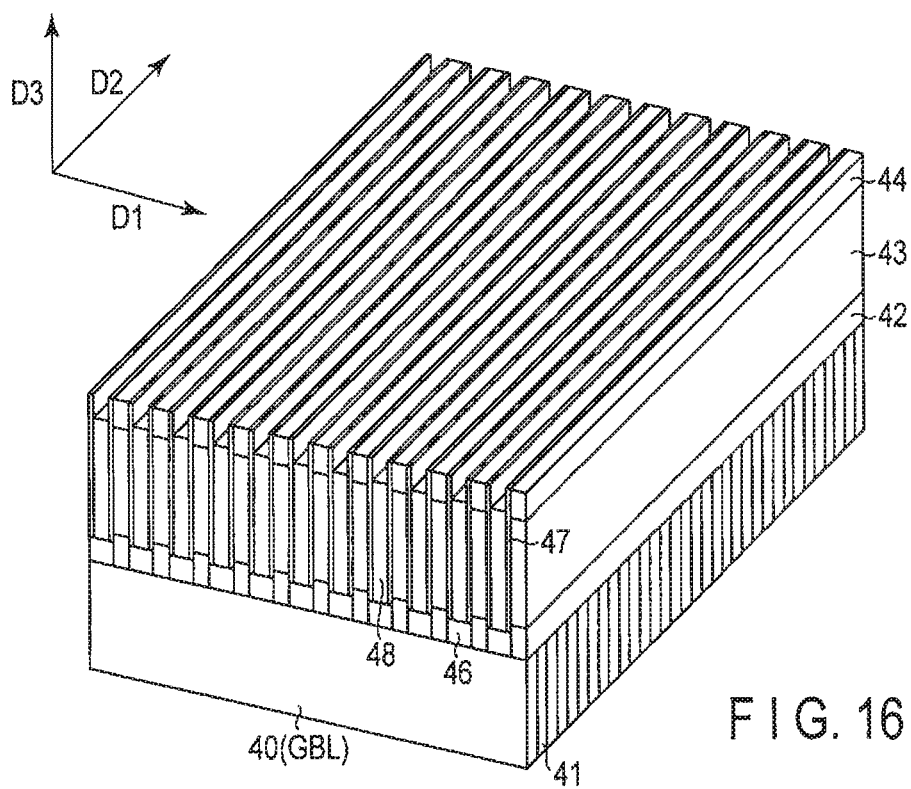

Next, as shown in FIG. 16, a conductive film 48 fills in the grooves 45. The conductive film 48 is, for example, an $n^+$-type polycrystalline silicon layer, and corresponds to the selection gate line SSG described with reference to FIG. 1. Afterward, the upper surface of the conductive film 48 is etched back, whereby a film thickness of the conductive film 48 becomes, for example, about 140 nm. Through information present step, the bottom surface of the conductive film 46 becomes lower than the interfaces of the silicon layers 42 and 43, and the upper surface of the conductive film 48 becomes higher than the interface of the silicon layers 43 and 44.

Figure 17:
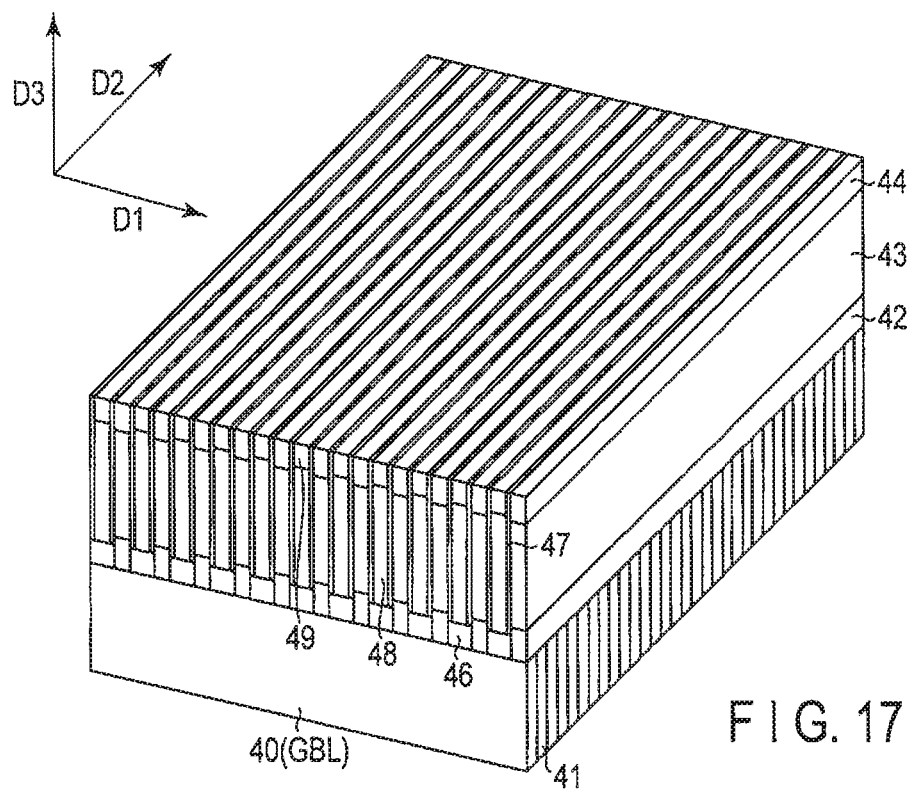

Next, as shown in FIG. 17, an insulating film 49 (e.g., a silicon oxide film) is formed on the whole surface. Afterward, the insulating film 19 is polished by, for example, the CMP process, and left only in the grooves 45. In consequence, the upper surface of the silicon layer 44 is exposed.

Figure 18:
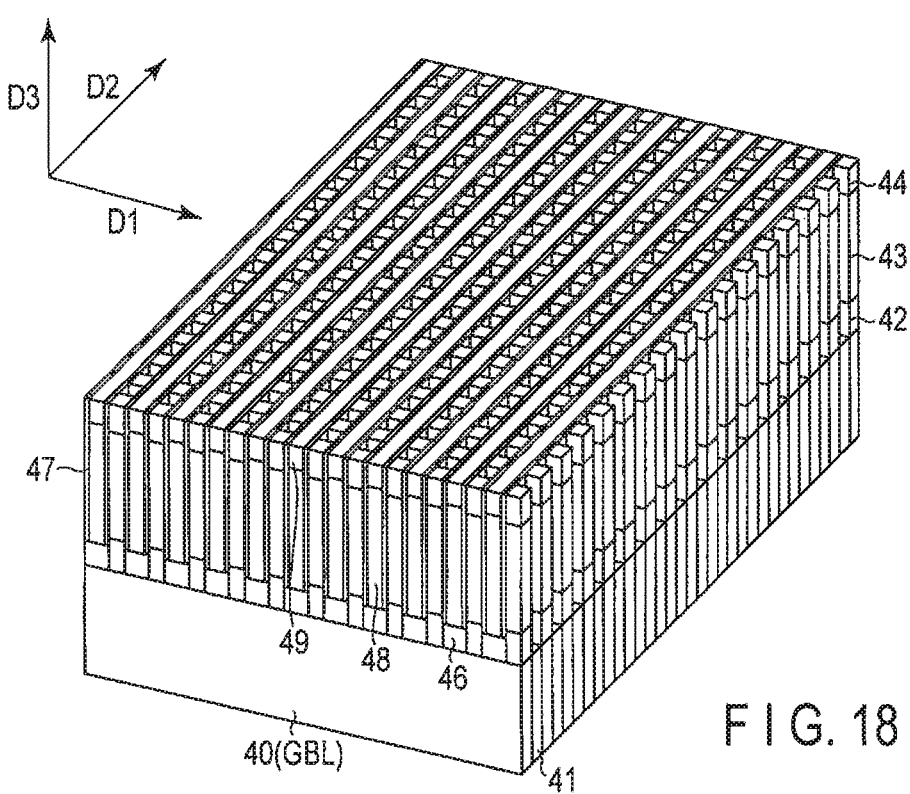

Next, as shown in FIG. 18, the silicon layers 42 and 43 are patterned in a pillar-shape by use of the photolithography technology and RIE technology. The present patterning step is performed on conditions that, for example, both the line width and the adjacent space are about 24 nm. Moreover, the present step is performed so that the silicon layers 42 and 43 remain on the global bit lines GBL in a lower layer. As a consequence of the present step, the silicon layers 42 and 43 are separated for each selection element SS.

Next, as shown In FIG. 19, an insulating film 50 fills in grooves made in the step of FIG. 13. Continuously, an insulating film 51 (e.g., a silicon oxide film) having a film thickness of, for example, 20 nm is formed on the silicon layer 43 and the insulating films 49 and 50. Afterward, 16 layers of word line films 52 are formed on the insulating film 53. The word line films 52 correspond to the word lines WL described with reference to FIG. 1. Moreover, the word line films 52 are formed by using, for example, TiN as a material, and a film thickness thereof is, for example, about 10 nm. Furthermore, an insulating film 53 (e.g., a silicon oxide film) having a film thickness of, for example, 1 nm is formed between the stacked word line films 52. Continuously, an insulating film 54 (e.g., a silicon oxide film) having a film thickness of, for example, 13 nm is formed on the word line film 52 of the uppermost layer (the sixteenth layer in the present example).

Next, as shown in FIG. 20, the insulating films 54, 53 and 53 and the word line film 52 are patterned into a stripe shape along the second direction by the photolithography technology and the RIE technology. The present patterning step is performed on conditions that, for example, a line width is about 20 nm and an adjacent space is about 28 nm (a half pitch is 24 nm). Moreover, the present step is performed so that the insulating films 54, 53 and 51 and the word line film 52 remain on the insulating film 49 in the lower layer. As a consequence of the present step, the word lines WL are formed, and the upper surfaces of the silicon layer 44 and the insulating film 50 and 47 are exposed in bottom portions of grooves 55 made by the patterning.

Figure 21:
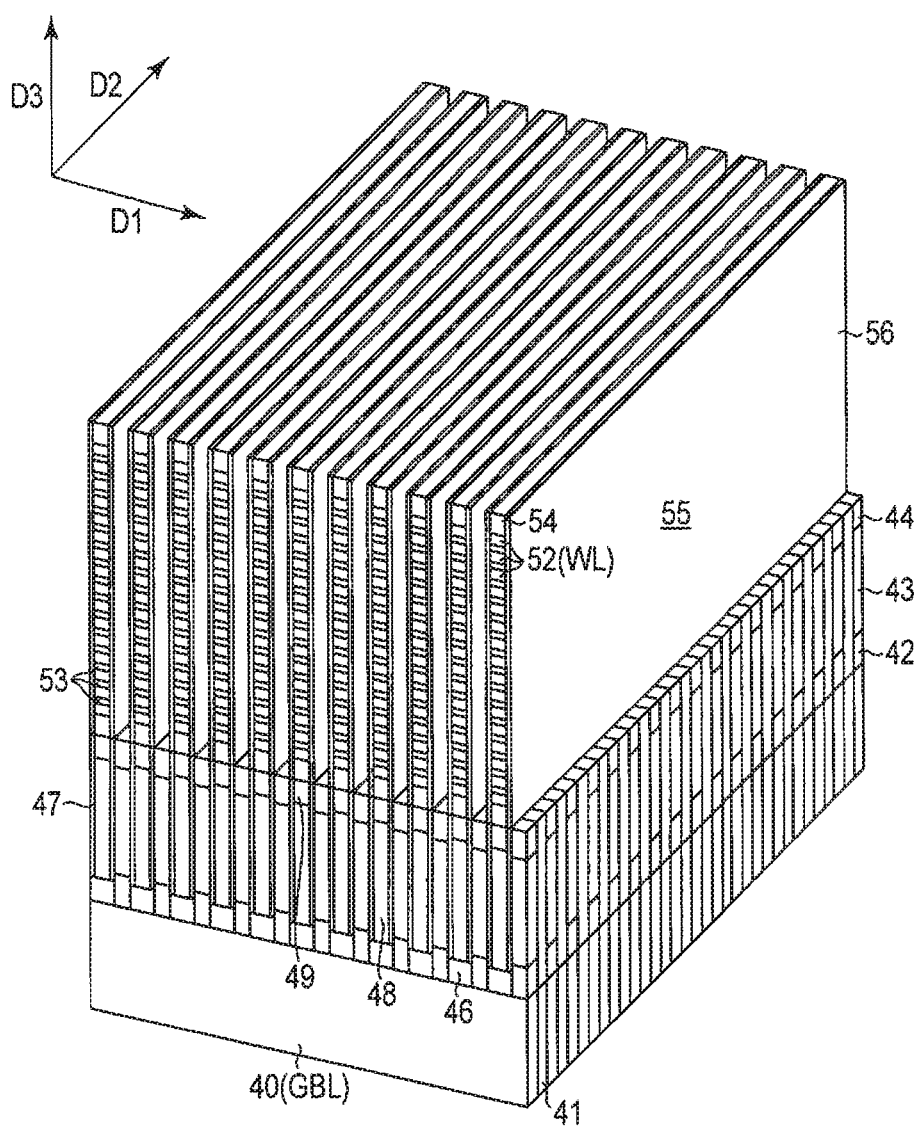

Next, as shown in FIG. 21, a variable resistance material 56 is disposed on the bottom surfaces and side surfaces of the grooves 55 and the upper surface of the insulating film 54. The variable resistance material 56 corresponds to the variable resistance material 4 described with reference to FIG. 1. The variable resistance material is disposed with a film thickness of, for example, about 4 nm so that the material does not fill in the grooves 55. Afterward, the material is etched back to remove the variable resistance material 56 from the bottom portions of the grooves 55 and the upper surface of the insulating film 54. In consequence, the upper surfaces of the silicon layer 44 and the insulating films 50 and 47 are again exposed in the bottom portions of the grooves 55.

Figure 22:
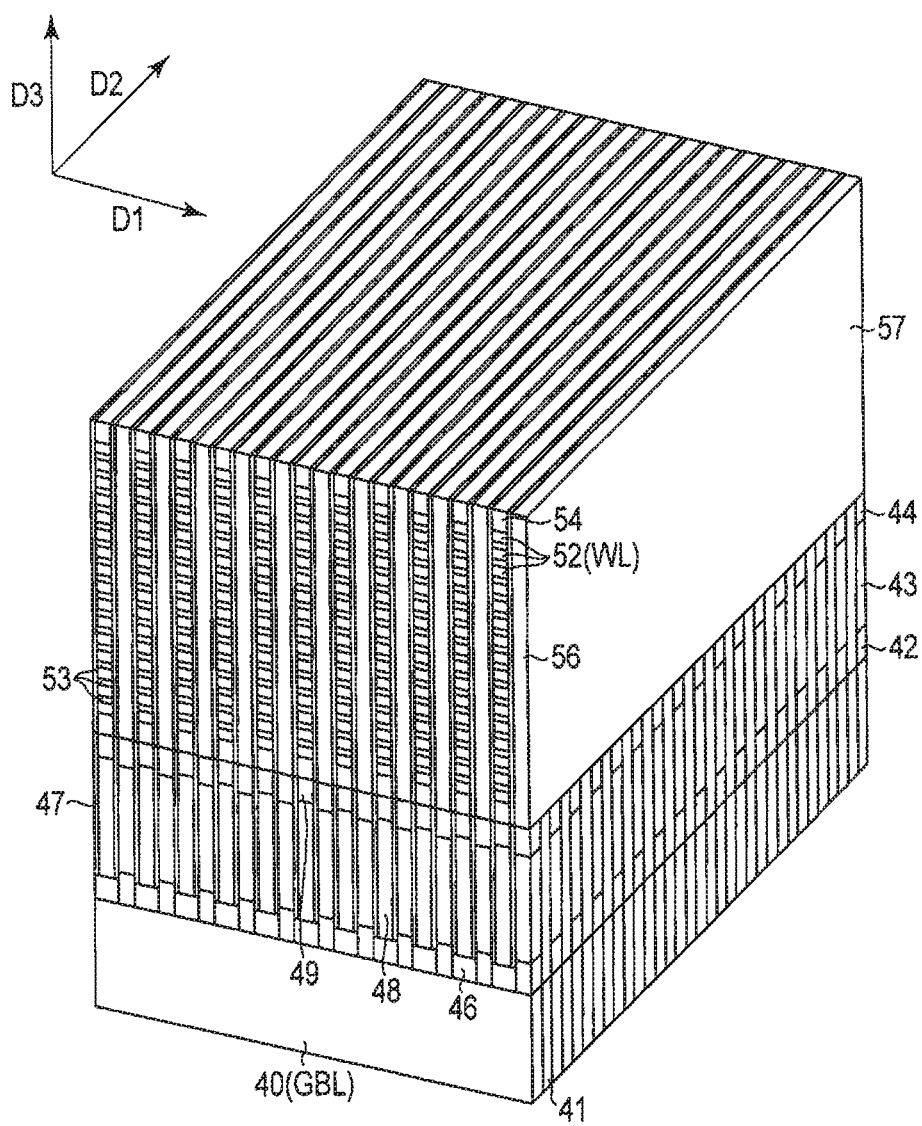

Next, as shown in FIG. 22, a bit line film 57 is formed on the whole surface, and polished by the CMP process, whereby the bit line film 57 is left only in the grooves 55. The bit line film 57 corresponds to the bit lines BL described with reference to FIG. 1, and is formed by using, for example, $n^+$-type polycrystalline silicon as a material.

Figure 23:
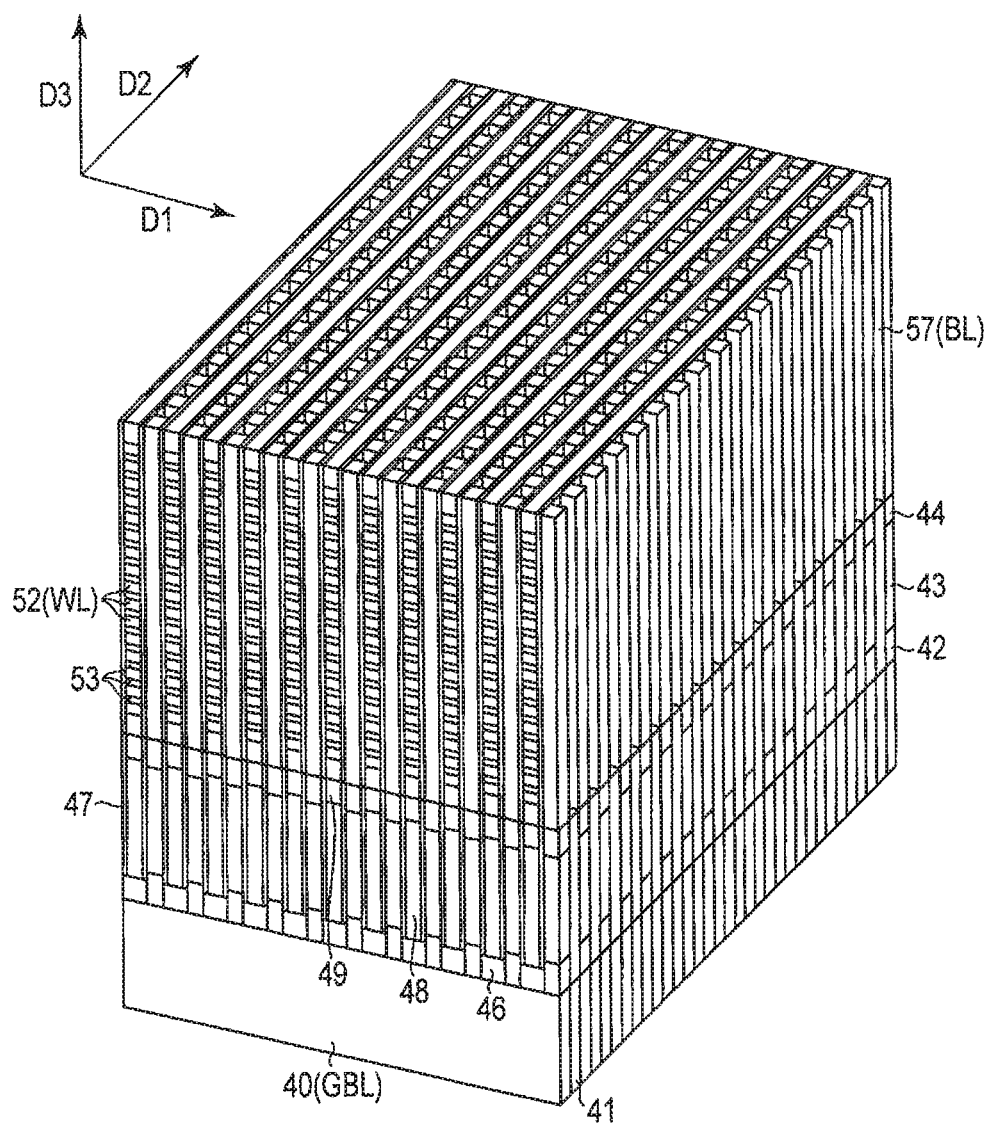

Next, as shown in FIG. 23, the bit line film 57 is patterned into a pillar-like shape by use of the photolithography technology and the RIE technology. The present patterning step is performed on conditions that both of a line width and an adjacent space is, for example, about 24 nm. Moreover, the present step is performed so that the bit line film 57 remains on a lower layer which is the silicon layer 44. As a consequence of the present step, the bit lines BL are completed.

Afterward, an interlayer insulating film fills in each groove between the adjacent bit lines BL, to complete a memory cell array. Continuously, there are performed a step of connecting the word lines WL and the bit lines BL to the CMOS circuit 32, and the like. Furthermore, a passivation step is performed in the same manner as in a conventional semiconductor device, and an interconnect connecting portion which becomes an input/output portion is further formed. Finally, so-called post steps of inspection, dicing and the like are performed, to complete the ReRAM described in the first embodiment.

2. Re: Second Fabricating Method

Next, a second fabricating method which is different from the first fabricating method will be described with reference to FIG. 24 to FIG. 30. FIG. 24 to FIG. 30 are perspective views successively showing fabricating steps of a memory cell array of an ReRAM described in the first embodiment. In the present method, the global bit line film 40 is patterned together with the silicon layers 42 to 44, after forming the silicon layers 42 to 44 in the above first fabricating method. Hereinafter, only respects that are different from the first fabricating method will be described.

First, as shown in FIG. 24, the global bit line film 40 is formed in the same manner as in the first fabricating method. Afterward, the silicon layers 42 to 44 are formed on the global bit line film 40, before patterning the global bit line film 40. Film thicknesses, materials and the like of the respective layers are similar to those of the first fabricating method.

Next, as shown in FIG. 25, the silicon layers 42 to 44 and the global bit line film 40 are patterned by a photolithography technology and an RIE technology. In consequence, the global bit lines 40 (GBL) having a stripe shape along a first direction are formed. The present patterning step is performed on conditions that a line width and an adjacent space are, for example, about 24 nm.

Figure 26:
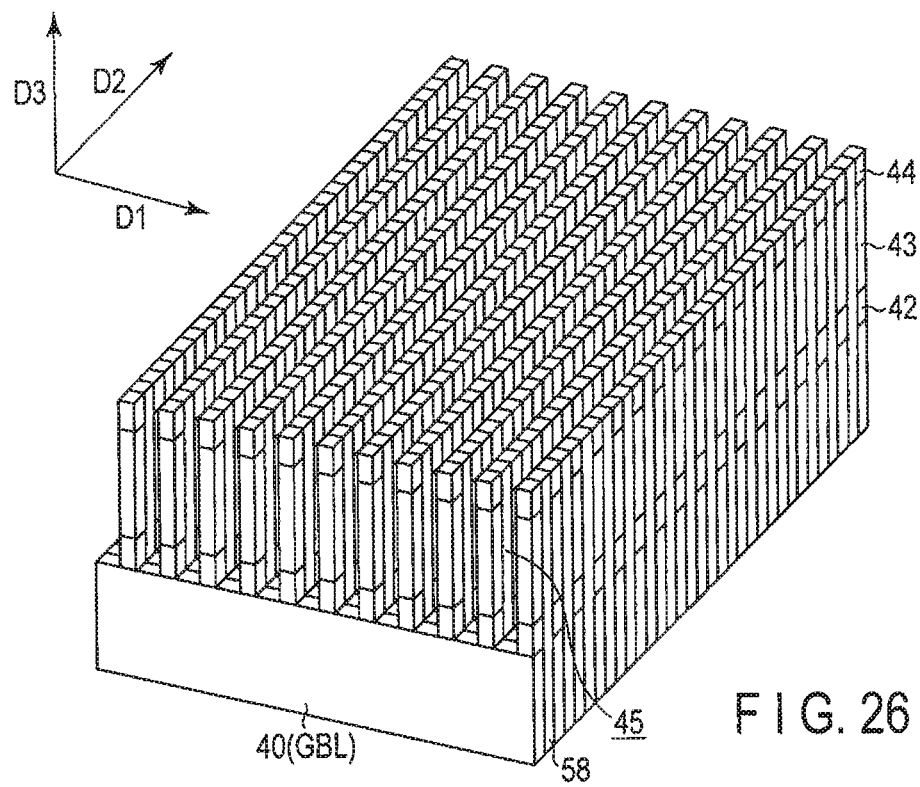

Next, as shown in FIG. 26, an interlayer insulating film 58 is formed on the whole surface. Afterward, the interlayer insulating film 58 is polished by a CMP process or the like, to expose the upper surface of the silicon layer 44. Through the present step, the interlayer insulating film 58 fills in groove portions generated in the step of FIG. 25. Continuously, the silicon layers 44, 43 and 42 are patterned. The present step is similar to the patterning step of FIG. 13 described in the first fabricating method.

Next, as shown in FIG. 27 to FIG. 30, the insulating films 46 and 47, the conductive film 48 and the insulating film 49 are successively formed. These steps are similar to those of FIG. 14 to FIG. 17. Afterward, steps of FIG. 19 to FIG. 23 are performed.

Third Embodiment

Next, a memory device according to a third embodiment will be described. The present embodiment relates to data reading and writing methods of the ReRAM described in the above first embodiment.

1. Data Writing Method

First, the writing method of the data according to the present embodiment will be described. FIG. 31 and FIG. 32 are plan views of a memory cell array, and shows a plane formed in a first direction and a second direction in the same manner as in FIG. 3.

As described in the first embodiment, when a word line group WLcomb_a is selected, for example, odd word lines WL1, WL3, WL5 to WL(n−1) (n is an even number of 4 or larger) are selected. On the other hand, when a word line group WLcomb_b is selected, for example, even word lines WL0, WL2, WL4 to WL(n−2) are selected. Moreover, two memory cells MC are connected between one global bit line GBL and one word line WL. Therefore, one word line group WLcomb including (n/2) word lines WL is selected, to select n memory cells MC0 to MC(n−1).

The data is written in the n memory cells MC, for example, in order. The reference characters c0 to c(n−1) of FIG. 31 and FIG. 32 show data to be actually written in the memory cells MC0 to MC(n−1), and the data is written in the memory cells, for example, in order of c0 to c(n−1). Moreover, FIG. 31 shows the case where the word line group WLcomb_a is selected, and FIG. 32 shows the case where the word line group WLcomb_b is selected.

As shown, the word lines WL alternately belong to the word line groups WLcomb_a and WLcomb_a. Therefore, one of the word lines at both ends of the word line group WLcomb is sandwiched between two word lines of the other word line group WLcomb, and the other word line is not sandwiched. More specifically, the word lines at both the ends of the word lines belonging to the word line group WLcomb_a are the word lines WL1 and WL(n−1). One (WL1) of these word lines is sandwiched between two word lines WL0 and WL2 belonging to the other word line group WLcomb_b. However, the other word line (WL(n−1)) is adjacent only to the word line WL(n−2) belonging to WLcomb_b, and is not sandwiched.

According to such a structure, the data c0 is written in the memory cell MC0 connected to the word line WL at the end of the word line group WLcomb and positioned at inner side of the other word line group WLcomb. In other words, the data c0 is written in the memory cell MC0 formed on the side surface of the word line (WL1) at the end of the word line group (e.g., WLcomb_a) and facing the word line (WL0) at the end of the other word line group (WLcomb_b). Further in other words, the data c0 is written in the memory cell MC0 formed on the side surface of the word line (WL1) at the end of the word line group (e.g., WLcomb_a) and positioned between this word line (WL1) and the word line (WL0) at the end of the other word line group (WLcomb_b). Moreover, the data piece c0 among data pieces (c0, c1, ... c(n−1)) is first written.

The data (c1, c2, ... c(n−1)) is the data to be written, in order, in the memory cell MC selected in accordance with the word line WL number.

Figure 33:
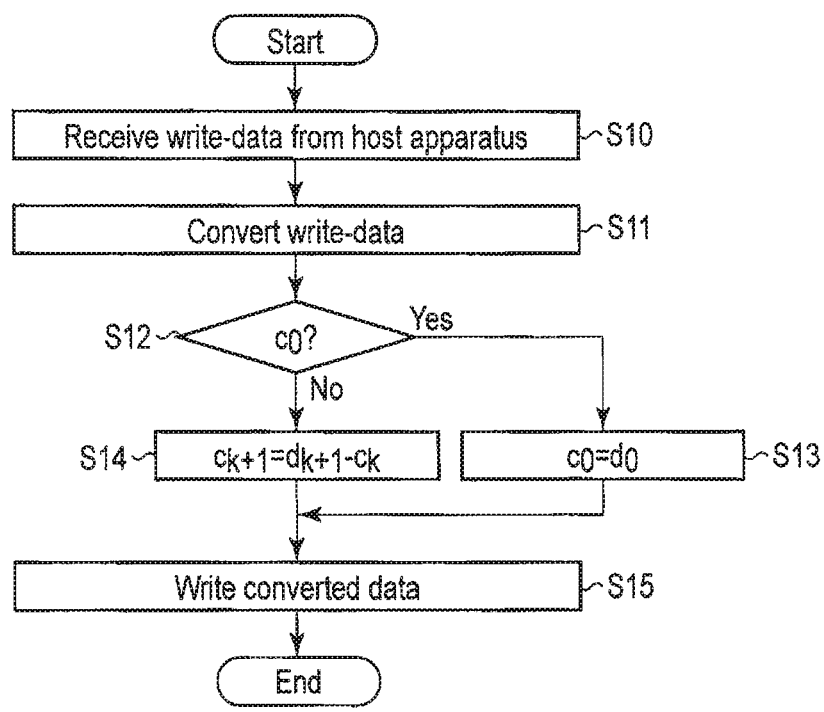
FIG. 33 is a flowchart showing a data writing method according to the third embodiment.

FIG. 33 is a flowchart showing the data writing method according to the present embodiment. As shown, for example, a controller 25 receives writing-data from a host apparatus (step S10). It is to be noted that pieces of data transmitted from the host apparatus to the memory cells MC0 to MC(n−1) are data pieces (d0, d1, ... d(n−1)), respectively.

Next, the controller 25 converts the data pieces d0 to d(n−1) (step S11). This conversion rule is as follows.

c0=d0 (steps S12, YES and S13); and
c(k+1)=d(k+1)−ck (steps S12, NO and S14), where k is an integer, and (k+1)=1 to (n−1).

That is, the data c0 is the data d0 itself transmitted from the host apparatus. On the other hand, the data (c1, c2, ... c(n−1)) is a value obtained by subtracting the data (c0, c1, ... c(n−2)) concerning the adjacent word line from the data (d1, d2, ... d(n−1)) transmitted from the host apparatus. In consequence, the controller 25 obtains the data (c0, c1, ... c(n−1)). However, when calculation results of the steps S13 and S14 are negative or are not smaller than the maximum value of the data d ("2" in the case of 1-bit data, "4" in the case of 2-bit data, and "8" in the case of 3-bit data), a (mathematically mod (the maximum value of the data values)) procedure to add or subtract the maximum value of the data d is performed.

Then, the controller 25 writes the obtained data (c0, c1, ... c(n−1)) in the memory cell MC (step S15).

FIG. 34 shows a conversion example of the above data, and a case where the writing-data is 1 bit for one memory cell (the case where the memory cell is a single level cell (SLC)). Hereinafter, the writing-data received from the host apparatus is called "the data value d", and the data obtained by the data conversion of the controller 25 and actually written in the memory cell is called "the cell value c". The "read data" in the diagram is a value obtained when the cell value c is read, and this respect will be described in a reading operation described later.

Example 1 in the diagram shows the case of the data value (d0, d1, ... d7)=(1, 1, 0, 0, 1, 1, 0, 1). In this case, the cell value (c0, c1, ... c7)=(1, 0, 0, 0, 1, 0, 0, 1).

Example 2 in the diagram snows the case of the data value (d0, d1, ... d7)=(1, 0, 0, 1, 1, 0, 1, 0). In this case, the cell value (c0, c1, ... c7)=(1, 1, 1, 0, 1, 1, 0, 0). The value enclosed in a circle mark in the diagram corresponds to a case where "+1" is obtained from an equation shown in the step S14. However, when the maximum value "2" of the 1-bit data is added (mod(2) calculation is performed), "1" is obtained.

FIG. 35 shows a conversion example, and a case where the writing-data is 2 bit for one memory cell (the case where the memory cell is a multi-level cell (MLC)).

Example 3 in the diagram shows the case of the data value (d0, d1, ... d7)=(1, 3, 1, 2, 3, 0, 2, 0). In this case, the cell value (c0, c1, ... c7)=(1, 2, 3, 3, 0, 0, 2, 2). The value enclosed in a circle mark in the diagram corresponds to a case where a negative value is obtained from the equation shown in the step S34. However, when the maximum value "4" of the 2-bit data is added (mod(4) calculation is performed), a positive value of 3 or smaller is obtained.

It is to be noted that biases of interconnects when the data is written are shown in FIG. 7 described in the first embodiment.

2. Data Reading Method

Next, the data reading method will be described. The data reading method is different from the method described with reference to FIG. 7 in the first embodiment, in the following respect.

Only one selection gate line SSG concerning the selection element SS connected to the selected bit line BL is selected (Vg_r), and the other selection gate lines are unselected (0 V). The one selection element SS is provided with two selection gate lines SSG. From these two lines, the memory cell-side selection gate line SSG in which a cell value ck is written is selected, and the memory cell-side selection gate line SSG in which a cell value c(k+2) is written is unselected, when the cell value written in the selected memory cell MC is c(k+1).

When a value of the read data is negative and when the value of the read data is not smaller than the maximum value of the data values, the (mathematically mod (the maximum value of the data values)) procedure to add or subtract the maximum value of the data values is performed. When the data value is binary (binary digits 0 and 1) and the read data=−1, 2 is added, to obtain the read data=1. Moreover, in the case of the read data=2, 2 is subtracted, to obtain the read data=0.

3. Re: Specific Examples

Next, specific examples of the above writing operation and reading operation will be described. FIG. 36 is a sectional view of a memory cell array. As an example, there will be described a case where 1-bit data is written in five memory cells MC0 to MC4 connected to the word line group WLcomb_a and next the data is read from these memory cells MC0 to MC4.

3.1 Writing Operation

First, the writing operation will be described. As shown in, for example, FIG. 36, it is considered that a data value (d0, d1, d2, d3, d4) received from the host apparatus is (1, 1, 0, 0, 1). Then, the cell values are as follows.

c0=d0=1
c1=d1−c0=1−1=0
c2=d2−c1=0−0=0
c3=d3−c2=0−0=0
c4=d4−c3=1−0=1

Therefore, (c0, c1, c2, c3, c4)=(1, 0, 0, 0, 1) are written in the memory cells MC0 to MC4, respectively.

3.2 Reading Operation

Next, the reading operation will be described. First, there will be described a case where the data is read from the memory cell MC0, with reference to FIG. 37. FIG. 37 is a sectional view of a memory cell array, and shows a plane formed in a first direction and a third direction.

As shown, when the data is read from a memory cell MC0, a selection gate line SSG0 is selected from two selection gate lines SSG0 and SSG1 of a selection element SS0 corresponding to a selected bit line BL0, and a reading voltage Vg_r is applied to the line. The other selection gate lines SSG1 to SSG(n−1) are unselected, and 0 V is applied to the lines. The other voltages have been described with reference to FIG. 7.

As a consequence, a channel is formed in the selection element SS0 by the selection gate line SSG0. Consequently, the bit line BL0 is electrically connected to the global bit line GBL. Any channel is not formed in the other selection elements SS1 to SS(n−1), and hence the other bit lines BL0 to BLn are electrically separated from the global bit line GBL.

Therefore, a current I0 flows from the global bit line GBL to the word line WL1 through the variable resistance material 4 of the selected memory cell MC0. This current I0 has a value corresponding to the data c0 (=d0) written in the memory cell MC0. This current is sensed and amplified, to read the reading data="1" (=d0).

Next, there will be described a case where the data is read from the memory cell MC1, with reference to FIG. 38. FIG. 38 is a sectional view of a memory cell array, and shows a plane formed in a first direction and a third direction.

As shown, when the data is read from a memory cell MC1, a selection gate line SSG1 (the selection gate line closer to the memory cell MC0 in which the cell value c0 is written) is selected from two selection gate lines SSG1 and SSG2 of a selection element SS1 corresponding to a selected bit line BL1, and a reading voltage Vg_r is applied. The other selection gate lines SSG0 and SSG2 to SSG(n−1) are unselected, and 0 V is applied. The other voltages have been described with reference to FIG. 7.

Then, channels are formed in not only the selection element SS1 but also a selection element SS0 connected to an unselected bit line BL0. Consequently, two bit lines BL0 and BL1 are electrically connected to a global bit line GBL.

Therefore, a current I0 flows from the global bit line GBL to a word line WL1 through a variable resistance material 4 of an unselected memory cell MC0. This current I0 has a value corresponding to the data c0 (=d0) written in the memory cell MC0. Furthermore, a current I1 flows from the global bit line GSL to the word line WL1 through the variable resistance material 4 of the selected memory cell MC1. This current I1 has a value corresponding to data c1 (=d1−c0) written in the memory cell MC1.

Then, the controller 25 senses and amplifies the sum of the above two currents I0 and I1. Then, as shown in FIG. 36, when I0=c0 and I1=(d1−c0), I0+I1=c0+(d1−c0)=d1, whereby the reading data="1" (=d1) is read.

Figure 39:
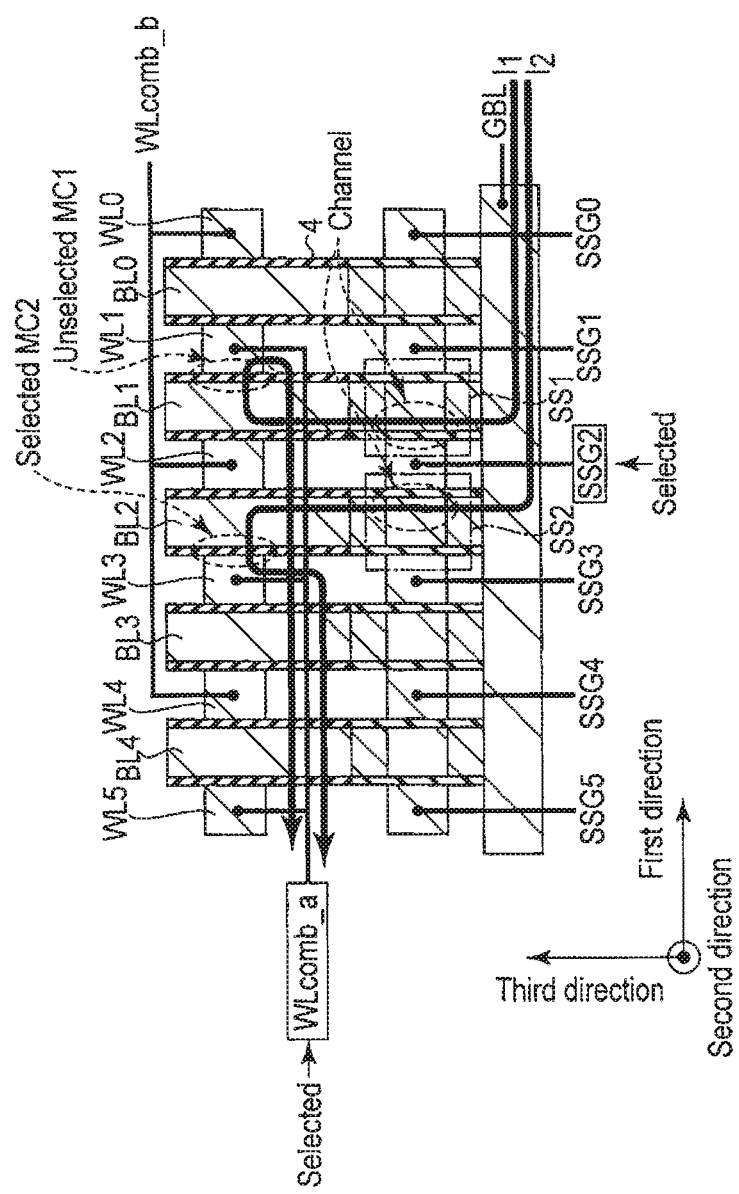

Next, there will be described a case where data is read from the memory cell MC2, with reference to FIG. 39. FIG. 39 is a sectional view of the memory cell array, and shows the plane formed in the first direction and the third direction.

As shown, when the data is read from the memory cell MC2, a selection gate line SSG2 (the selection gate line closer to a memory cell MC1 in which a cell value c1 is written) is selected from two selection gate lines SSG2 and SSG3 of a selection element SS2 corresponding to a selected bit line BL2, and the reading voltage Vg_r is applied. The other selection gate lines SSG0 and SSG1 and SSG3 to SSG(n−1) are unselected, and 0 V is applied. The other voltages have been described with reference to FIG. 7.

Then, channels are formed in not only the selection element SS2 but also a selection element SS1 connected to an unselected bit line BL1, when the selection gate line SSG2 is selected. Consequently, two bit lines BL1 and BL2 are electrically connected to a global bit line GBL.

Therefore, a current I1 flows from the global bit line GBL to a word line WL1 through a variable resistance material 4 of the unselected memory cell MC1. This current I1 has a value corresponding to the data c1 (=d1−c0) written in the memory cell MC1. Furthermore, a current I2 flows from the global bit line GBL to a word line WL2 through the variable resistance material 4 of the selected memory cell MC2. This current I2 has a value corresponding to data c2 (=d2−c1) written in the memory cell MC2.

Then, the controller 25 senses and amplifies the sum of the above two currents I1 and I2. Then, as shown in FIG. 36, when I1=c1 and I2=(d2−c1), I1+I2=c1+(d2−c1)=d2, whereby the reading data="0" (=d2) is read.

The data is read from the other memory cells MC3, MC5 and the like in the same manner as in FIG. 38, and the data is read from the memory cells MC4, MC6 and the like in the same manner as in FIG. 39.

In consequence, as shown in FIG. 36, a cell value (c0, c1, c2, c3, c4)=(1, 0, 0, 0, 1) is read as a data value (d0, d1, d2, d3, d4)=(1, 1, 0, 0, 1).

4. Effect by the Present Embodiment

According to the present embodiment, interference with the adjacent cell can be suppressed, and a data reading accuracy can be enhanced. Hereinafter, the present effect will be described in detail.

According to the method of the above-mentioned first embodiment, the voltage Vg_r is applied to two selection gate lines SSG_s and SSG_n. Also by such a method, the data can be read. When such a method is used, the selection element SS has one of the following three states in accordance with voltage states of the two selection gate lines SSG.

The state where the selection gate lines SSG on both sides of the channel region 6 have a high potential. In such a state, the selection element SS is called the ON-element.

The state where the selection gate lines SSG on both the sides of the channel region 6 have a low potential. In such a state, the selection element is called the OFF2-element.

The state where the selection gate line SSG on one side of the channel region 6 has a high potential, and the selection gate line SSG on the opposite side has a low-potential. In such a state, the selection element is called the OFF1-element.

In the OFF2-element, a potential which is 1 V or more lower than that of the global bit line is securely supplied to the selection gate lines on both the sides as described above. Therefore, the OFF2-element has a complete OFF-state, and a leak current of the order of pA can only flow.

Figure 40:
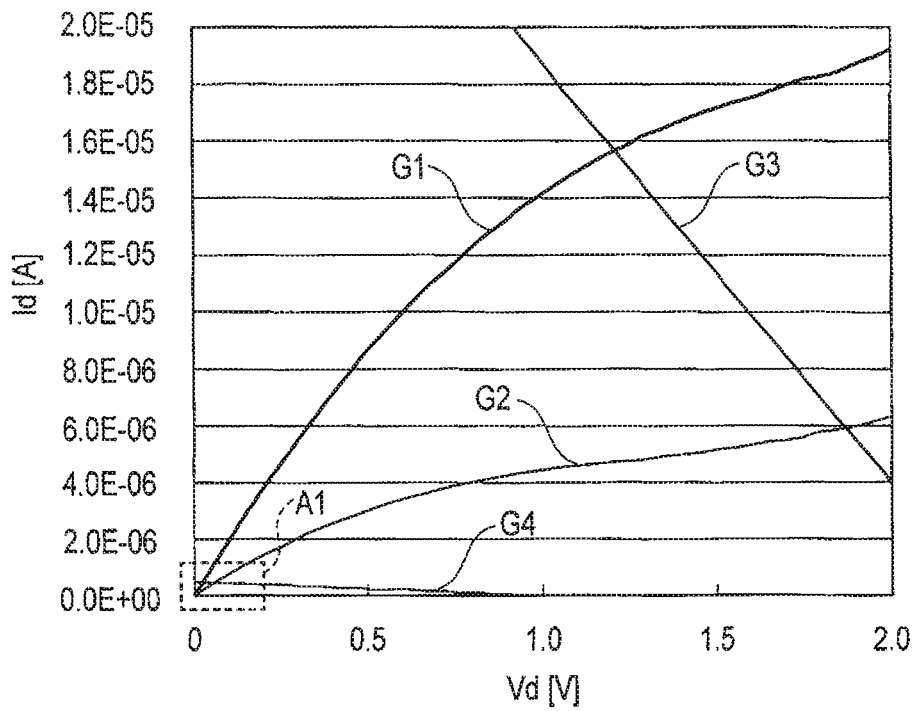
FIG. 40 and FIG. 41 are graphs showing drain voltage to drain current characteristics of memory cells.

On the other hand, a channel is formed by the selection gate line set to the high potential, in the ON-element and OFF1-element. Therefore, a certain degree of large current flows. FIG. 40 is a graph showing Id-Vd characteristics and load curves of the ON-element and OFF1-element, and showing a case where an Si channel length of the selection element SS is 120 nm, a channel thickness thereof is 20 nm, a channel width thereof is 24 nm, a gate oxide film thickness is 5 nm, a high potential gate voltage is 2 V, and a low potential gate voltage is −1 V. Moreover, FIG. 41 is an enlarged view of a region A1 in the vicinity of an origin in FIG. 40.

Figure 41:
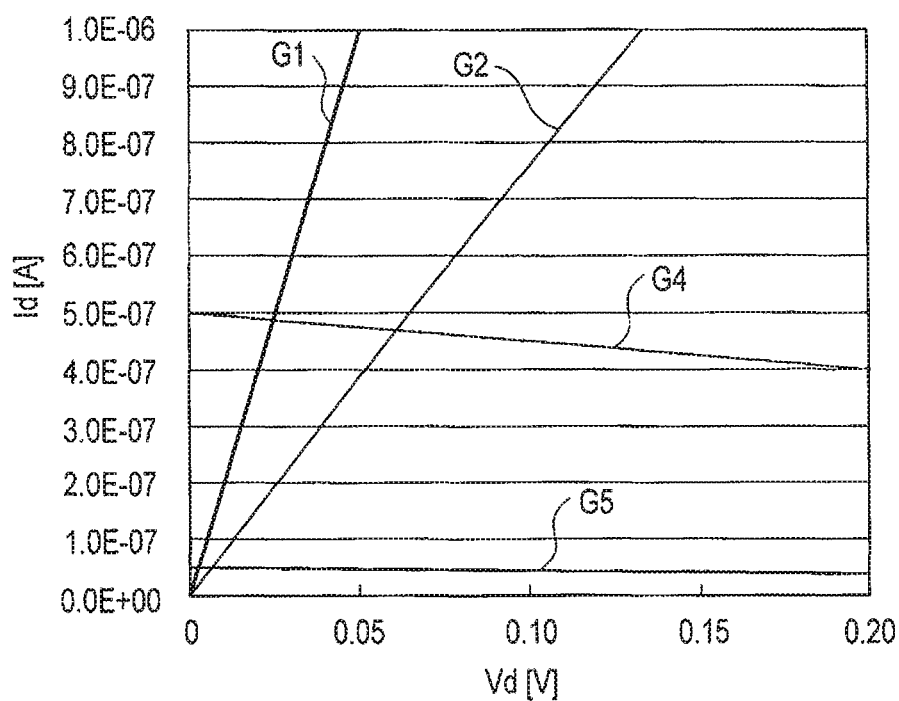

Moreover, a graph G1 of FIG. 40 and FIG. 41 shows the ON-element, a graph G2 shows the OFF1-element, a graph G3 shows a load line during writing and erasing, a graph G4 shows a load line of a memory cell in a low resistance state during reading, and a graph G5 shows a load line of the memory cell in a high resistance state during the reading.

During the data writing and erasing, a half voltage is also applied to a half-selected cell, and a half-selected current flows through the cell. Therefore, as shown in FIG. 40, the load curve during the writing and erasing intersects in a region where Vd and Id are comparatively large. Therefore, a difference in operation current between the CN-element and the OFF1-element becomes about 2.5 times. Owing to this selection ratio, erroneous writing in the cell other than the selected cell and the like can be suppressed.

On the other hand, the voltage/current applied to the cell during the reading is set to be sufficiently smaller than that during the writing/erasing. This is because so-called read disturb is suppressed. Additionally, it is preferable to use a region where a gradient of Id-Vd characteristics is as large as possible. A reason is that when a region where the gradient of the Id-Vd characteristics of the selection element is small (so-called saturated region) is an operation point, a difference in detection current, with respect to a difference in cell resistance value, becomes small, and a detection sensitivity deteriorates. Therefore, as shown in FIG. 41, a large part of the voltage is applied to the cell, and the resistance value of the cell mainly determines the detection current in a situation during the reading.

As shown in FIG. 41, a selection ratio of 2.5 times or larger is present in the currents Id of the ON-element and the OFF1-element, even in such a low voltage/low current region. In an actual situation, however, the current detected outside the memory cell array does not have any large difference between the ON-element and the OFF1-element, as long as the cell resistance is the same.

In the example of FIG. 8, for example, the selection element SS connected to SSG_u and SSG_s and the selection element SS connected to SSG_u and SSG_n are OFF1-elements. The selection element SS which is connected to SSG_u and is not connected to SSG_s or SSG_n is the OFF2-element. Moreover, the memory cell MC connected to the OFF1-element and the selected word line WL_s is the half-selected cell.

Then, the current flowing via the OFF2-element is remarkably small, and can be ignored. Therefore, the current flowing through the global bit line GBL is the sum of the current flowing through the selected cell via the ON-element and the current flowing through two half-selected cells (these memory cells are to be unselected cells) via the OFF1-element. Needless to say, a value which can be detected in a circuit is an only value of the current flowing into the global bit line GBL from the outside of the array, and hence the current flowing via the OFF1-element becomes a background noise.

As described above, in bias conditions for the reading, a cell resistance is comparatively large, and the resistance of the selection element S3 is comparatively small. Therefore, the selection element SS does not depend on the ON-element or the OFF1-element, but the current value is determined mainly by the size of the cell resistance sometimes. For example, even when the selected cell has a high resistance, the half-selected cell in a path of the current flowing via the OFF1-element has a low resistance. In this case, the current value detected through the global bit line might be a high current. This inevitably becomes a cause for erroneous reading.

In this respect, according to the present embodiment, the data d0 received from the host apparatus is written, as it is, in the memory cell MC (the memory cell MC0 of FIG. 36) where any path of the current flowing via the OFF1-element is not present. However, the data is written in the other memory cells, which may be MC influenced by the OFF1-element, so that a relation of $c(k+1)=d(k+1)-ck$ is established.

Moreover, the current flowing through the global bit line GBL is measured, during the reading, in a state where one of the two selection gate lines SSG of the selection element SS directly connected to the bit line BL belonging to the selected cell is provided with a high potential, as described with reference to FIG. 33 and FIG. 39. Moreover, the value of the current flowing through the global bit line GBL becomes the sum of the values of currents flowing through two memory cells MC sharing the one selection gate line SSG provided with the high potential.

In this case, the selection gate line SSG provided with the high potential satisfies the following conditions. That is, the data written in the memory cell MC which becomes a reading object is a cell value $c(k+1)$. Moreover, this memory cell is labeled as $MC(k+1)$. Then, the selection gate line SSG which satisfies both of the following two conditions is selected.

The current path is formed in the selection element SS between the selected memory cell MC(k+1) and the global bit line GBL.

The current path is formed between the memory cell MCk, which is connected to the sane word line group WLcomb as that of the selected memory cell MC(k+1) and in which the cell value ck is written, and the global bit line GBL.

That is, when the bit line BL connected to the selected memory cell MC(k+1) is BL(k'+1), the selection gate line SSG positioned between the bit line BL(k'+1) and the bit line BLk' is provided with the high potential.

Therefore, the current flowing through the global bit line GBL is a value corresponding to the data of the memory cells MC(k+1) and MCk. That is, the value corresponds to (c(k+1)+ck). Then, a relation of $d(k+1)=c(k+1)+ck$, and hence the value of this current flowing through the global bit line GBL corresponds to the data value d(k+1) as it is. That is, when the current is detected once, it is possible to read each data value while suppressing the influence of the adjacent unselected memory cell (the half-selected cell). Therefore, a high-accuracy and high-speed reading operation is enabled.

It is to be noted that the selection gate line SSG to which a high potential (Vg_w, Vg_e) is applied during the data writing and erasing may be two selection gate lines described in the first embodiment, or one selection gate line described at the reading time of the present embodiment.

Fourth Embodiment

Next, a memory device according to a fourth embodiment will be described. The present embodiment relates to a data writing method of the ReRAM described in the above first to third embodiments, and relates to the order of memory cells MC in which data is to be written.

1. Re: Writing Method

Figure 42:
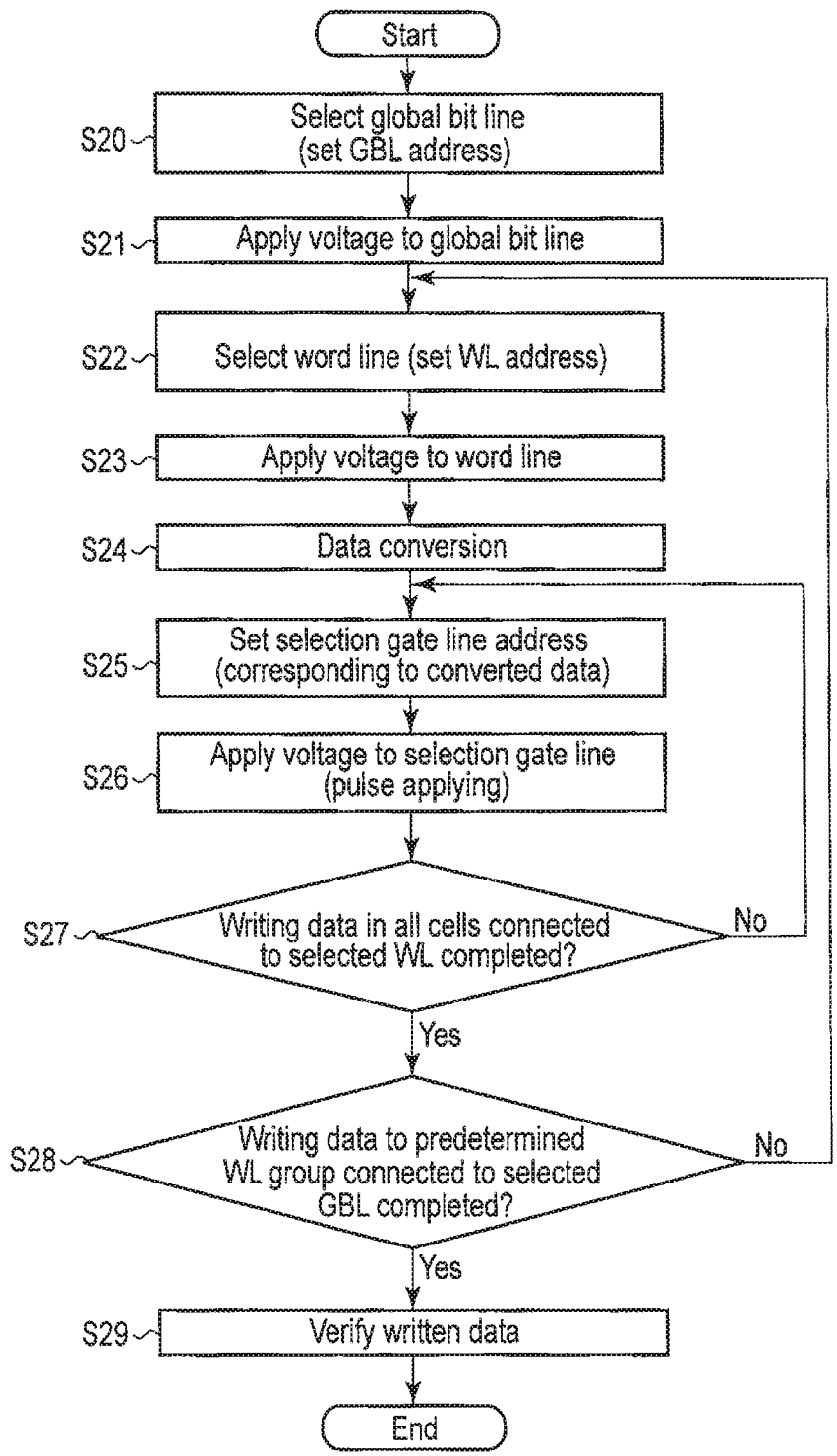
FIG. 42 is a flowchart showing a data writing method according to a fourth embodiment.

FIG. 42 is a flowchart showing the data writing method according to the present embodiment. First, a controller 25 sets all interconnects in a memory cell array to an unselected potential during the writing of data. Then, as shown, the controller 25 sets a global bit line address to a GBL decoder 23. In consequence, the GBL decoder 23 selects a global bit line GBL (step S20). Then, the GBL decoder 23 applies a writing-voltage Vw to the selected global bit line GBL_s (step S21). Moreover, the decoder applies Vw/2 to an unselected global bit line GBL_u.

Furthermore, the controller 25 sets a word line address to a WL decoder 22. In consequence, the WL decoder 22 selects a word line WI. (step S22). Then, the WL decoder 22 applies 0 V to the selected word line WL_s (step S23). Furthermore, the decoder applies Vw/2 to an unselected word line WL_u.

Moreover, the controller 25 converts writing-data as described in the third embodiment (step S24). That is, the controller 25 converts a data value d received from a host apparatus into a cell value c.

Then, the selector decoder 24 sets a selection gate line address (the sheet selector address) to a selector decoder 24. In consequence, the selector decoder 24 selects a selection gate line SSG (a selection element SS (step S25). This selection/non-selection is performed in accordance with the cell value obtained In the step S24. Then, the selector decoder 24 applies Vg_w to the selected selection gate line SSG for a predetermined pulse time (step S26). A potential of the unselected selection gate line SSG is set to 0 V. In this case, when Vg_w is applied to the selection gate line SSG, the corresponding selection element SS is turned on. Therefore, a potential difference Vw is applied to a variable resistance material 4 of the selected memory cell, and the data is written in the cell. It is to be noted that a state where a high potential is applied to two selection gate lines SSG_s and SSG_n is preferably utilized to impart a sufficient current supply ability to the selection element SS and to prevent wrong writing in the unselected cell.

The controller 25 successively performs the data writing of the above steps S25 and S26 in the memory cells MC connected to the selected word lines WL (a selected word line group WLcomb) (step S27). Moreover, when the writing in all the memory cells MC connected to the selected word line group WLcomb is completed (the step S27, YES), the controller 25 selects another word line group WLcomb (step S28), to write the data in the same manner (the steps S22 to S27). In this case, not only the word line group WLcomb which is present in the same layer but also the word line group WLcomb which is present in a different layer may be selected. However, even when the selected word line group WLcomb changes, the selected global bit line GBL does not change.

When the writing through the predetermined word line group WLcomb in accordance with the selected global bit line GBL is completed (the step S26, YES), the controller 25 verifies that the data has correctly been written (step S29), to end the writing operation.

It is to be noted that another global bit line GBL nay be selected to perform the writing after the step S29 or before the step S29 (after the step S28). That is, the controller nay return to the step S20 after the step S28 or S29.

2. Re: Specific Example

Figure 43:
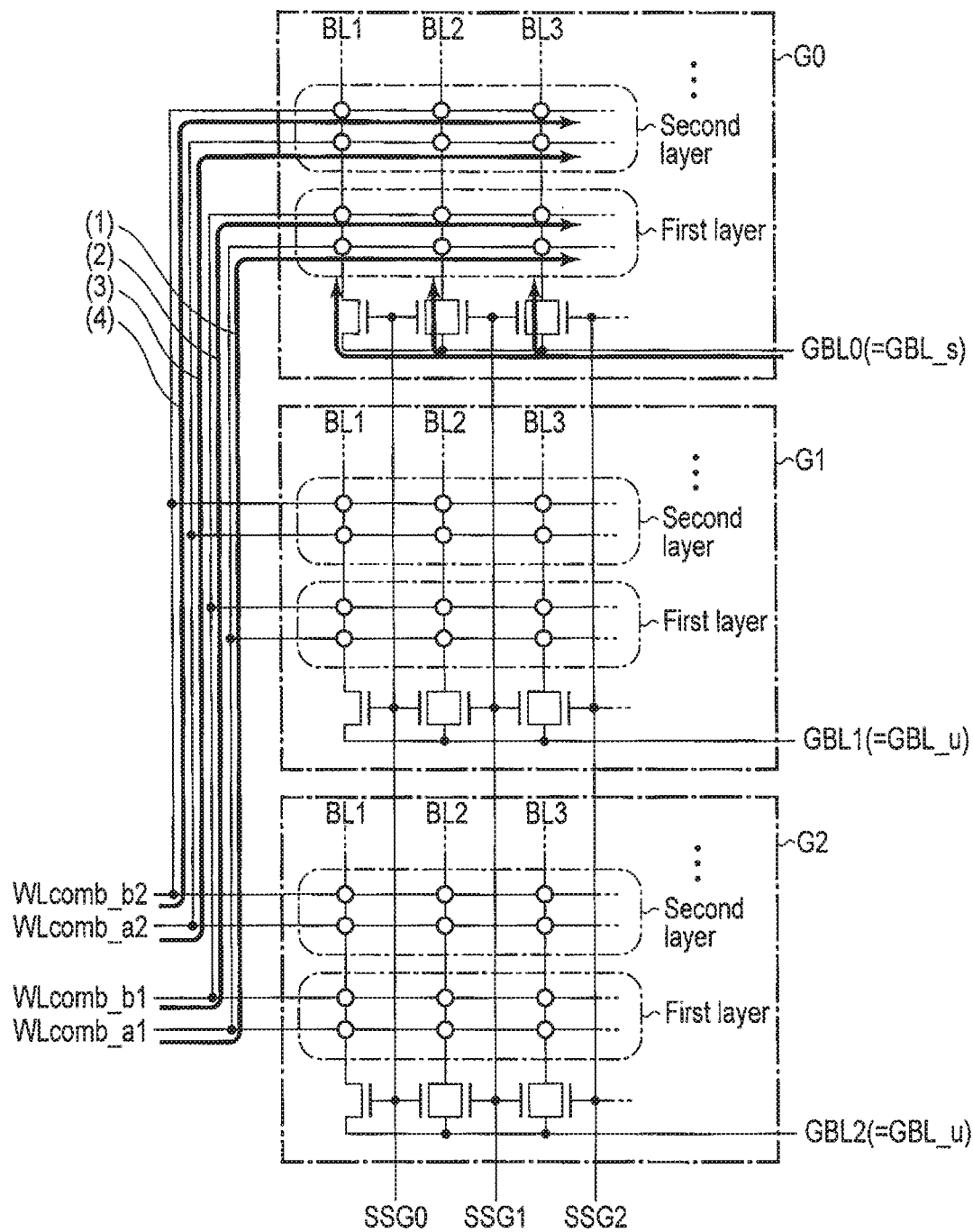
FIG. 43 is a circuit diagram of a memory cell array according to the fourth embodiment.

A specific example of the above writing method described with reference to FIG. 42 will be described. FIG. 43 is a circuit diagram of a memory cell array. In the diagram, G0, G1 and G2 are memory cell MC groups arranged in the plane formed in the first direction and third direction of FIG. 1. In other words, the memory cell groups can be selected in accordance with one global bit line GBL. Therefore, the number of the groups G0, G1, G2 and the like included in the memory cell array is equal to the number of the global bit lines GBL.

As shown, a global bit line GBL0 is first selected. In this state, word line groups WLcomb_a1, WLcomb_b1, WLcomb_a2 and WLcomb_b2 are successively selected. In the diagram, (1) to (4) indicate that the word line groups WLcomb are not simultaneously selected, but are successively selected. Every time each word line group WLcomb is selected, the selection gate line SSG is selected in accordance with a cell value, thereby writing the cell value c in the memory cell MC.

Behaviors for writing the data in the memory cell MC are shown in FIG. 44 and FIG. 45. FIG. 44 and FIG. 45 are plan views of the memory cell array, respectively, and show a structure in the plane formed in the first direction and the second direction.

FIG. 44 shows the behavior in a case where the word line group WLcomb_a1 is selected. As shown, the selection gate lines SSG are successively selected in accordance with the cell value in a state where the global bit line GBL0 is selected and the word line group WLcomb_a1 is selected. FIG. 45 shows the behavior in a case where the word line group WLcomb_b1 is selected. Upon completion of the writing shown In FIG. 44, the word line group WLcomb_b1 is next selected. Further in this state, the selection gate lines SSG are successively selected in accordance with the cell value.

Afterward, the word line groups WLcomb of a second layer and upper layers are similarly selected, and the data is written in the memory cells MC connected to the groups. Also in this case, the global bit line GBL0 remains to be selected.

Figure 46:
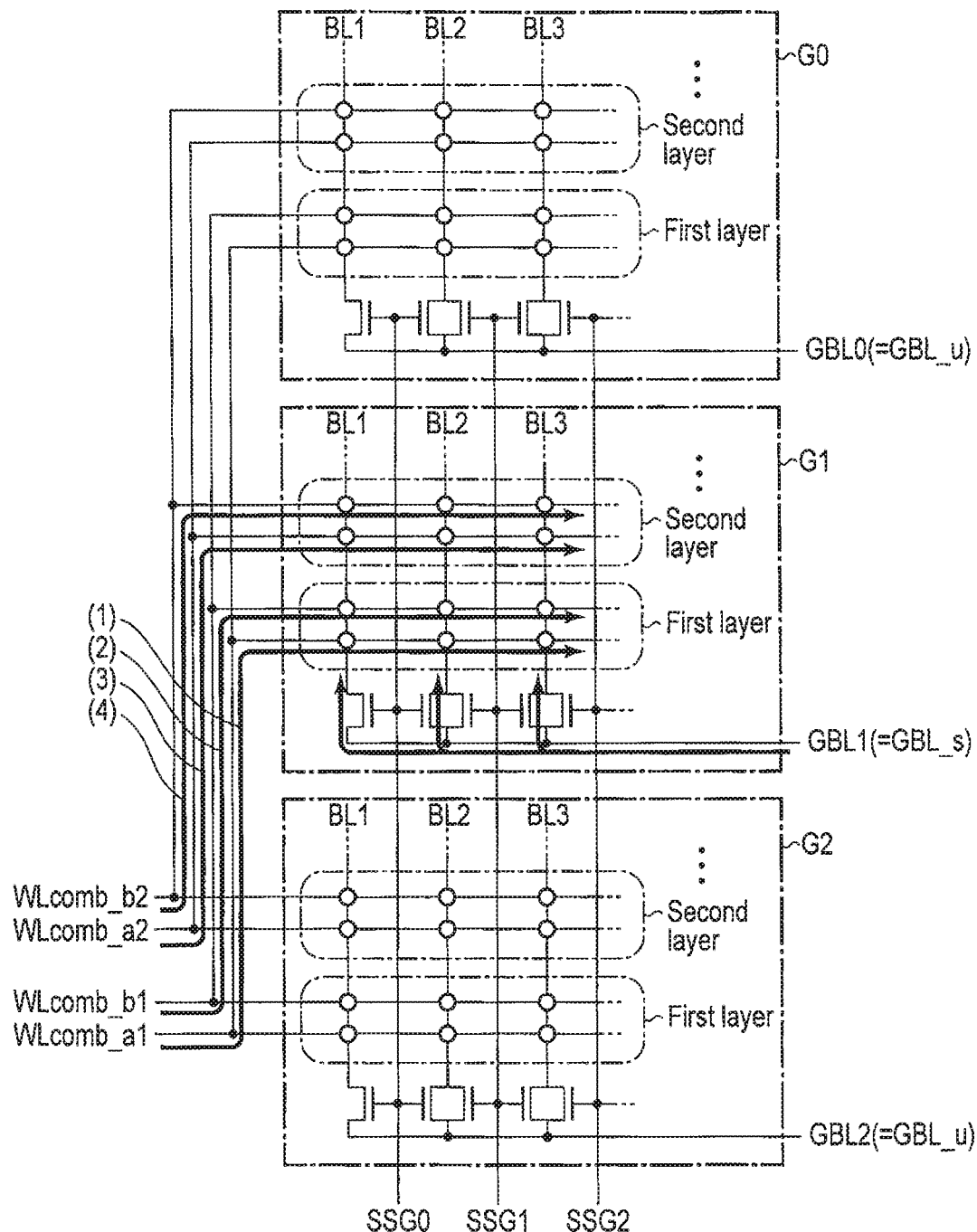
FIG. 46 is a circuit diagram of the memory cell array according to the fourth embodiment.

When the writing of the data in the predetermined memory cell MC in the group G0 is completed, the data is next written in the predetermined memory cell MC of the group G1. This behavior is shown in FIG. 46. FIG. 46 is a circuit diagram in the same manner as in FIG. 43.

As shown, a global bit line GBL1 is first selected. In this state, the word line groups WLcomb_a1, WLcomb_b1, WLcomb_a2 and WLcomb_b2 are successively selected. Then, every time the word line group WLcomb is selected, the selection gate line SSG is selected in accordance with the cell value, thereby writing the cell value c in the memory cell MC, as described with reference to FIG. 43 to FIG. 45.

In consequence, the global bit line GBL, the word line group WLcomb and the selection gate line SSG need to be selected, to select the memory cell MC. In this case, the global bit line GBL is finally selected in the present embodiment.

3. Effect of the Present Embodiment

According to the present embodiment, a writing operation can be speeded up. Hereinafter, the present effect will be described.

The global bit line is disposed to extend through the overall area of the chip (or a half area, ¼ area, or block area) over a large number of memory cell arrays. Additionally, the global bit line has a substantially minimum dimension, to enhance a chip integration degree. Therefore, the global bit line becomes an interconnect having a length of several millimeters or larger, and a line width and an adjacent space of several tens of nanometers or smaller. Therefore, a product of a parasitic capacity and an interconnect resistance becomes approximately several hundreds of nanoseconds (e.g., when an interconnect length is 3.2 mm, an interconnect width and an adjacent space are 24 nm and a sheet resistance is 1.5Ω/□, an interconnect capacity becomes up to 1.6 pF and an interconnect resistance becomes up to 200 kΩ. Therefore, a CR product becomes up to 320 nsec).

On the other hand, local or sub-local (within several hundreds of micrometers at the highest) interconnects are used in the word line group and the selection gate line. Therefore, the product of the interconnect resistance and the parasitic capacity becomes about hundred nsec or smaller, and becomes a fraction of the global bit line or smaller.

Therefore, a time required to stabilize the potential when the potential of the global bit line is changed is considerably longer than a time required to stabilize the potential when the potential of the word line or the selection gate line is changed.

When a certain global bit line GBL is selected by the method of the present embodiment under such a situation, the word line group WLcomb and the selection gate line SSG are selected to successively select all the required memory cells while maintaining the state where the global bit line GBL is selected. Then, the next global bit line GBL is selected after selecting all the memory cells MC which are connected to the global bit line GBL and in which it is necessary to write the data. That is, the number of times to change the potential of the global bit line GBL set to be smaller than the number of times to change the potential of the word line group WLcomb and the selection gate line SSG as much as possible. Therefore, a waiting time to stabilize the potential of the interconnect can be saved, and the writing operation can be speeded up.

Figure 47:
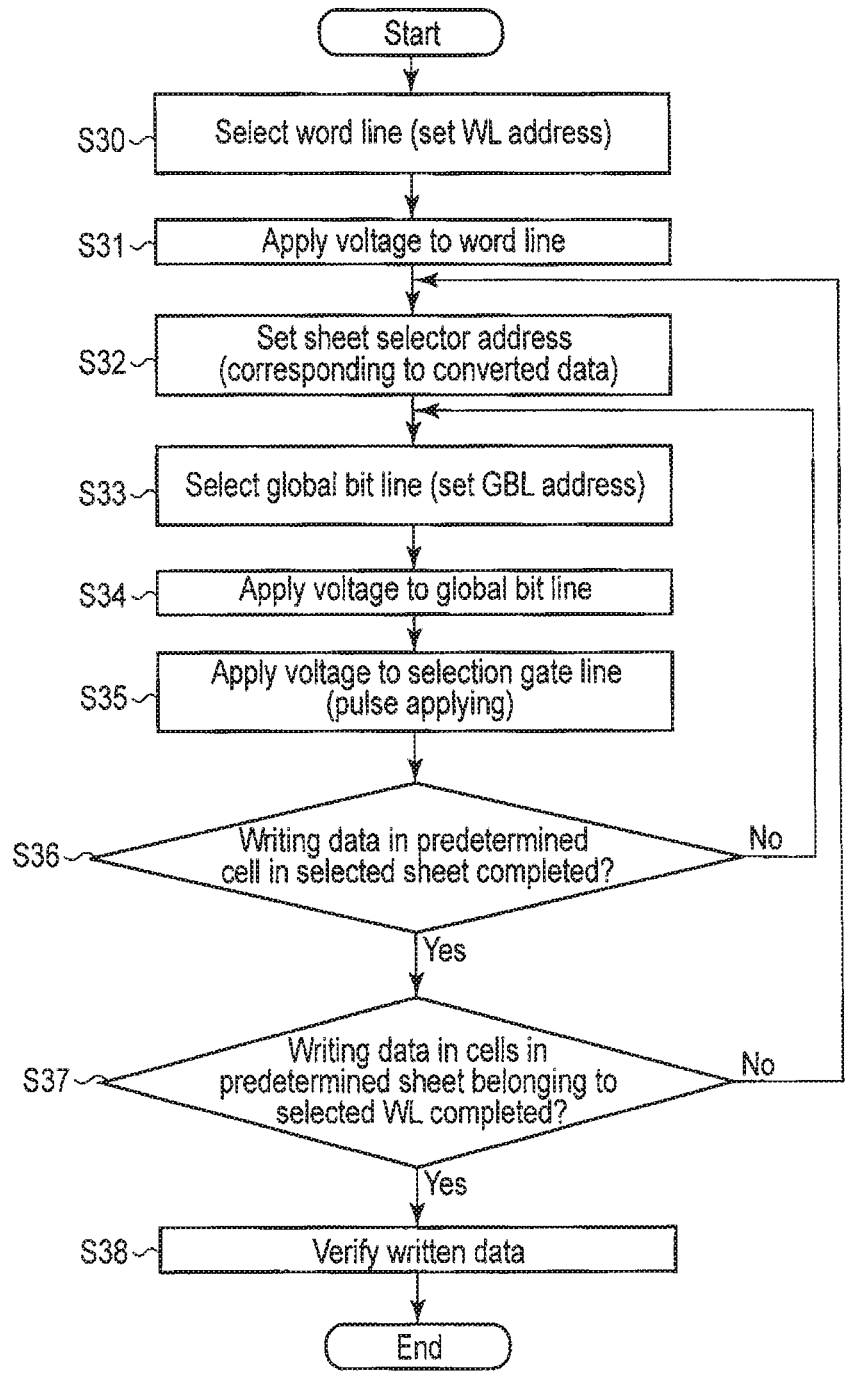
FIG. 47 is a flowchart showing a data writing method according to a comparative example.

Hereinafter, a comparative example will specifically be described. FIG. 47 is a flowchart of a writing operation in the comparative example. As shown, a word line is first selected, and a voltage is applied in the comparative example (steps S30 and S31). Next, an address of a selection gate line is selected (step S32). Next, a global bit line is selected, and a voltage is applied (steps S33 and S34). Next, a voltage corresponding to a writing pulse time is applied to the selection gate line (step S35). Then, the address and voltage or the selected word line and the address of the selection gate line SSG are not changed, but the global bit lines are successively selected, whereby a pulse voltage is applied to the selection gate line (step S36). After all the required global bit lines are selected (the step S36, YES), another sheet is selected next (step S37, NO, S32). Then, the data is written in the selected sheet, while successively selecting the global bit lines (the steps S33 to S36). Upon completion of the writing of the data in the predetermined sheet (the step S37, YES), the writing data is verified. Moreover, another word line is selected if necessary, to repeat the steps S31 to S37.

To simplify the description of such a comparative example, there is considered a case where details of a data structure are ignored and the data is written in all the memory cells of one memory cell array. Then, when the method of comparative example is used, a time required to write the data in all the memory cells is substantially represented by the following equation.

NW(NS(NG(tG+tP)+tS)+tW), where NG is the number of the global bit lines in the memory cell array, NS is the number of the selection gate lines, NW is the number of word line groups (=the number of layers of word lines×2), tG, tS and tW are times required to stabilize the potentials of the global bit line, the selection gate line and the word line group, respectively, and tP is a pulse applying time.

As described above, tG is longest among tG, tS and tK. Moreover, in the method of the comparative example, at least a time which is (Nw×NS×NG) times as long as tG is required, and a very long time is required to write the data.

On the other hand, in the method of the present embodiment, a time required to write the data in all the memory cells is substantially represented by the following equation.

NG(NW(NS(tS+tP)+tW)+tG).

That is, a coefficient of tG with the longest time to stabilize the potential is NG only. Therefore, it is possible to noticeably shorten the time as compared with the comparative example.

More specifically, when a required time is estimated with NG=72, NS=16, NW=32, tG=300 nsec, tS=100 nsec, tW=100 nsec and tP=50 nsec, about 13.0 msec is required in the comparative example, whereas in the present embodiment, about 5.8 msec is required and the time becomes half or shorter.

4. Modification Example of the Present Embodiment

Figure 48:
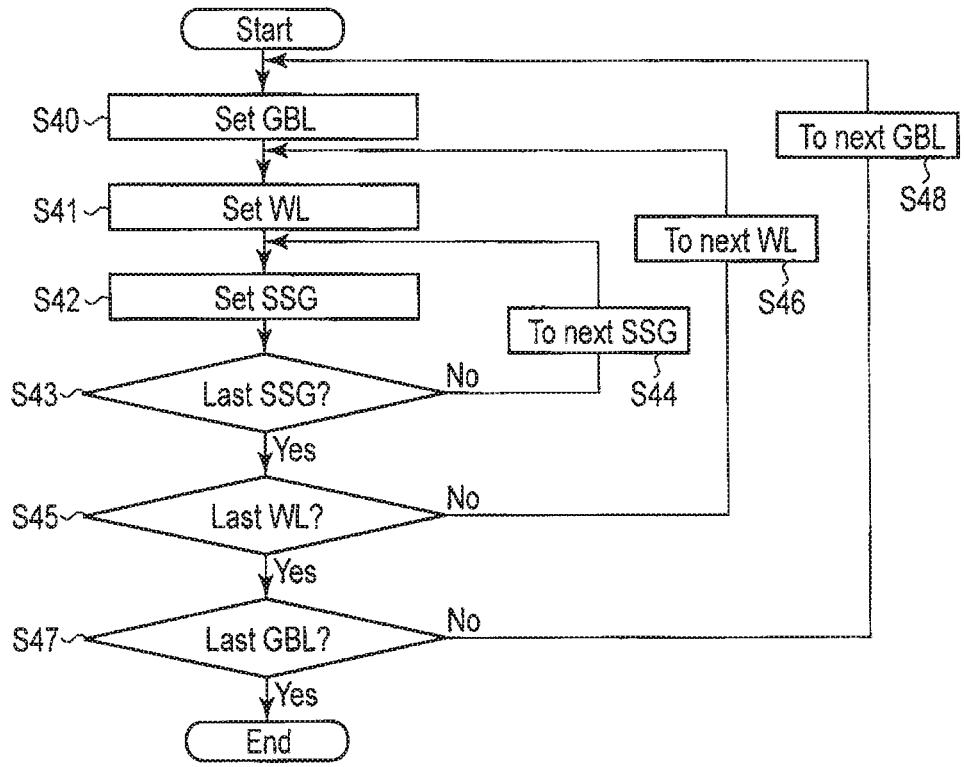
FIG. 48 to FIG. 51 are flowcharts showing a data writing method according to the fourth embodiment.

Hereinafter, a modification example of the present embodiment will be described. FIG. 48 simplifies the flowchart described with reference to FIG. 42. As shown, interconnects to which a voltage is to be applied include three types, i.e., global bit lines GBL, word lines WL, and selection gate lines SSG. Then, these three types of interconnect groups are successively selected, respectively. Here, in the method of the present embodiment, loop processing (steps S40, S47 and S48) concerning the global bit lines GBL is positioned on the outermost side, loop processing (steps S41, S45 and S46) concerning the word lines WL is positioned on the inner side, and loop processing (steps S42, S43 and S44) concerning the selection gate lines SSG is positioned on the inner side. Therefore, the potential of the selection gate line SSG is most frequently changed, and the change frequency of the potential of the global bit line GBL is lowest.

Figure 49:
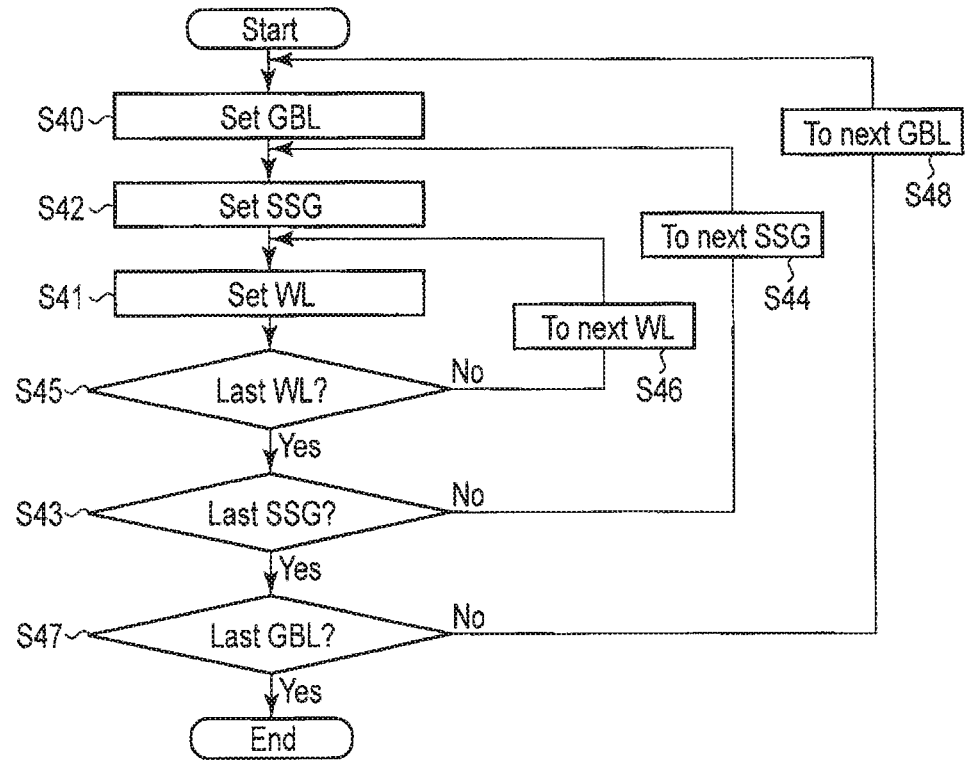

However, a flowchart shown in FIG. 49 may be used. That is, the loop processing concerning the word lines WL may be positioned on the inner side of the loop processing concerning the selection gate lines. Also in this case, the change frequency of the potential of the global bit line GBL is lowest.

Figure 50:
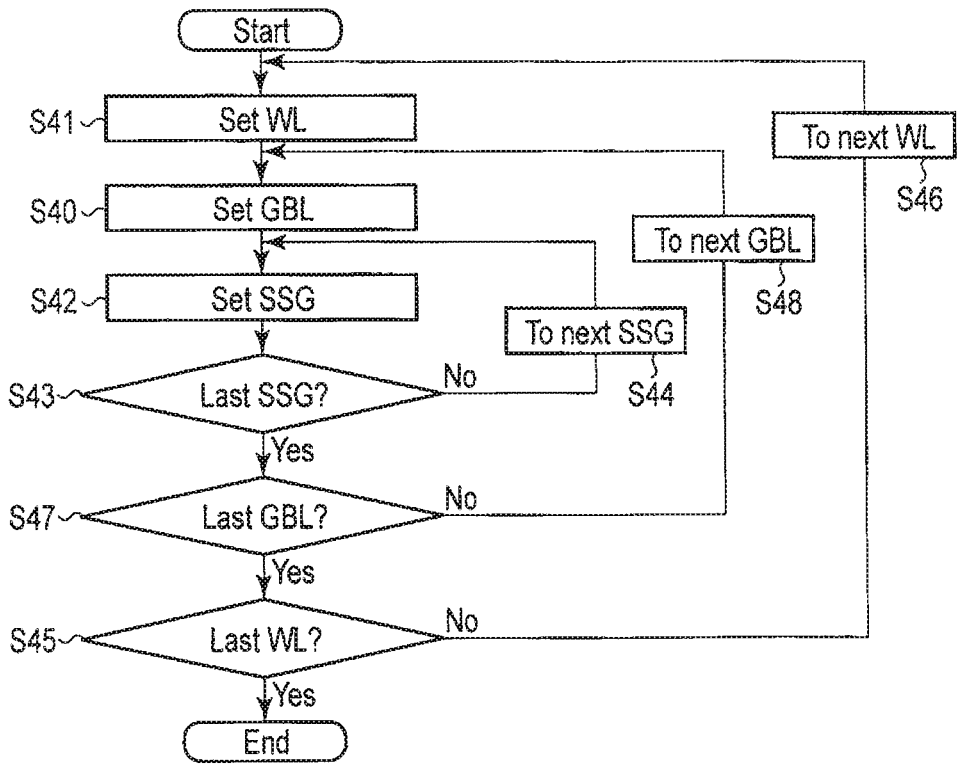
Figure 51:
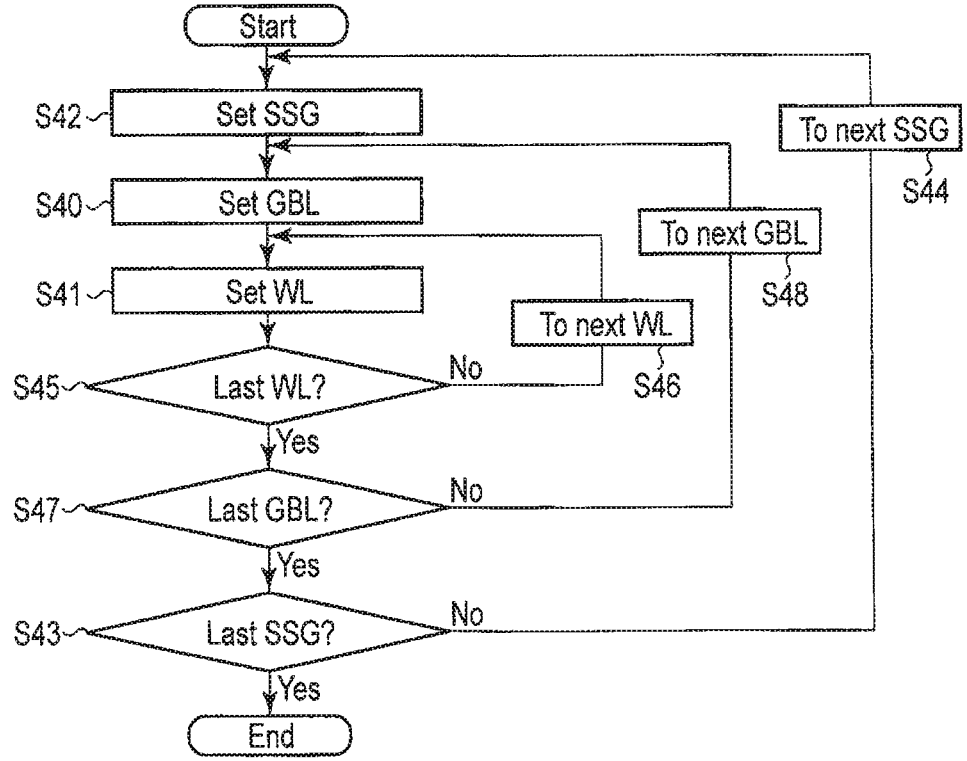

Moreover, the loop processing concerning the global bit lines GBL is not necessarily positioned on the outermost side. FIG. 50 and FIG. 51 show flowcharts in such a case. In a method shown in FIG. 50, the loop processing concerning the word lines WL is positioned on the outermost side, the loop processing concerning the global bit lines GBL is positioned on the inner side, and the loop processing concerning the selection gate lines SSG is positioned on the inner side. In FIG. 51, the loop processing concerning the word lines WL and the loop processing concerning the selection gate lines SSG of FIG. 50 are replaced. Also in such a method, a writing time can be shortened as compared with a case where the loop processing concerning the global bit lines GBL is the innermost loop.

Moreover, in the above embodiment, there has been described an example where the data writing and reading methods described in the third embodiment are applied. That is, data conversion is performed in the step S24. However, the method described in the first embodiment may be applied in place of the method described in the third embodiment. In this case, the step S24 is not required.

Fifth Embodiment

Next, a memory device according to a fifth embodiment will be described. The present embodiment relates to data mapping for performing the writing and reading of data by a page unit in the ReRAM described in the above third embodiment.

1. Re: Mapping of Data

Figure 52:
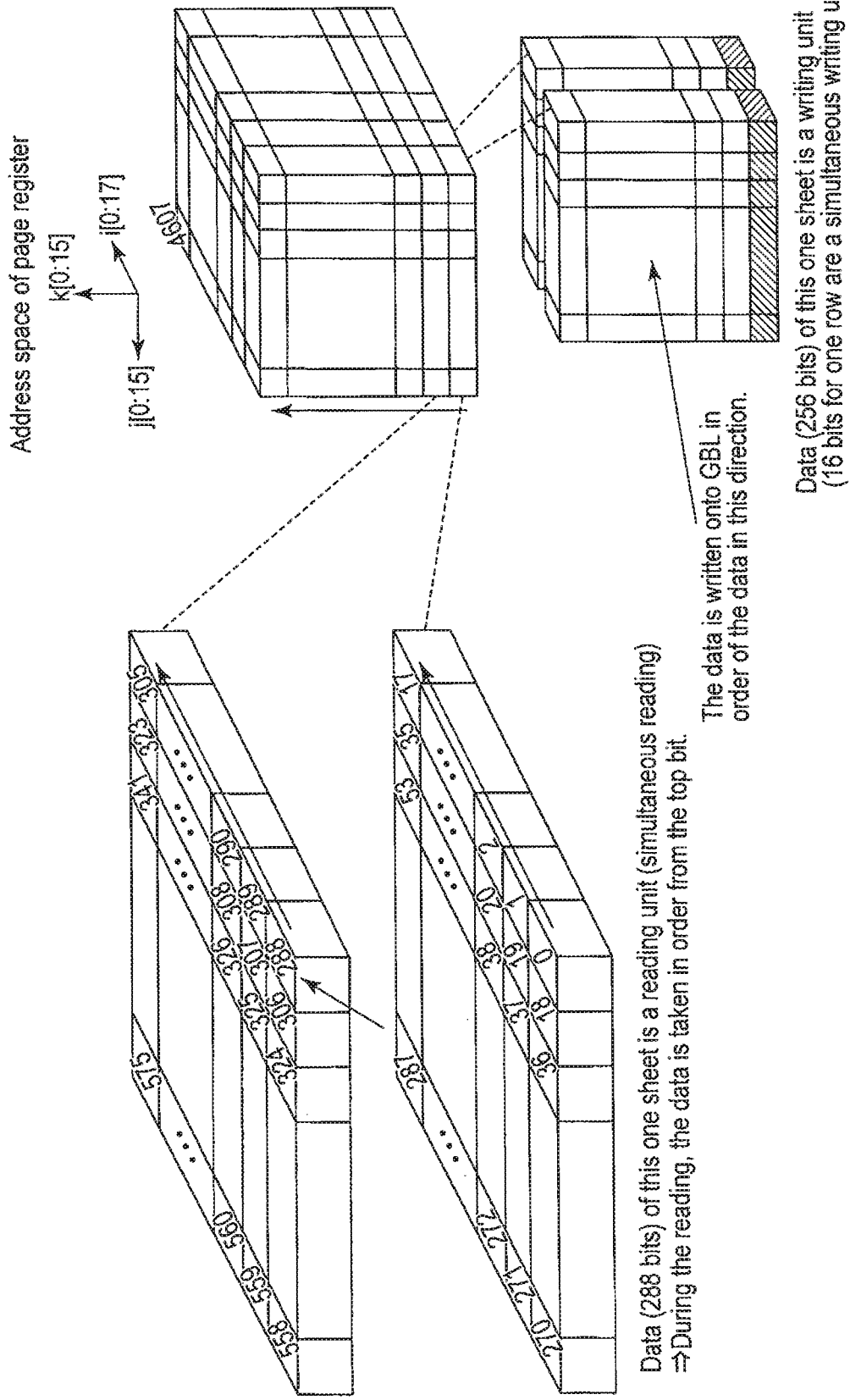
FIG. 52 is a schematic diagram of an address space of a page register according to a fifth embodiment.

FIG. 52 is a schematic diagram of an address space of a page register in the ReRAM according to the present embodiment, and shows a data structure of each page. As shown, the data of one page is formed by, for example, (512+64) bytes=4608 bits including bits for ECC (ECC data of 64 bytes), and one bit is specified by using three indexes i, j and k. That is, the data of 4608 bits starts with (i, j, k)=(0, 0, 0) in order from the top thereof, and is specified in order of (1, 0, 0), (2, 0, 0), . . . , (17, 0, 0), (0, 1, 0), (1, 1, 0), . . . , (17, 1, 0), (0, 2, 0), (1, 2, 0), . . . , (17, 15, 0), (0, 0, 1), (1, 0, 1), . . . , (17, 15, 15). That is, i[0:17], j[0:15] and k[0:15] are increased one by one in order, and the corresponding bit value is stored. It is to be noted that needless to say, the variables i, j and k for use in the present description different from variables which are the variables i and j used in the description of the first embodiment with reference to FIG. 5 and the variable k used in the description of the third embodiment with reference to FIG. 33.

FIG. 53 is a schematic diagram of the memory cell array according to the present embodiment, and shows correspondence between the data of each page and actual memory cells. As shown, the memory cell array includes blocks. Each block includes one word line group. Further in the example of FIG. 53, one block includes 64 global bit lines GBL, and thus each word line has a length for 64 cells. Each word line group in each block includes eight word lines WL, and thus a group of selection gate lines SSG include 16 lines, which is twice the number of the word lines WL. Moreover, the number of the layers of the word lines WL is 16 layers. Moreover, the memory cell array is formed by arranging longitudinal 4096 blocks×lateral 4608 blocks.

There will be described an example where the data of one page described with reference to FIG. 52 is mapped on this memory cell array. Moreover, in the following example, there will be described a case where the number of simultaneously accessible blocks is 16 during writing and 288 during reading.

First, the blocks which are present in the same row of the memory cell array are selected (called a selected blocks row). Specifically, the blocks are selected by using a global word line. The global word line is an interconnect connected in common to gates of MOSFETs which become drivers of word line groups WLcomb_a and WLcomb_b of the blocks present in the same row. The selected blocks row includes 4608 blocks as described above. The 4608 blocks are divided into 16 groups each including 238 blocks. The number of the blocks included in each group is the number of the simultaneously accessible blocks (288 blocks in the present example) during the reading. Furthermore, 288 blocks included in each group are divided into 18 columns each including 16 blocks. The number of the blocks included in each column is the number of the simultaneously accessible blocks (16 blocks in the present example) during the writing.

The data of one page is mapped in a bit group specified by a selected column [0:17], a selected block [0:15] and a selected sheet selector (the selection gate line) [0:15], in a region specified by the selected blocks row [0:4095], a selected group [0:15], a selected global bit line [0:63] and a selected word line [0:31] (because in each block, the number of the word line groups WLcomb is two, and the layer number of the word lines WL is 16 layers) in the memory cell array. In this case, a selected column address corresponds to the page data index i, a selected block address corresponds to the page data index j, and a selected gate line address corresponds to the page data index k.

Figure 54:
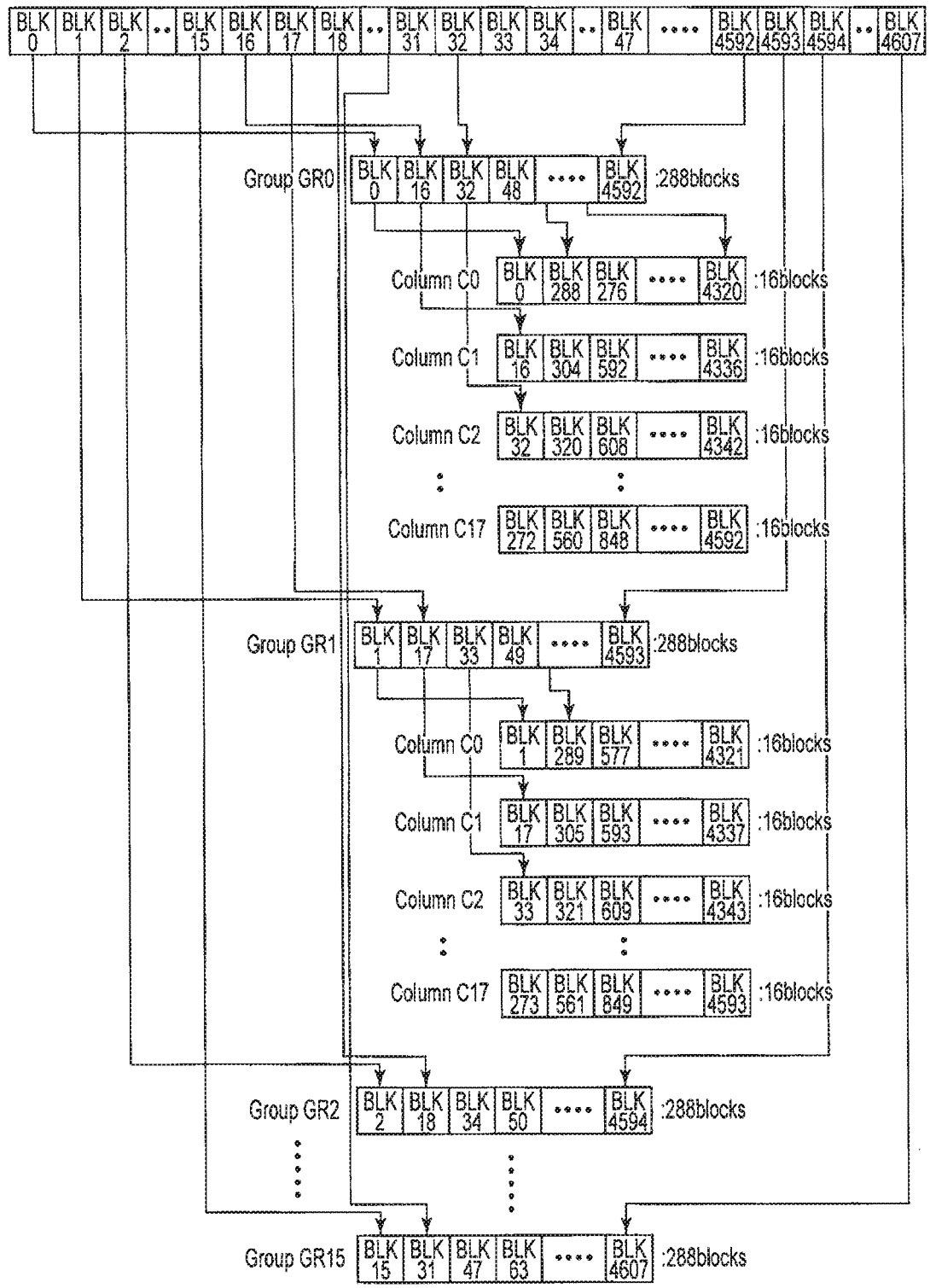

The above groups and columns will specifically be described with reference to FIG. 54. FIG. 54 is a schematic diagram showing 4608 blocks BLK0 to BLK4607 belonging to one of the selected blocks rows and the assigning thereof to these groups and columns.

As shown, a group number is 16 groups. Then, blocks BLK(16h*g)(h=0 to 287) are assigned to a group GRg (g=0 to 15). Therefore, 288 blocks BLK0, BLK16, BLK32, . . . BLK4592 belong to the group GR0. 288 blocks BLK1, BLK17, BLK33, . . . BLK4593 belong to the group GR1. 288 blocks BLK2, BLK18, BLK34, . . . BLK4594 belong to the group GR2. Afterward, 288 blocks BLK15, BLK31, BLK47, . . . BLK4607 similarly belong to the final group GR15.

Then, the blocks are assigned to a column Cq (q=0 to 17) by a unit of 16 blocks in each group. Blocks BLK(283r+16q+g)(r=0 to 15) are assigned to the column Cq. Therefore, 16 blocks BLK0, BLK238, BLK576, . . . BLK4320 are assigned to the column C0 of the group GR0. 16 blocks BLK16, BLK304, BLK592, . . . BLK4336 are assigned to the column C1 of the group GR0. 16 blocks BLK32, BLK320, BLK608, . . . BLK4342 are assigned to the column C2 of the group GR0. Afterward, 16 blocks BLK272, BLK560, BLK848, . . . BLK4592 are similarly assigned to the final column C17 of the group GR0.

Moreover, 16 blocks BLK1, BLK289, BLK577, . . . BLK4321 are assigned to the column C0 of the group GR1. 16 blocks BLK17, BLK305, BLK593, . . . BLK4337 are assigned to the column C1 of the group GR1. 16 blocks BLK33, BLK321, BLK609, . . . BLK4343 are assigned to the column C2 of the group GR1. Afterward, 16 blocks BLK273, BLK561, BLK849, . . . BLK4593 are similarly assigned to the final column C17 of the group GR1.

The same applies to the other groups GR3 to GR15.

2. Writing Operation of Data

A data writing operation by using the above mapping will be described.

During the writing, the data of 16 bits belonging to a selection gate line in the selected column is simultaneously written. In this case, the data of one page is stored once in the page register (included in, e.g., the controller 25) in the chip, and the corresponding index is attached thereto. Afterward, the data is taken in the corresponding data order. i.e., each data for 16 bits of j[0:15] belonging to the same (i, k) is taken. Afterward, after the conversion of the data value and the cell value is performed, the data is written in the cells of 16 bits belonging to the same selection gate line. After the loop of the selected gate line, the loop processing of the selected column is performed, to end the writing of the data of one page.

Figure 55:
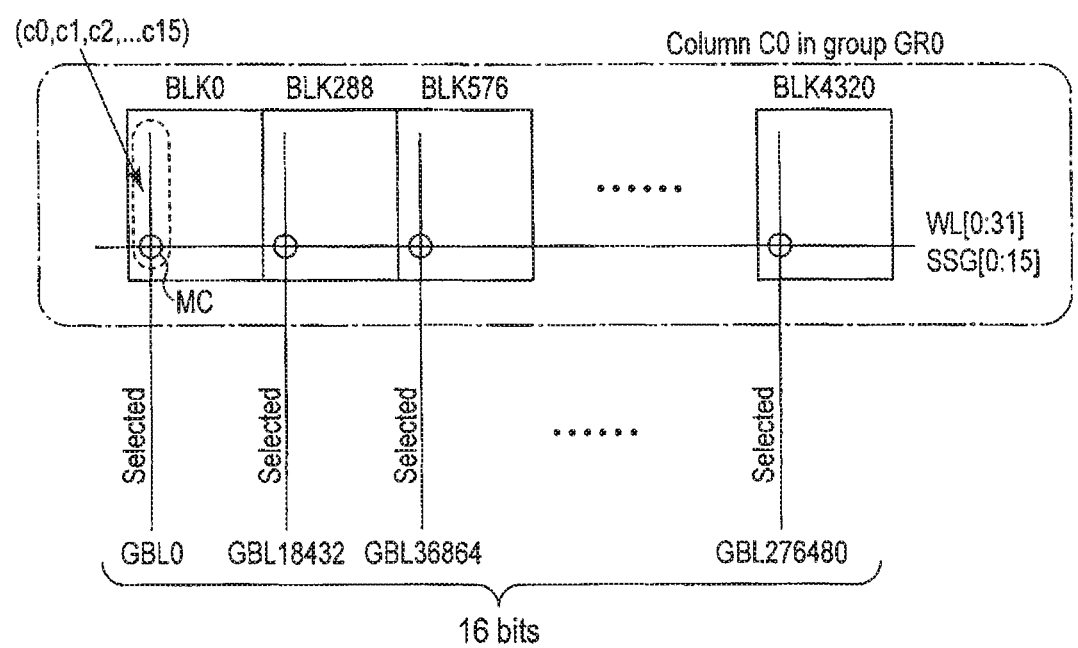

The behavior of the data writing is shown in FIG. 55. FIG. 55 shows the behavior in which the data is written in the column C0 of the group GR0. As shown, the global bit lines GBL0, GBL18432, . . . GBL276480 corresponding to 16 blocks BLK0, BLK288, . . . BLK4320 are selected. Moreover, one of 16 layers of the word lines WLcomb_a and WLcomb_b is selected. In each block BLK, the cell values c0 to C15 are written in the memory cell MC.

When the data of pages is written, a series of processing may be expanded, in order, to different selected word line loop, selected global bit line loop, selected group loop and selected blocks row loop.

3. Data Reading Operation

Next, the reading operation will be described. During the reading, the data of 288 bits belonging to the selection gate line SSG is simultaneously read, and the page data is successively read In a selected gate line address order. As described above, the page data corresponds to the selection gate line address, and configured in order of the index k. Therefore, when the loop of the selection gate line is repeated, the data of one page can be reconstructed in the original order.

When the pages of the data are read, the series of processing nay be expanded to different selected word line loop, selected global bit line loop, selected group loop and selected blocks row loop, in order, in the same manner as in the writing.

4. Effect of the Present Embodiment

When the data in one page is processed with different simultaneously parallel blocks during the writing and the reading and the cells successively selected by the innermost loop are arranged in a direction (along the GBL) different from a parallel block direction during the writing and the reading, the mapping as in the present embodiment is preferably performed. That is, the data can be taken in order from the top bit of the page data during the reading, and hence a reading latency can be shortened.

It is to be noted that as in the step S29 of FIG. 42, the data is read immediately after writing the data, and it may be verified that data contents match with the writing data. Moreover, when both the data contents do not match, the data nay be written again. In consequence, a reliability of a memory operation can be enhanced.

In this case, the above-mentioned data of one page is used as a unit. After writing each page of data, the same page is read. Then, a read result is stored in another page register, and values of both the page registers may be compared. Moreover, when a non-matched portion is present, the data is written again. After repeating this rewriting processing, the processing may advance to the processing of the next page (the selected word line loop, the selected global bit line loop, the selected group loop and the selected blocks row loop), if necessary.

Sixth Embodiment

Next, a memory device according to a sixth embodiment will be described. Unlike the above third embodiment, the present embodiment increases the number of word line groups WLcomb from two to three or more to suppress the occurrence of erroneous reading.

1. Re: Structure of Word Line WL

Figure 56:
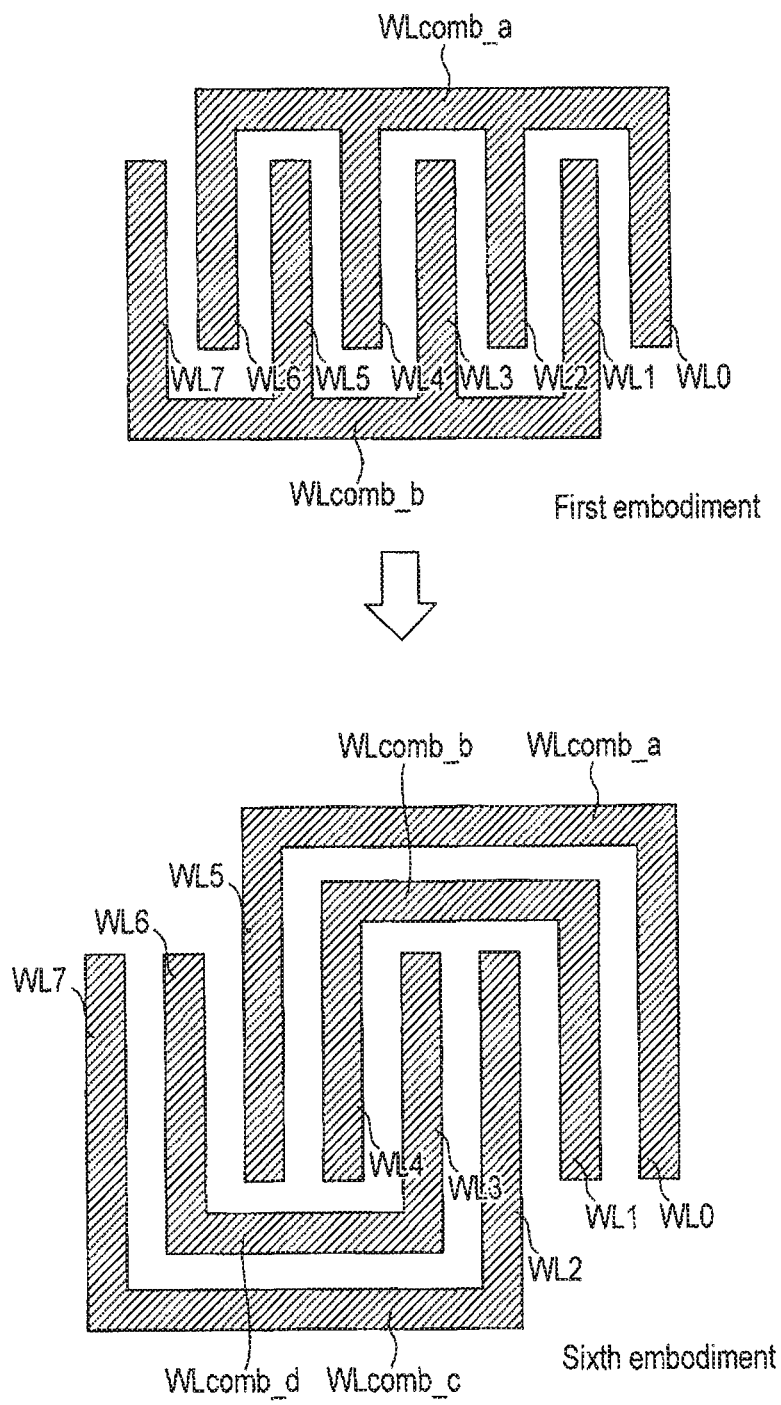
FIG. 56 is a schematic diagram showing a word line pattern according to a sixth embodiment.

FIG. 56 is a schematic diagram showing word lines WL according to the present embodiment in comparison with the first embodiment.

As shown, according to the structure described in the first embodiment, the word lines in a block belong to one of two word line groups WLcomb_a and WLcomb_b as shown in, for example, FIG. 3. Therefore, one of the word lines WL belonging to the word line group WLcomb_a is sandwiched between two of the word lines WL belonging to the word line group WLcomb_b.

On the other hand, according to the structure of the present embodiment, word lines in a block belongs to one of four word line groups WLcomb_a, WLcomb_b, WLcomb_c and WLcomb_d. Moreover, two word lines WL belonging to the same word line group WLcomb_a are disposed adjacent, to sandwich two word lines WL belonging to the other word line groups WLcomb_b and WLcomb_c, respectively. The same also applies to the word lines WL belonging to the word line group WLcomb_b, WLcomb_c and WLcomb_d. In other words, both sides of the word line belonging to the word line group WLcomb are sandwiched between the other word lines, two word lines which sandwich the word line belong to the word line groups WLcomb which are different from the word line group WLcomb to which the corresponding word line belongs and which are different from each other.

In an example of, for example, FIG. 56, eight word lines WL0 to WL7 are included in a block. Among these word lines, the word lines WL0 and WL5 are connected to each other in common, and these lines belong to the word line group WLcomb_a. The word lines WL1 and WL4 are connected to each other in common, and these lines belong to the word line group WLcomb_b. The word Lines WL2 and WL7 are connected to each other in common, and these lines belong to the word line group WLcomb_c. The word lines WL3 and WL6 are connected to each other in common, and these lines belong to the word line group WLcomb_d. That is, three adjacent word lines WL in the block belong to the mutually different word line groups WLcomb.

2. Re: Data Reading Method

Next, a data reading method will be described. Biases of interconnects during the data reading are similar to those of the third embodiment. Moreover, as to selected selection gate lines SSG, the selection gate lines SSG facing the selected memory cell MC in the first direction via the selected bit line BL are selected.

In other words, in two selection gate lines of a selection element SS connected to the selected bit line BL, the selection gate line SSG is unselected which forms a current path between a global bit line GBL and the memory cell MC disposed between the selected word line WL and the unselected bit line BL, and the selection gate line SSG is selected which forms a current path between the global bit line GBL and the memory cell MC disposed between the unselected word line WL and the unselected bit line BL.

FIG. 57 is a sectional view of a memory cell array, and shows a plane formed in a first direction and a third direction. In the example of FIG. 57, word lines WL0 and WL5 belong to a word line group WLcomb_a, word lines WL1 and WL4 belong to a word line group WLcomb_b, a word line WL2 belongs to a word line group WLcomb_c, and a word line WL3 belongs to a word line group WLcomb_d.

In the present example, data is read from a memory cell MC connected to the word line WL1 and a bit line BL1. Selection gate lines which form a channel in a selection element SS connected to the bit line BL1 are two selection gate lines SSG1 and SSG2. In these selection gate lines, the selection gate line SSG facing the selected memory cell in the first direction via the bit line BL1 is the selection gate line SSG2. That is, the current path is formed between the global bit line GBL and the memory cell disposed between the selected word line WL1 and an unselected bit line BL0, by the selection gate line SSG1, but the current path is not formed by the selection gate line SSG2. Therefore, a selector decoder 24 selects the selection gate line SSG2, applies, for example, a voltage Vg_r thereto, and applies 0 V to the other selection gate lines.

Consequently, a cell current flows through the selected word line WL1 from the global bit line GBL via a channel formed by the selection gate line SSG2, the bit line BL1 and the selected memory cell MC.

3. Re: Data Writing Method and Erasing Method

A data writing method is similar to the third embodiment except that data conversion is not required. That is, only one selection gate line SSG described in the above 2 may be selected. The same applies to an erasing time. Needless to say, two selection gate lines SSG may be selected in the same manner as in the first embodiment.

4. Effect of the Present Effect

Also according to the present embodiment, a data reading accuracy can be enhanced while suppressing interference with adjacent cells. Hereinafter, the present effect will be described in detail.

In the present example, three adjacent word lines belong to mutually different word line groups WLcomb. In other words, different word line drivers apply a voltage to these word lines.

When one selection gate line SSG is selected during the data reading, a current path is formed between two bit lines BL and the global bit line GBL. Moreover, these two bit lines BL are associated with three word lines WL. However, these three word lines WL belong to the mutually different word line groups WLcomb, and two of the lines are unselected. Therefore, any potential difference is not made in the current path formed for the unselected memory cell MC, and any current substantially does not flow through this current path. Moreover, the current substantially flows only through the current path formed for the selected memory cell MC.

This respect will be described again with reference to FIG. 57. When the selection gate line SSG2 is selected as in the example of FIG. 57, channels are formed in two selection elements SS1 and SS2 connected to two bit lines BL1 and BL2, respectively. Therefore, a current path reaching the global bit line GBL is formed not only for the selected memory cell MC connected to the selected word line WL1 and the bit line BL1 but also for an unselected memory cell MC connected to the unselected word line WL2 and the bit line BL1, an unselected memory cell MC connected to the unselected word line WL2 and the bit line BL2 and an unselected memory cell MC connected to an unselected word line WL3 and the bit line BL2. However, an unselected potential is applied to the two unselected word lines WL2 and WL3. Such bias relation is enabled because three adjacent word lines WL1 to WL3 belong to the mutually different word line groups WLcomb. In consequence, the unselected word lines WL2 and WL3 are set to the same potential as that of the selected global bit line GBL.

Consequently, a potential between both ends of each of the unselected memory cell MC connected to the unselected word line WL2 and the bit line BL1, the unselected memory cell MC connected to the unselected word line WL2 and the bit line BL2 and the unselected memory cell MC connected to the unselected word line WL3 and the bit line BL2 becomes the same potential, and any current flows through the current path for these memory cells. That is, the current path through which the current flows when the selection gate line SSG2 is selected is the only current path for the selected memory cell MC (the path reaching the selected word line WL1 from the selected global bit line GBL through the bit line BL1 and the memory cell MC).

Thus, according to the present example, it is not necessary to convert the data as in the third embodiment, and the reading current cars be detected without being influenced by the unselected memory cell MC adjacent to the selected memory cell MC.

5. Modification Example of the Present Embodiment

Hereinafter, a modification example of the present embodiment will be described. In the example of FIG. 56, the word lines WL in one block belong to four word line groups WLcomb_a to WLcomb_d. However, the word lines WL may belong to four or more word line groups WLcomb.

Figure 58:
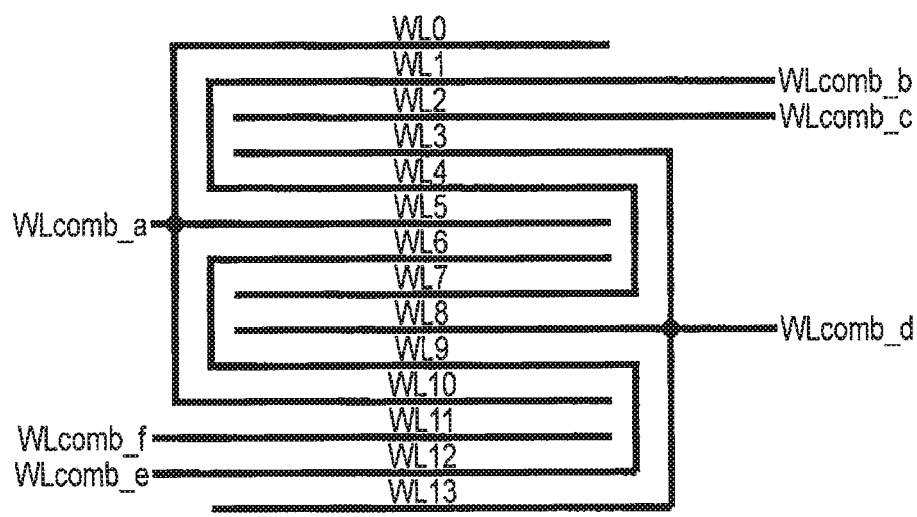
FIG. 58 to FIG. 60 are schematic diagrams showing the word line pattern according to the sixth embodiment.

FIG. 58 shows an example where word lines WL0 to WL13 belong to six word line groups WLcomb_a to WLcomb_f. More specifically, the word lines WL0, WL5 and WL10 belong to the first word line group WLcomb_a. The word lines WL1, WL4 and WL7 belong to the second word line group WLcomb_a. The word line WL2 belongs to the third word line group WLcomb_c. The word lines WL3, WL8 and WL13 belong to the fourth word line group WLcomb_d. The word lines WL6, WL9 and WL12 belong to the fifth word line group WLcomb_e. The word line WL11 belongs to the sixth word line group WLcomb_f. It is to be noted that the word lines WL2 and WL11 may belong to the same word line group WLcomb.

Figure 59:
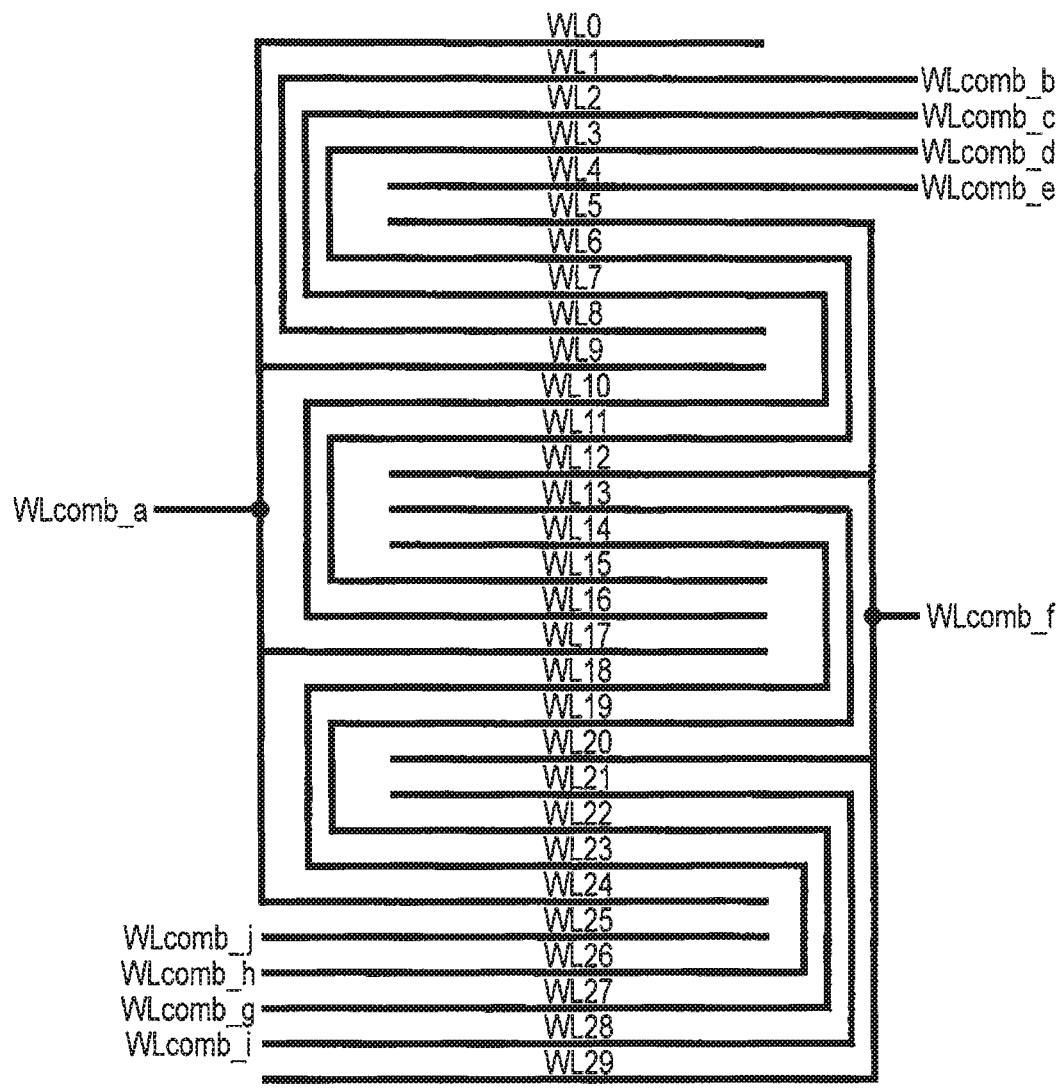
Figure 60:
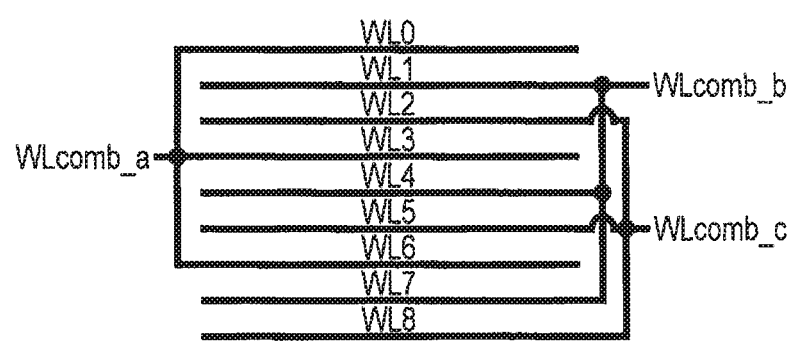

FIG. 59 shows an example where word lines WL0 to WL29 belong to ten word line groups WLcomb_a to WLcomb_j. Moreover, FIG. 60 shows an example where word lines WL0 to WL8 belong to three word line groups WLcomb_a to WLcomb_c.

A relation between the word line WL and the word line group WLcomb can appropriately be selected, and is not limited to the above examples, as long as three adjacent word lines belong to different word line groups WLcomb.

Seventh Embodiment

Next, a memory device according to a seventh embodiment will be described. The present embodiment is different from the above third and sixth embodiments in chat a position where a selection element SS is disposed is shifted to suppress the occurrence of erroneous reading.

1. Re: Structure of Selection Element SS

FIG. 61 is a perspective view of a memory cell array according to the present embodiment, and FIG. 62 is an enlarged sectional view of a connecting portion between the selection element SS and a bit line BL.

As shown, in a structure of the present embodiment, the position of the selection element SS is shifted in a first direction from the structure of FIG. 1 described in the first embodiment. More specifically, a drain region 7 of the selection element SS is formed Immediately under each bit line BL. Moreover, a channel region 6 is formed to come in contact with the drain region 7 immediately under two bit lines BL adjacent in the first direction. A source region 5 is formed immediately under the channel region 6. Moreover, a selection gate line SSG is formed right under the drain region 7 while gate insulating film 9 is interposed.

FIG. 63 is an equivalent sectional view of the one selection element SS according to the present embodiment. As shown, it can be considered that the one selection element SS functions as two MOS transistors TR1 and TR2 connected in parallel, and the two MOS transistors are connected to selection gate lines SSG having different gates and further connected to bit lines BL having different drains.

FIG. 64 is an equivalent circuit diagram of the memory cell array according to the present embodiment. As shown, according to the present example, one bit line BL is connected to two MOS transistors TR1 and TR2. The two MOS transistors TR1 and TR2 are transistors included in mutually different selection elements SS, and gates thereof are connected to the same selection gate line SSG. In other words, the MOS transistors TR1 and TR2 connected to two adjacent bit lines BL do not share the selection gate line SSG. Therefore, when one of the selection gate lines SSG is selected during the reading, the corresponding one bit line BL is only connected to the global bit line GBL.

2. Re: Data Reading Method

Next, the data reading method will be described. Biases of interconnects during the data reading are similar to those of the third embodiment. Moreover, the selection gate line SSG immediately under the selected bit line BL is selected. In other words, the selection gate line SSG connected to a gate shared by transistors TR1 and TR2 connected to the selected bit line BL is selected.

Figure 65:
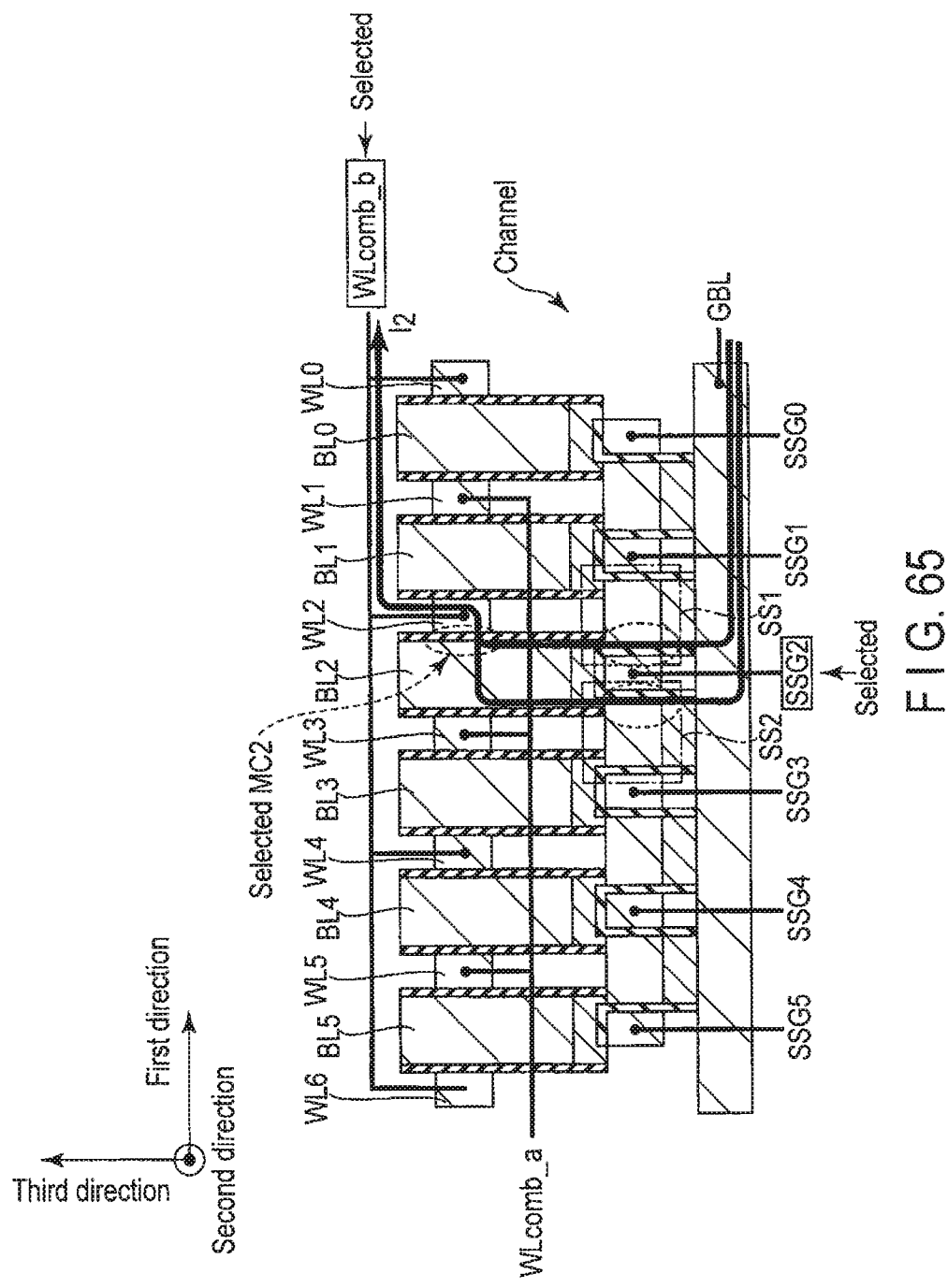

FIG. 65 is a sectional view of a memory cell array, and shows a plane formed in a first direction and a third direction. In an example of FIG. 65, word lines WL1, WL3 and WL5 belong to a word line group WLcomb_a, and word lines WL0, WL2, WL4 and WL6 belong to a word line group WLcomb_b.

In the present example, data is read from a memory cell MC2 connected to the word line WL2 and a bit line BL2. Therefore, a selector decoder 24 selects a selection gate line SSG2 positioned immediately under the bit line BL2, applies, for example, a voltage Vg_r, and applies 0 V to the other selection gate lines.

In consequence, a cell current flows through the selected word line WL2 from a global bit line GBL via a channel formed by the selection gate line SSG2, a bit line BL1 and the selected memory cell MC.

3. Re: Data Writing Method and Erasing Method

A data writing method is similar to the third embodiment except that data conversion is not required. That is, only one selection gate line SSG described in the above 2 may be selected. The same also applies to an erasing time.

4. Effect of the Present Embodiment

Also according to the present embodiment, interference with adjacent cells can be suppressed, and a data reading accuracy can be enhanced. Hereinafter, the present effect will be described in detail.

In the present example, one selection gate line SSG corresponds to one bit line BL (one column of bit line BL disposed in a second direction). Therefore, a current path is not formed between the global bit line GBL and another bit line BL (another bit line row disposed in the second direction) corresponding to the unselected selection gate line SSG.

In, for example, the example of FIG. 65, the only bit line BL2 corresponding to the selection gate line SSG2 (the bit lines BL2 arranged along the second direction) is connected to the global bit line GBL. This is because when one of the selection gate lines SSG is selected, the channel is not necessarily formed in the whole region of the corresponding silicon layer 6. In practice, the channel is formed only in a region of several nanometers in the vicinity of the selection gate line SSG to which the potential is applied.

Therefore, a relation of con1>con2>con3 is obtained. For example, con1 is a current flowing through the channel formed by the selected selection gate line SSG2. Moreover, con2 is a leak current which is influenced by the potential of the selection gate line SSG2 to flow into the global bit line GBL from a bit line BL3 through the silicon layer 6 between the selection gate line SSG2 and a selection gate line SSG3. Furthermore, con3 is a leak current flowing through the silicon layer 6 between the unselected selection gate lines.

Figure 66:
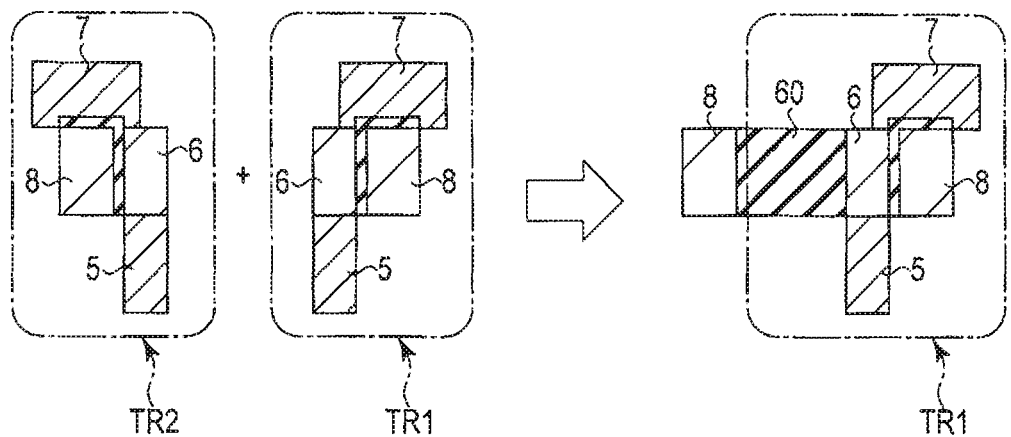
FIG. 66 and FIG. 67 are schematic diagrams of a selection element according to the seventh embodiment.

Thus, the current con1 flowing through the selected bit line BL2 becomes largest, and hence the influence of the adjacent cell can be suppressed. Moreover, the leak current con2 can be as low as the leak current con3, depending on an element size. FIG. 66 is a schematic diagram of the selection element SS of the present embodiment. As shown on the left side of the diagram, the selection element SS of the present example includes two MOS transistors connected in parallel. However, it can be considered that when the silicon layer 6 has a width of 10 nm or more, the unselected-side MOS transistor (the transistor TR1 in the example of FIG. 66) has a state where a channel charge is induced by the selection gate line (the left SSG in the example of FIG. 66) through a thick dielectric film 60 made of depleted silicon. Therefore, only remarkably little charge is induced in the channel of the unselected-side MOS transistor in this state on the basis of a well-known MOSFET operation principle, and hence the leak current con2 can remarkably be lowered. A data reading accuracy can further be enhanced.

It is to be noted that when the present embodiment is considered to have a structure where the position of the selection element SS of the first embodiment is shifted along the first direction to connect the drain region 7 to two bit lines BL, the one selection element SS is formed by two transistors TR1 and TR2 connected to two selection gate lines having different gates, as shown in FIG. 64. However, it can be considered that the selection element SS according to the present embodiment is a set of two transistors TR1 and TR2 in which the gates are connected to the same selection gate line SSG and drains are connected to the same bit line BL in FIG. 64.

5. Modification Example of the Present Embodiment

Figure 67:
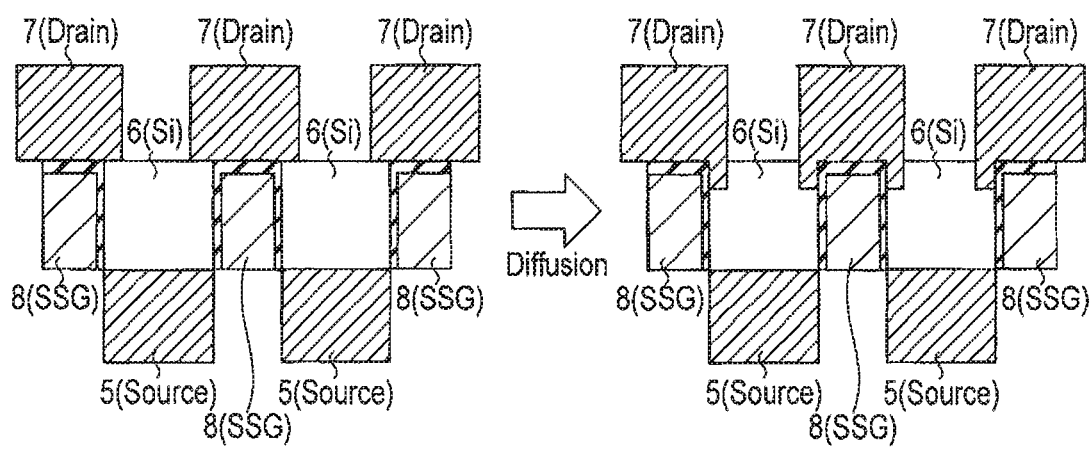

FIG. 67 is a sectional view of the selection element SS according to a modification example of the present embodiment. As shown, part of the drain region 7 may enter the silicon layer 6. The present structure is obtained, for example, when impurities in the drain region 7 are diffused in the silicon layer 6 in annealing process for activating the impurities in the drain region 7 or another step. In the present structure, a portion of the drain region 7 which faces the source region 5 is positioned lower than the upper surface of the silicon layer 6, or lower than the upper surface of the selection gate line SSG.

Moreover, in the structure according to the present embodiment, the selection gate line SSG is formed immediately under the bit line BL, and two portions of the drain region 7 come in contact with the silicon layer 6. Therefore, a line width of the bit line BL (or the drain region 7) along the first direction is larger than a line width of the selection gate line SSG along the first direction. In this case, the line width of the bit line BL (or the drain region 7) along the first direction may be larger than a minimum processing dimension F (a half pitch). In this case, a space between the adjacent bit lines BL (i.e., the line width of the word line WL along the first direction) is formed to be smaller than the minimum processing dimension F (the half pitch) by use of a side wall processing technology or the like. Moreover, a width (the period or the pitch) of a set of one word line WL and one bit line BL is preferably 2F. In consequence, a size of one memory cell MC can be $2F^2$.

Eighth Embodiment

Next, a memory device according to an eighth embodiment will be described. In the present embodiment, a selection element SS is shifted to a position different from that of the seventh embodiment, to suppress the occurrence of erroneous reading.

1. Re: Structure of Selection Element SS

Figure 68:
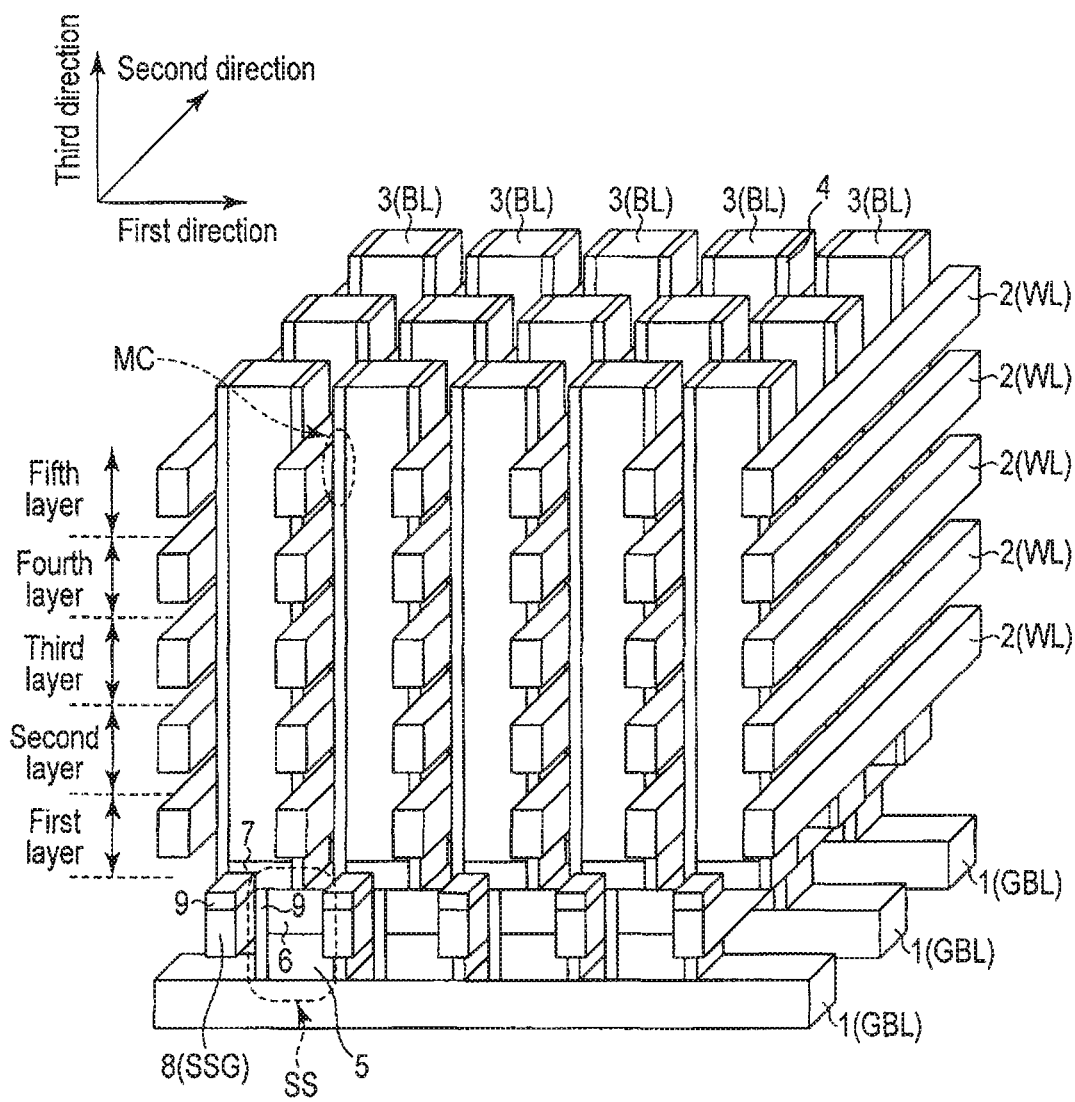

FIG. 68 is a perspective view of a memory cell array according to the present embodiment, and FIG. 69 is an enlarged sectional view of a connecting portion between the selection element SS and a bit line BL.

As shown, the selection element SS according to the present embodiment is different from the seventh embodiment in shift amount of a silicon layer 6, a source region 5 and a selection gate line SSG along a first direction. More specifically, the silicon layer 6 of the one selection element SS is connected to only one bit line BL. Both sides of the silicon layer 6 are in contact with the selection gate lines SSG via gate insulating films 9. In this case, a region where a channel is formed by the one selection gate line SSG contacts with the drain region 7, and functions as a current path between the corresponding bit line BL and a global bit line GBL. A region where a channel is formed by the other selection gate line SSG does not contact with the drain region 7. Therefore, the region does not function as the current path of a cell current. Moreover, the one selection gate line SSG is positioned immediately under the corresponding bit line BL, and the other selection gate line SSG is positioned immediately under another bit line BL.

FIG. 70 is an equivalent circuit diagram of the memory cell array according to the present embodiment. As described above, only one of two channels formed by one selection gate line SSG functions as the current path between the bit line BL and the global bit line GBL for one silicon layer 6 in the present example. That is, this structure corresponds to the structure where only one of the transistors TR1 and TR2 is provided in the equivalent circuit of FIG. 64 described in the seventh embodiment.

Therefore, as shown in FIG. 70, one bit line BL is connected to the global bit line GBL via one MOS transistor which becomes the selection element SS in the present example. Moreover, a gate of each MOS transistor is controlled by mutually different selection gate lines SSG. Therefore, when one of the selection gate lines SSG is selected during reading, only one corresponding bit line BL is connected to the global bit line GBL.

2. Re: Data Reading Method

Next, a data reading method will be described. Biases of interconnects during the reading are similar to those of the third embodiment. That is, in FIG. 7, a potential of a selection gate line SSG_n is the same potential as SSG_u. Moreover, the selected selection gate line SSG is positioned right under the selected bit line BL, and is only one selection gate line that forms a current path between the selected bit line BL and the global bit line GBL.

Figure 71:
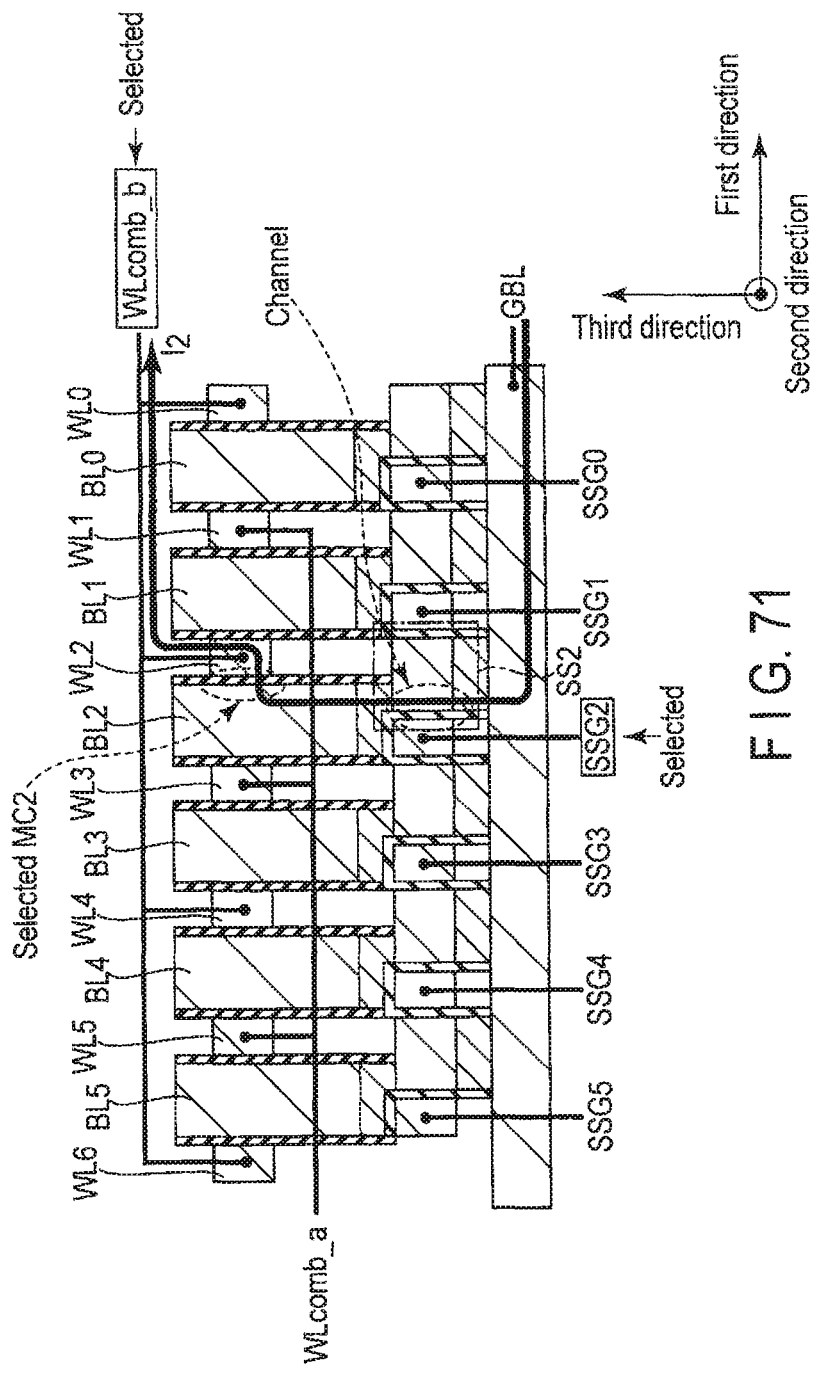

FIG. 71 is a sectional view of a memory cell array, and shows a plane formed in a first direction and a third direction. In the example of FIG. 71, word lines WL1, WL3 and WL5 belong to a word line group WLcomb_a, and word lines WL0, WL2, WL4 and WL6 belong to a word line group WLcomb_b.

In the present example, data is read from a memory cell MC2 connected to the word line WL2 and a bit line BL2. Therefore, a selector decoder 24 selects a selection gate line SSG2 positioned immediately under the bit line BL2 to apply, for example, a voltage Vg_r thereto, and applies 0 V to the other selection gate lines.

In consequence, a cell current flows into the selected word line WL2 from the global bit line GBL through a channel formed by the selection gate line SSG2, the bit line BL2 and the selected memory cell MC. The present embodiment is different from the seventh embodiment only in that only one current path is present in the selection element SS.

3. Re: Data Writing Method and Erasing Method

A data writing method is similar to the third embodiment except that data conversion is not required. That is, only one selection gate line SSG nay be selected as described in the above 2. The same applies to an erasing time.

4. Effect of the Present Embodiment

Also according to the present embodiment, interference with the adjacent cell can be suppressed, and a data reading accuracy can be enhanced. Hereinafter, the present effect will be described in detail.

In the present example, one selection gate line SSG is associated with one bit line BL (one column of bit lines BL arranged in a second direction) in the same manner as in the seventh embodiment. Therefore, a current path substantially is not formed between the global bit line GBL and another bit line BL corresponding to the unselected selection gate line SSG (another bit line column disposed in the second direction) (i.e. any effective current path is not formed).

For example, in the example of FIG. 71, the only selected bit line BL2 corresponding to the selection gate line SSG2 (bit lines BL2 arranged along the second direction) is connected to the global bit line GBL by the channel formed in the silicon layer 6 between the selection gate line SSG2 and a selection gate line SSG1. Needless to say, the channel is also formed in the channel region 6 between the selection gate line SSG2 and a selection gate line SSG3. However, this channel is formed in the vicinity of the selection gate line SSG2, and hence the channel is not electrically connected to a bit line BL3. That is, the bit line BL3 is not connected to the global bit line GBL by this channel.

In consequence, the only selected bit line BL2 is substantially connected to the global bit line GBL. Therefore, an influence of a leak current flowing through another unselected bit line can remarkably be lowered, and the data reading accuracy can further be enhanced.

5. Modification Example of the Present Example

Figure 72:
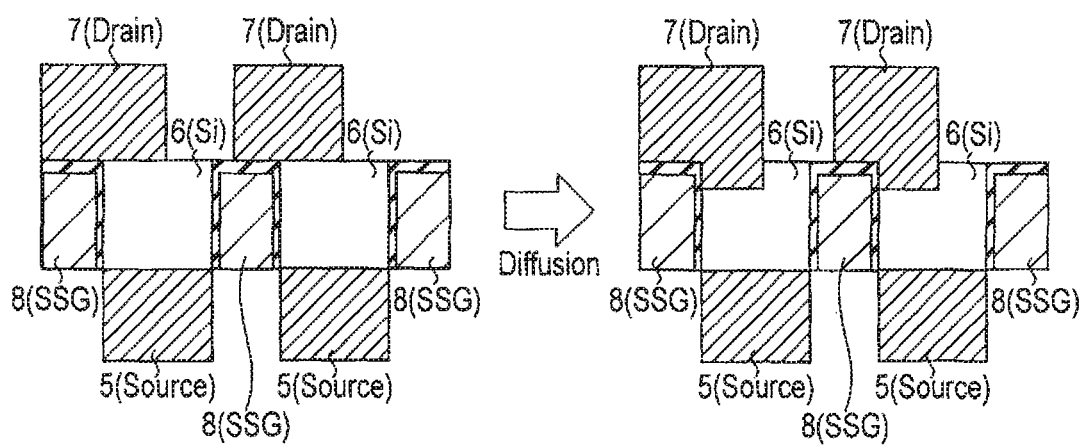
FIG. 72 is a schematic diagram of a selection element according to the eighth embodiment.

FIG. 72 is a sectional view of a selection element SS according to a modification example of the present embodiment. As shown, a drain region 7 may be diffused in a silicon layer 6 also in the present embodiment in the same manner as in FIG. 67 of the seventh embodiment.

However, the drain region 7 is diffused to such an extent that when one of two selection gates is selected in the selection element SS corresponding to an unselected bit line BL, a channel formed by this selected selection gate line SSG does not contact with the drain region 7. This is because if this channel contacts with the drain region 7, a current path is unfortunately formed between the unselected bit line and the global bit line GBL.

It is to be noted that in the present example, a space between the adjacent bit lines BL may be formed with a minimum processing dimension F, or a smaller dimension.

Ninth Embodiment

Next, a memory device according to a ninth embodiment will be described. In the present embodiment, unlike the above third, sixth, seventh and eighth embodiments, the selection gate line SSG is not shared with two selection elements SS, but the line is separated for each selection element SS, whereby wrong reading is suppressed. 1. Re: Structure of Selection Element SS FIG. 73 is a perspective view of a memory cell array according to the present embodiment, and FIG. 74 is an enlarged sectional view of a connecting portion between a selection element SS and a bit line BL.

As shown, in the present embodiment, one selection gate line SSG shared by two selection elements SS disposed adjacent in a first direction in FIG. 1 and FIG. 2 described in the first embodiment is divided into two selection gate lines SSG associated with the selection elements SS, and the lines can mutually independently be selected. Therefore, two selection gates SSG of one selection element SS are used to select the selection element SS, and any channel is not formed in another selection element SS by the selection gates SSG.

FIG. 75 is an equivalent circuit diagram of the memory cell array according to the present embodiment. As shown, two MOS transistors TR1 and TR2 are connected to one bit line BL in the present example. The two MOS transistors TR1 and TR2 are transistors included in the same selection element SS. Moreover, drains of both the transistors are connected to the same corresponding bit line BL, sources thereof are connected to a global bit line GBL, and gates thereof are connected to the same corresponding selection gate line SSG. Moreover, two selection elements corresponding to two adjacent bit lines BL do not share the selection gate line SSG. Therefore, when one of the selection gate lines SSG is selected during the reading, the only one corresponding bit line BL is connected to the global bit line GBL. Therefore, it can be considered that the present structure is equivalent to FIG. 64 described in the seventh embodiment.

FIG. 76 shows a plane pattern of the selection gate line SSG according to the present embodiment, and corresponds to a plane formed in a first direction and a second direction. In the diagram, shaded regions are the selection gate lines SSG. As shown, the selection gate line SSG in the memory cell array has a ring-like shape to surround corresponding channel regions 9.

Furthermore, the selection gate lines SSG are drawn to a hook-up region outside the memory cell array. The hook-up region is a region for connecting interconnects such as the selection gate lines SSG and word lines WL to a peripheral circuit such as a decoder. Also in the hook-up region, the selection gate lines SSG has the ring-like shape.

2. Re: Data Writing, Erasing and Reading Methods

A data writing method is similar to the third embodiment except that data conversion is not required. That is, as to the selection gate line SSG, only one selection gate line SSG of the selection element SS connected to the selected bit line BL may be selected.

Biases during data erasing and reading are similar to those of the first embodiment. However, as to the selection gate line SSG, only one selection gate line SSG of the selection element SS connected to the selected bit line BL is selected.

3. Re: Fabricating Method of Selection Gate Line

Figure 77:
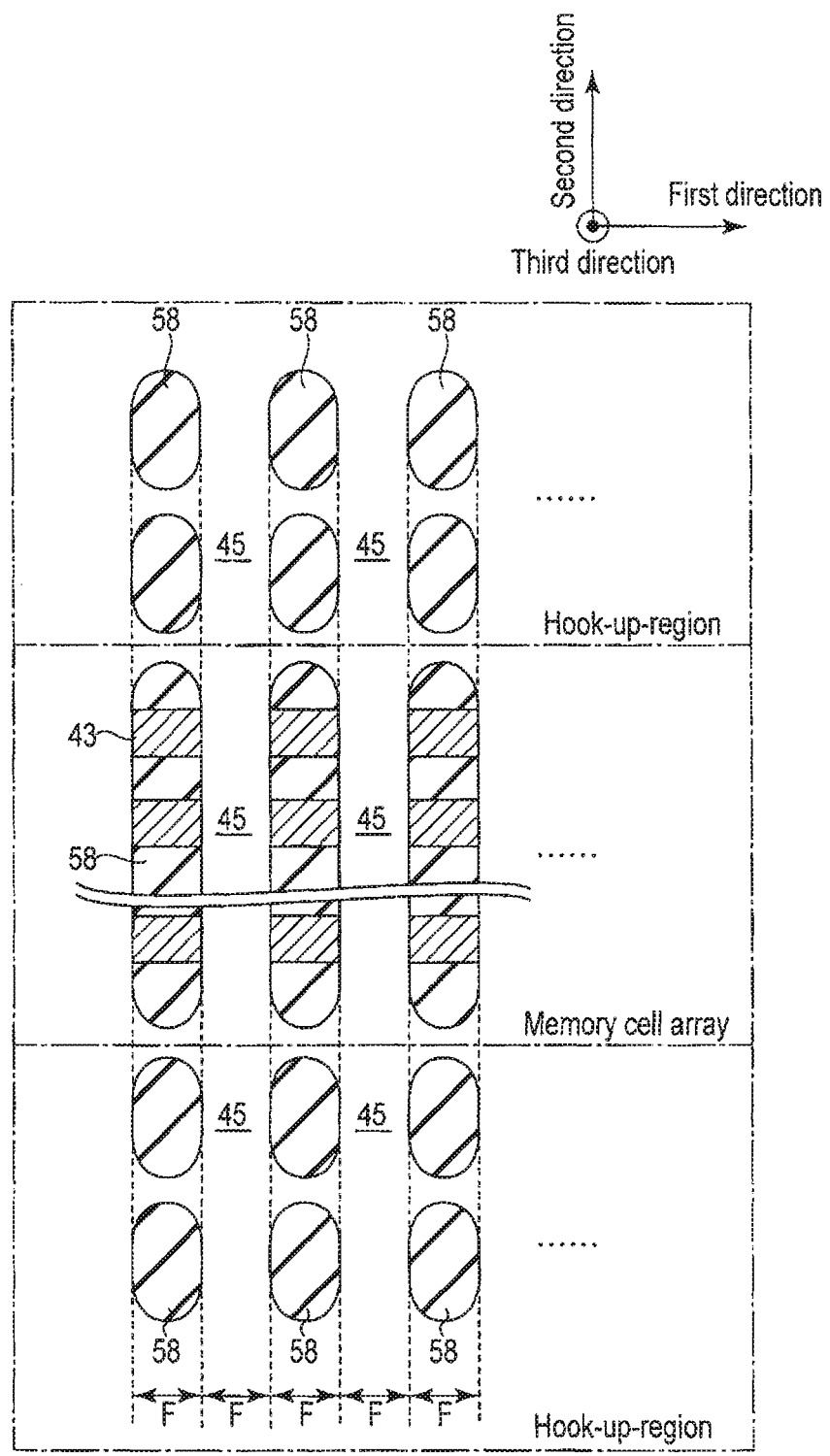

Next, a fabricating method of the selection gate line SSG according to the present embodiment will be described with reference to FIG. 77 to FIG. 79. FIG. 77 to FIG. 79 are plan views successively showing the fabricating method of the selection gate line SSG.

First, the structure of FIG. 25 is obtained by the method described in the second embodiment. Afterward, an insulating film 53 is formed on the whole surface as described with reference to FIG. 26. The insulating film 53 is formed not only in a memory cell array but also in a hook-up region. Continuously, the patterning process described with reference to FIG. 26 is performed. In this case, the insulating film 58 is left also in the hook-up region as shown in FIG. 77. A line width and an adjacent space of the insulating film 58 are set to a minimum processing dimension F.

Figure 27:
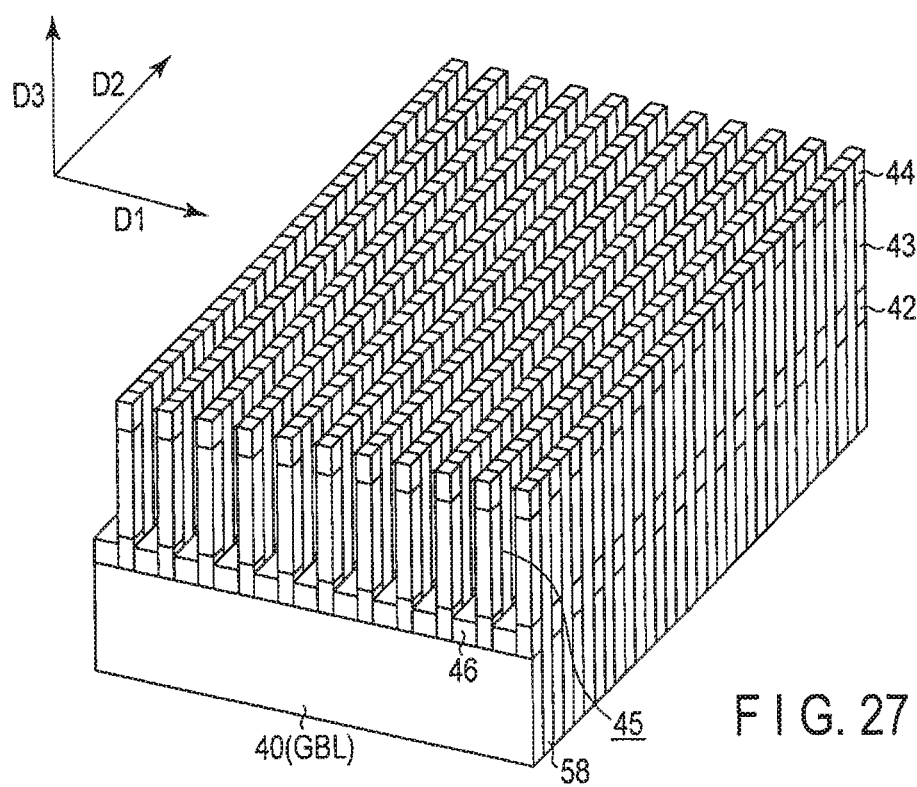
Figure 28:
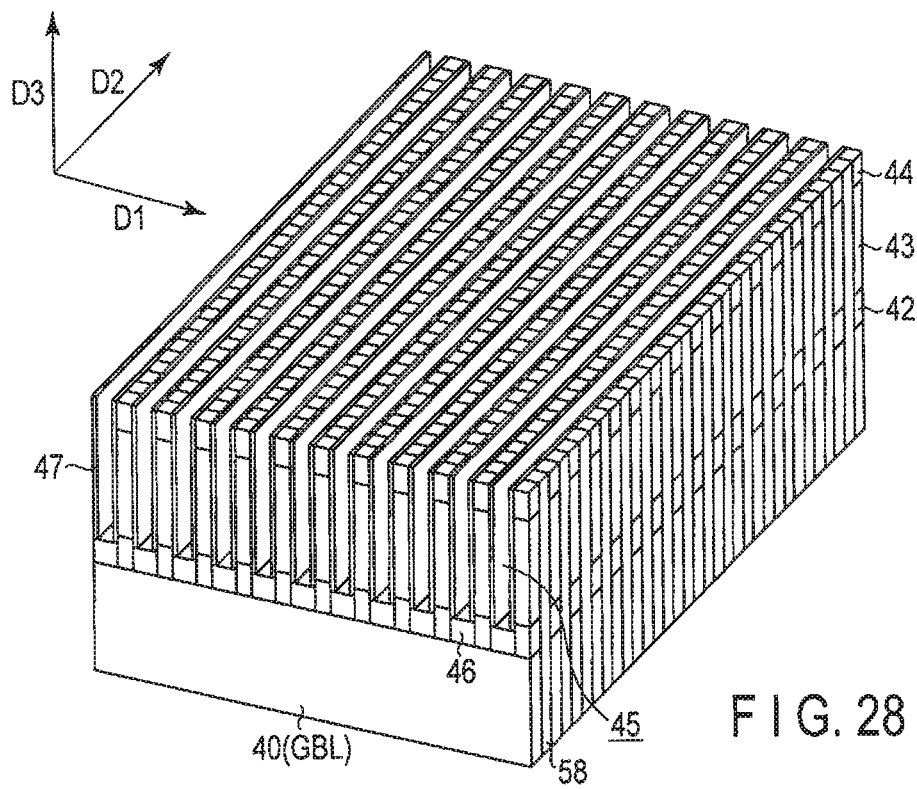

Next, as shown in FIG. 78, a gate insulating film 47 is formed through the steps of FIG. 27 and FIG. 28. In FIG. 78, the gate insulating film 47 is formed only in the memory cell array, but may further be formed on side walls of the insulating film 58 in the hook-up region.

Figure 29:
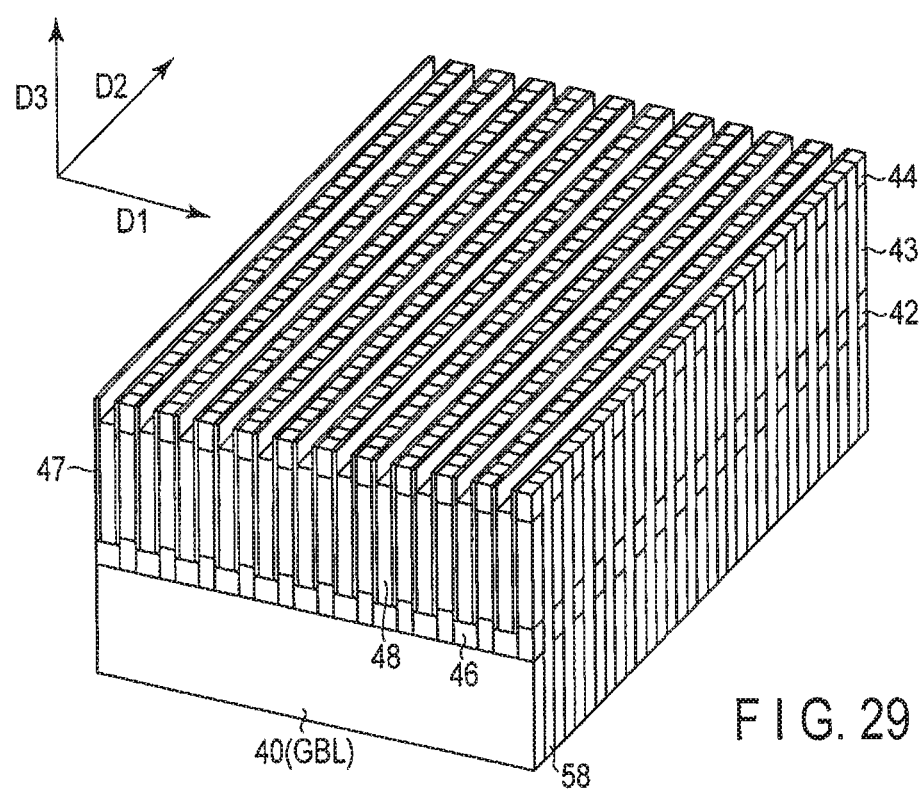
Figure 30:
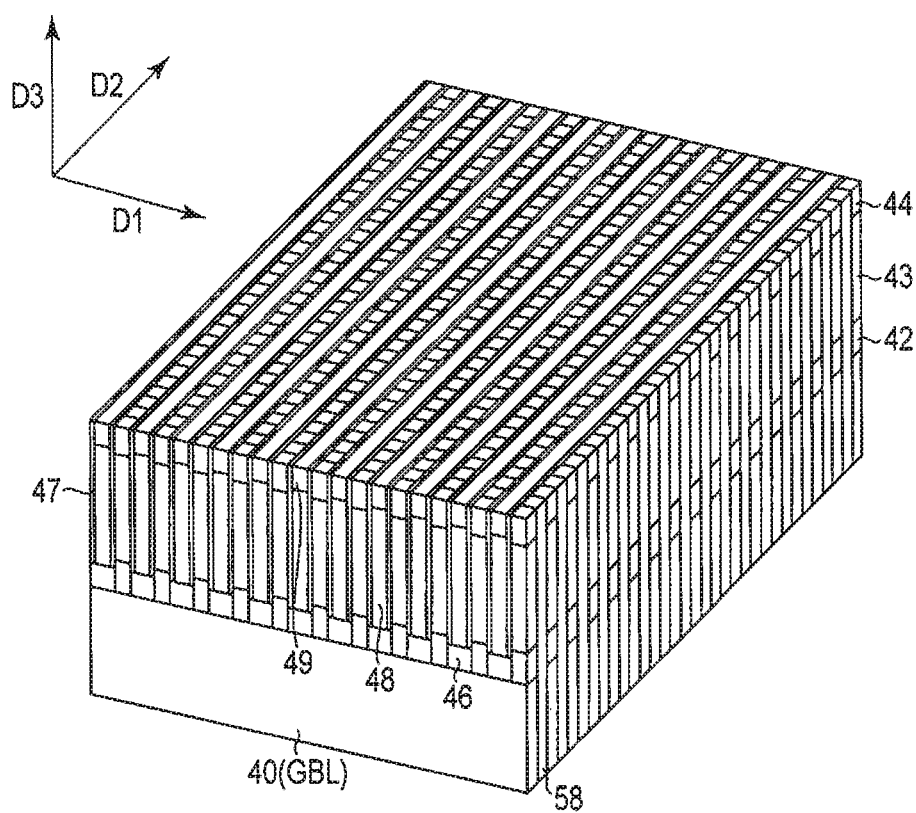

Next, as shown in FIG. 79, selection gate lines 48 are formed by the step described with reference to FIG. 29. In this case, the selection gate lines 48 are formed with a film thickness such that the lines do not fill in grooves 45. The same applies to the hook-up region. However, the selection gate lines 48 formed on the side walls of the insulating film 58 in the hook-up region and disposed adjacent to each other in a second direction are brought into contact with each other. Moreover, the selection gate lines 48 in the hook-up region also contacts with the selection gate lines 48 in the memory cell array. In other words, the adjacent space of the insulating film 58 along the second direction is twice or smaller as much as the film thickness of the selection gate line 48.

Afterward, the selection gate lines 48 are etched back to complete the selection gate lines SSG shown in FIG. 76.

4. Effect of the Present Embodiment

Also in the present embodiment, interference with adjacent cells can be suppressed, and a data reading accuracy can be enhanced. Hereinafter, the present effect will be described in detail.

In the present example, one selection gate line SSG shared by two selection elements SS in the first embodiment is divided into two selection gate lines SSG. Moreover, one selection gate line SSG obtained by the dividing is used as a gate electrode of one selection element SS (a column of selection elements SS arranged along the second direction), and the other selection elements SS (another column of selection elements SS arranged along the second direction) are not used as the gate electrodes.

Therefore, when a certain selection gate line SSG is selected during the data reading, a current path is formed only between the selected bit line BL corresponding to the selection element SS and the global bit line GBL, and any current path is not formed between the unselected bit line BL and the global bit line GBL. Therefore, the influence of a leak current flowing through the other unselected bit line BL can remarkably be lowered, and the data reading accuracy can further be enhanced.

Tenth Embodiment

Next, a memory device according to a tenth embodiment will be described. In the present embodiment, unlike the above third, sixth, seventh, eighth and ninth embodiments, a plurality of reading operations is performed to verify reading data, thereby suppressing erroneous reading.

1. Structure of Sense Amplifier

A memory cell array according to the present embodiment is shown in FIG. 1 and FIG. 2 described in the first embodiment. The present embodiment is different from the first embodiment in, for example, a structure of a sense amplifier included in a GBL decoder 23.

Figure 80:
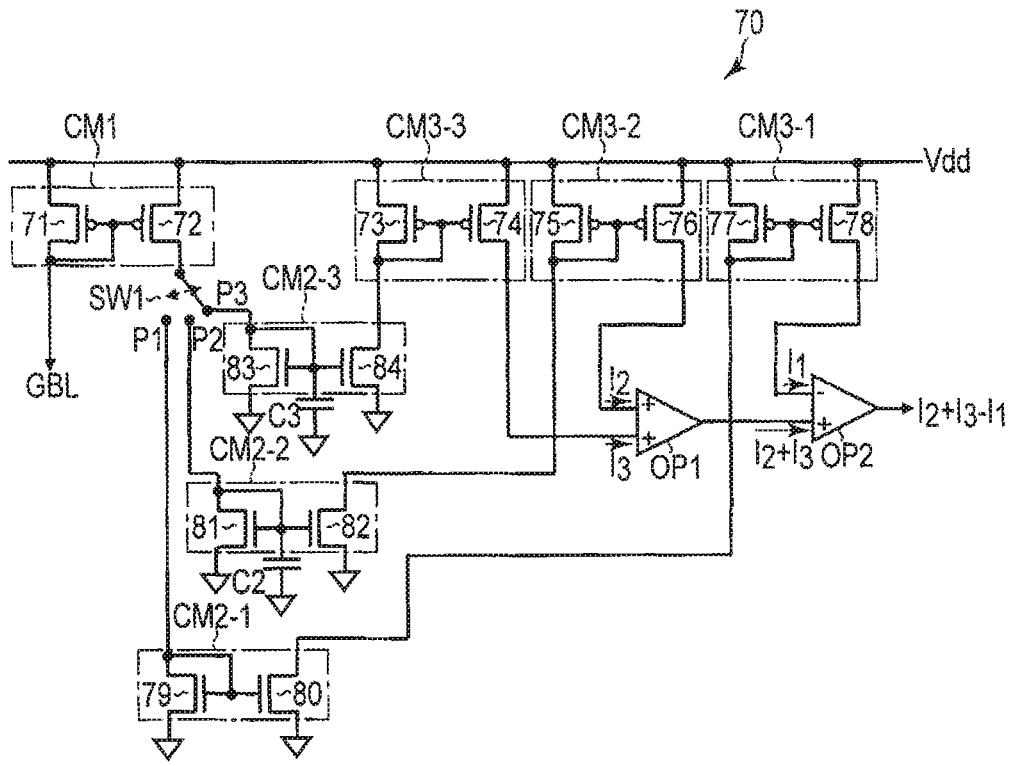
FIG. 80 is a circuit diagram of a sense amplifier according to a tenth embodiment.

FIG. 80 is a circuit diagram of a sense amplifier 70 according to the present embodiment. As shown, the sense amplifier 70 includes p-channel MOS transistors 71 to 78, n-channel MOS transistors 79 to 81, capacitor elements C2 and C3, a switch element SW1 and operation amplifiers OP1 and OP2.

Gates of the transistors 71 and 72 are connected in common to form a current mirror circuit CM1. Sources of the transistors 71 and 72 are connected to a power source potential Vdd. A drain of the transistor 71 is connected to the gate thereof and a corresponding global bit line GBL. A drain of the transistor 72 is connected to one of nodes P1 to P3 by the switch element SW1. An operation of the switch element SW1 is controlled by, for example, a controller 25.

Gates of the transistors 79 and 80 are connected in common to form a current mirror circuit CM2-1. Sources of the transistors 79 and 80 are grounded. A drain of the transistor 79 is connected to the gate thereof and the node PI. Gates of the transistors 81 and 82 are connected in common to form a current mirror circuit CM2-2. Sources of the transistors 81 and 82 are grounded. A drain of the transistor 81 is connected to the gate thereof and the node P2. One electrode of the capacitor element C2 is connected to gates of the transistors 81 and 82, and the other electrode is grounded. Gates of the transistors 83 and 84 are connected in common to form a current mirror circuit CM2-3. Sources of the transistors 83 and 84 are grounded. A drain of the transistor 83 is connected to the gate thereof and the node P3. One electrode of the capacitor element C3 is connected to gates of the transistors 83 and 84, and the other electrode is grounded.

Gates of the transistors 77 and 78 are connected in common to form a current mirror circuit CM3-1. Sources of the transistors 77 and 78 are connected to the power source potential Vdd. A drain of the transistor 77 is connected to the gate thereof and a drain of the transistor 80. Gates of the transistors 75 and 76 are connected in common to form a current mirror circuit CM3-2. Sources of the transistors 75 and 76 are connected to the power source potential Vdd. A drain of the transistor 75 is connected to the gate thereof and a drain of the transistor 82. Gates of the transistors 73 and 74 are connected in common to form a current mirror circuit CM3-3. Sources of the transistors 73 and 74 are connected to the power source potential Vdd. A drain of the transistor 73 is connected to the gate thereof and a drain of the transistor 84.

A non-inverting input terminal of the operation amplifier OP1 is connected to drains of the transistors 76 and 74. A inverting input terminal of the operation amplifier OP2 is connected to a drain of the transistor 78, and a non-inverting input terminal thereof is connected to an output terminal of the operation amplifier OP1.

2. Re: Reading Operation

Figure 81:
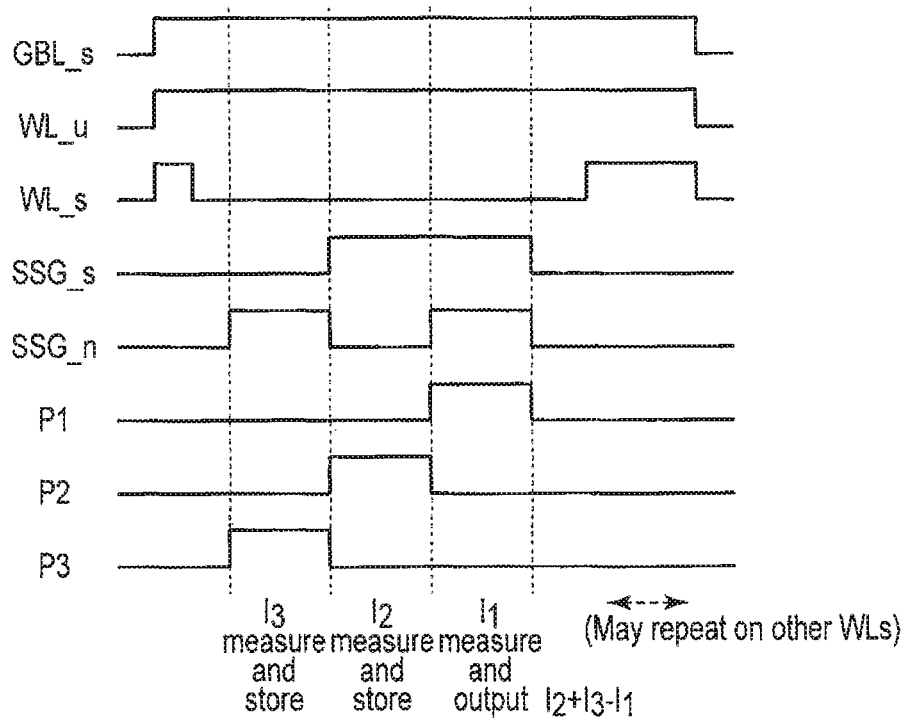
FIG. 81 is a timing chart of various types of signals according to the tenth embodiment.

Next, a data reading method according to the present embodiment will be described with reference to FIG. 80 and FIG. 81. FIG. 81 is a timing chart showing potentials of signal lines GBL_s, WL_u, WL_s, SSG_s and SSG_n and a state of the switch element SW1, and P1 to P3 in the chart means that when the nodes P1 to P3 have "H" level, the nodes are connected to the transistor 72, respectively.

As shown, for example, the controller 25 first connects the selected global bit line GBL_s to the sense amplifier 70 (the drain of the MOS transistor 71), and the GBL decoder 23 applies a predetermined reading bias (e.g., Vr+Vo) to GBLs. At this time, a WL decoder 22 applies a predetermined reading bias (Vr+Vo) to both of the selected word line WL_s and the unselected word line WL_u of a measurement object cell arrangement. Continuously, the WL decoder 22 lowers the voltage of the selected word line (WL_s: only one WLcomb is selected from one cell arrangement) to a predetermined reading selection voltage (e.g., Vo). In this state, data is roughly read by the following three steps.

(First Step)

First, the controller 25 connects the switch element SW1 to the node P3. Moreover, a selector decoder 24 applies the selection gate voltage (e.g., Vg_r) to the selection gate line SSG_n. SSG_s and SSG_u are set to 0 V. In consequence, a current I3 flowing through the global bit line GBL is transferred to the current mirror circuit CM2-3 of a second stage via the current mirror circuit CM1 of a first stage. Then, a gate voltage corresponding to the current I3 is held in the capacitor element C3.

(Second Step)

Next, the controller 25 connects the switch element SW1 to the node P2. Then, the selector decoder 24 applies 0 V to the selection gate line SSG_n to which the selection gate voltage has been applied in the first step, and applies the selection gate voltage to SSG_s. Heedless to say, SSG_u is 0 V. In consequence, the current I2 flowing through the global bit line GBL is transferred to the current mirror circuit CM2-2 of the second stage via the current mirror circuit CM1 of the first stage. Then, a gate voltage corresponding to a current I2 flowing through the global bit line GBL is held in the capacitor element C2.

(Third Step)

Finally, the controller 25 connects the switch element SKI to the node P1. Then, the selector decoder 24 applies the selection gate voltage to two selection gate lines SSG_s and SSG_n. In consequence, a current I1 flowing through the global bit line GBL is transferred to the current mirror circuit CM2-1 of the second stage via the current mirror circuit CM1 of the first stage.

At this time, the current mirror circuits CM2-3 and CM2-2 of the second stage output a current equivalent to the currents I3 and I2 by a charge accumulated in the capacitor elements C3 and C2. Therefore, the currents I3 and I2 are transferred to the current mirror circuits CM3-3 and CM3-2 of a third stage. In consequence, the output of the operation amplifier OP1 constituted as an addition circuit is equivalent to the sum of the currents I3 and I2.

Then, the output of the current mirror circuit CM2-1 of the second stage is transferred to an input of the current mirror circuit CM3-1 of the third stage, and hence the output of the current mirror circuit CM3-1 becomes the current I1. In consequence, the output of the operation amplifier OP2 constituted as a differential amplification circuit is equivalent to a value of the current (I2+I3−I1).

It is to be noted that the above operation is repeatedly performed for different selected word lines if necessary, whereby it is possible to successively read stored values of the cells on the same global bit line. Moreover, it is also possible to read, in parallel, the stored values of the cells on the plural, global bit lines by use of plural reading circuits.

3. Effect of the Present Embodiment

Also according to the present embodiment, interference with adjacent cells can be suppressed, and a data reading accuracy can be enhanced. Hereinafter, the present effect will be described in detail. FIG. 82 to FIG. 84 are sectional views of a memory cell array.

FIG. 82 shows a case where reading is performed while both of the selection gates SSG_s and SSG_n of the selection element SS directly connected to the bit line BL connected to the selected memory cell MC are set to a high potential, in the sane manner as in the writing or erasing.

As described in the third embodiment, the current flowing through the OFF2-element is remarkably small, and can be ignored. Therefore, the current I1 flowing through the global bit line GBL becomes the sum of a current Ia flowing through the selected memory cell MC via the ON-element and currents Ib and Ic flowing through the unselected memory cell via the OFF1-element. Then, the current Ib and Ic flowing through the OFF1-element become background noise as described above.

In this respect, not only the reading of FIG. 82 is performed but also the reading is further twice by changing bias conditions. That is, the reading is performed three times in total, to remove this noise. That is, the current I1 is detected in a state where the voltage Vg_r is applied to both of the selection gate lines SSG_s and SSG_n. Moreover, the data is read while applying the voltage Vg_r only to the selection gate line SSG_s (to apply 0 V to the selection gate line SSG_u), and the data is further read while applying the voltage Vg_r only to the selection gate line SSG_n (to apply 0 V to the selection gate line SSG_s).

FIG. 83 shows a behavior that the data is read while applying the voltage Vg_r only to the selection gate line SSG_s. In this case, the current I2 flowing through the global bit line GBL becomes the sum of the currents Ia and Ib. Moreover, FIG. 84 shows a behavior that the data is read while applying the voltage Vg_r only to the selection gate line SSG_n. In this case, the current I3 flowing through the global bit line GBL becomes the sum of the currents Ia and Ic. At this time, the current Ib of FIG. 82 and the current Ib of FIG. 83 have the same current value because cell resistance and selection element SS states are all the same. Similarly, the current Ic of FIG. 82 and the current Ic of FIG. 84 have the same current value. Furthermore, the current value is mainly determined by a cell resistance size on the reading bias conditions sometimes, which does not depend on whether the selection element is ON element or the OFF1-element. On these conditions, the selection cell currents Ia of FIG. 82 to FIG. 84 have a substantially equal amount.

In consequence, when (I2+I3−I1)=((Ia+Ib)+(Ia+Ic)−(Ia+Ib+Ic)) is detected, the current other than the current flowing through the selected memory cell can be cancelled, and the only current Ia flowing through the selected memory cell can be detected. That is, the background noise can be cancelled, and the data reading accuracy can be enhanced.

It is to be noted that a method of using an analog circuit for detecting (I2+I3−I1) was utilized in the present embodiment. However, it is possible to use a method of performing digitization (4-level digitalization) in a detection stage of I1, I2 and I3, and finally digitally calculating (I2+I3−I1).

[Modification Example, etc.]

As described above, the memory device according to the above first to tenth embodiments includes first interconnects (GBL in FIG. 1), second interconnects(WL in FIG. 1), third interconnects(BL in FIG. 1), a memory cell(MC in FIG. 1), and selectors(SS in FIG. 1). The respective first interconnects GBL are provided along a first direction. The respective second interconnects WL are provided along a second direction different from the first direction. The respective third interconnects BL are provided along a third direction different from the first and second directions. The memory cells MC includes variable resistance layers 4 formed on two side surfaces of the third interconnects and connected to the mutually different second interconnects. The selectors SS connect the third interconnects to the first interconnects. One of the selectors SS includes a semiconductor layer(Si layer in FIG. 1) provided between associated one of the third interconnects and associated one of the first interconnects, and gates(SSG in FIG. 1) formed on two side surfaces of this semiconductor layer facing each other in the first direction with gate insulating films interposed therebetween.

The embodiments are not limited to the above-mentioned configurations, and can variously be modified. For example, the respective embodiments can appropriately be combined, or can be performed alone. For example, the operations of the above third to tenth embodiments have been described on the assumption that the offset voltages Vo and 1 V are used in the same manner as in the first embodiment, but the offset voltage may not be used. Moreover, the writing method described in the fourth embodiment may be applied to the other embodiments. Furthermore, the pattern of the word lines described in the sixth embodiment may be applied to the seventh to tenth embodiments.

Moreover, in the third embodiment, the data does not necessarily have to be written in order of the memory cells MC0 to MC(n−1). There is not any special restriction on the writing order, as long as the cell values c0 to c(n−1) converted on the basis of the above-mentioned rule are written in the memory cells MC0 to MC(n−1). Therefore, there may be a case where, for example, the cell value c(n−1) is first written in the memory cell MC(n−1), and then the cell value c0 is written in the memory cell MC0. The same applies to the reading, and it is not necessary to read the data In order of the memory cells MC0 to MC(n−1). Even when the data is read in any order, the influence of the adjacent cells is suppressed.

Further in the fabricating methods described in the second and tenth embodiments, the order can be changed as much as possible, or the steps may simultaneously be performed. Furthermore, the above-mentioned materials or specific values of the film thicknesses and the like can appropriately be changed.

Moreover, the bit lines, the word lines and the global bit lines do not necessarily have to orthogonally cross one another, as long and the directions thereof are different from one another. Moreover, a sectional shape and/or a planar shape of a stacked structure of the memory cell is not limited to the square shape, and another polygonal or round shape may be used.

Furthermore, the circuit diagrams and the like described in the above embodiments are merely examples, and there is not any special restriction, as long as the function of each embodiment can be realized. For example, the circuit of FIG. 80 is an example, and there is not any special restriction on the constitution, as long as (I2+I3−I1) can be calculated. Moreover, the reading order is not limited to FIG. 81. For example, when the current mirror circuit CM2-1 is provided with a capacitor element, the current I1 can be detected in the first step or the second step.

It is to be noted that the above embodiments can include the following configurations.

[1] A memory device comprising:

a plurality of first interconnects(GBL in FIG. 1) provided along a first direction, respectively;

a plurality of second interconnects(WL in FIG. 1) provided along a second direction different from the first direction, respectively;

a plurality of third interconnects(BL in FIG. 1) provided along a third direction different from the first and second directions, respectively;

a plurality of memory cells(MC in FIG. 1) including variable resistance layers(variable resistance elements in FIG. 1) formed on two side surfaces, facing each other in the first direction, of the third interconnects and coupled with the mutually different second interconnects; and a plurality of selectors (SS in FIG. 1) which couple the third interconnects with the first interconnects, wherein one of the selectors(SS in FIG. 1) includes a semiconductor layer(Si6 in FIG. 1) provided between associated one of the third interconnects and associated one of the first interconnects, and a plurality of gates(SSG in FIG. 1) formed on two side surfaces of the semiconductor layer facing each other in the first direction with gate insulating films interposed therebetween.

[2] The device according to [1], wherein first one of the selectors shares one of the gates with second one of the selectors adjacent to the first one of the selectors.

[3] The device according to [2], wherein in one of the selectors associated with one of the third interconnects coupled with a memory cell which is selected to be read data, a selection voltage is applied to one of the gates provided on the two side surfaces, and a non-selection voltage is applied to another of the gates.

[4] The device according to [3], wherein the second interconnects alternately belong to the sane interconnect group (WLcomb_a or WLcomb_b in FIG. 3), and the same voltage is applied to two or more of the second interconnects belonging to the same interconnect group in an operation.

[5] The device according to [4], further comprising:
a controller which controls a writing operation of data into the memory cell,
wherein the controller writes cell values (c0, c1, . . . c(n−1)) obtained according to the following equations in the memory cells (MC0, MC1, . . . MC(n−1)), when receiving, from a host apparatus, data values (d0, d1, . . . d(n−1)) as writing-data into the memory cells (MC0, MC1, . . . MC(n−1)) (FIG. 33), $$c0=d0, \text{ and}$$

$$c(k+1)=d(k+1)+ck,$$

where (MC0, MC1, . . . MC(n−1)) indicate the memory cells coupled with the second interconnects belonging to the same interconnect group and arranged in order from the memory cell MC0 positioned at the endmost portion, and
n is a natural number of 2 or larger, and (k+1) is a natural number of 1 to (n−1).

[6] The device according to [5], wherein one of the second interconnects(WL) which is coupled with the memory cell MC0 is located between other two of the second interconnects belonging to the different interconnect group(FIGS. 31&32).

[7] The device according to [6], wherein when data is read from a memory cell MC(k+1) in data reading, the selection voltage is applied to one of the gates which forms a channel between a memory cell MCk and one of the first interconnects in the two gates of one of the selectors associated with one of the third interconnects coupled with the memory cell MC(k+1) (FIGS. 38&39).

[8] The device according to [5], wherein the controller writes data in the memory cells (MC0, MC1, . . . MC(n−1)) of one of the interconnect group (WLcomb), and then repeats the writing data to the different interconnect group (WLcomb) (steps S41 to S46 in FIG. 48).

[9] The device according to [8], wherein the controller repeats the writing data to the interconnect group(WLcomb) in the different first interconnect(GBL) (steps S40 and S47&48 in FIG. 48).

[10] The device according to [5], wherein the controller writes the data in the memory cells(MC0, MC1, . . . MC(n−1)) of one of the interconnect groups(WLcomb), and then repeats the writing data to the different first interconnect (GBL)(FIG. 50).

[11] The device according to [10], wherein the controller repeats the writing data to the first interconnect(GBL) in the different interconnect group(WLcomb)(FIG. 50).

[12] The device according to [2], wherein each of the second interconnects belongs to one of three or more interconnect groups (WLcomb_a to WLcomb_d in FIG. 56),
the same voltage is applied to one or more of the second interconnects belonging to the same interconnect group during the operation, and
the three adjacent second interconnects belong to the mutually different interconnect groups.

[13] The device according to [12], wherein a selection voltage is applied to one of the gates(SSG2 in FIG. 57) which forms a channel in one of the selectors(SSG2 in FIG. 57) associated with one of the third interconnects(BL2 in FIG. 57) which is not coupled with the selected second interconnect(WL1 in FIG. 57) in the two gates(SSG1,SSG2 in FIG. 57) of the one of the selectors(SSG1 in FIG. 57) associated with the one of the third interconnects(BL1 in FIG. 57) coupled with a memory cell which is to be read data in the data reading.

[14] The device according to [2], wherein one of the selectors is shared by two adjacent ones of the third interconnects(FIGS. 61&62).

[15] The device according to [14], wherein the one of the selectors further includes a source region coupled with the associated one of the first interconnects, the semiconductor layer stacked on the source region, and a first drain region and a second drain region coupled with two adjacent ones or the third interconnects, and
the gates are provided immediately under the third interconnects(FIGS. 61&62).

[16] The device according to [15], wherein a selection voltage is applied to one of the gates(SSG2 in FIG. 65) positioned immediately under one of the third interconnects (BL2 in FIG. 65) coupled with a memory cell which is selected to be read data in data reading.

[17] The device according to [16], wherein the one of the gates to which the selection voltage is applied allows two of the selectors (SS1,SS2 in FIG. 65) to provide a current path between one of the third interconnects (BL2 in FIG. 65) coupled with the memory cell which is selected to be read data and associated one of the first interconnects(GBL in FIG. 65).

[18] The device according to [2], wherein the one of the selectors further includes a source region coupled with the associated one of the first interconnects, the semiconductor layer provided on the source region, and a drain region provided on the semiconductor layer and coupled with the associated one of the third interconnects, and
the drain region overlaps, in the first direction, with the semiconductor layer in a partial region(FIGS. 68&69).

[19] The device according to [18], wherein the semiconductor layer includes a first region in which a first channel is formed by one of the gates formed on the two side surfaces of the semiconductor layer and a current path is formed between the drain region and the source region by the first channel, and
a second region in which a second channel is formed by the another of the gates formed on the two side surfaces and the second channel is isolated from the drain region (FIG. 69).

[20] The device according to [19], wherein the selection voltage is applied to the one of the gates(SSG2 in FIG. 71) which forms the first channel in the first region in a selector (SS2 in FIG. 71) associated with one of the third interconnects (BL2 in FIG. 71) coupled with a memory cell which is selected to be read data in data reading.

[21] The device according to [20], wherein the second channel does not function as an effective current path between the one of the third interconnects(BL2 in FIG. 69) and the one of the first interconnects (GBL in FIG. 69).

[22] The device according to [1], wherein in each of the selectors, gates(SSG in FIG. 76) provided on the side surfaces of the semiconductor layer are coupled with each other in common along a second direction, and
the gates are separated between the selectors.

[23] The device according to [22], wherein a size of the gate along the first direction is smaller than ½ of a size of the second interconnect along the first direction (FIGS. 73&74,76).

[24] The device according to [23], wherein a size of the gate along the first direction is smaller than a minimum processing dimension in a photolithography technology (FIGS. 73&74,76).

[25] The device according to [2], further comprising:
a controller which controls a reading operation of data from the memory cells, wherein the controller detects a first current(I1 in FIG. 82) flowing through one of the first interconnects, when the two gates of a selector corresponding to a memory cells which is selected to be read data, a second current(I2 in FIG. 83) flowing through the one of the first interconnects, when one of the gates is selected and another of the gates is unselected, and a third current(I3 in FIG. 84) flowing through the one of the first interconnects, when the one of the gates is unselected and the another of the gates is selected, and determines reading data on the basis of the first to third currents.

[26] The device according to [25], wherein the controller subtracts the first current from the sum of the second current and the third current, to determine the reading data(FIG. 80 to 84).

[27] The device according to [1], wherein each of the second interconnects belongs to one of two or more interconnect groups(WLcomb_a,WLcomb_b in FIG. 43 to 46), and the same voltage is applied to one or more of the second interconnects belonging to the same one of the interconnect groups in an operation, wherein the controller writes data in the memory cells of one of the interconnect groups (WLcomb_a1 in FIG. 43 to 46), and then repeats the writing data to different one of the interconnect groups(WLcomb_b1 in FIG. 43 to 46).

[28] The device according to [27], wherein the controller repeats the writing data of the interconnect groups(WLcomb_a,WLcomb_b in FIG. 43 to 46) to different one of the first interconnects(GBL in FIG. 43 to 46).

[29] The device according to [1], wherein each of the second interconnects belongs to one of two or more interconnect groups (WLcomb_a, WLcomb_b in FIG. 43 to 46), and the same voltage is applied to one or more of the second interconnects belonging to the same interconnect group in an operation, wherein the controller writes data in the memory cells of one of the interconnect groups (WLcomb_a, WLcomb_b), and then repeats the writing data to different one of the first interconnects (GBL).

[30] The device according to [29], wherein the controller repeats the writing data of the first interconnects(GBL) to the different one of the interconnect groups(WLcomb_a, WLcomb_b).

[31] A fabricating method of a memory device comprising:

forming a plurality of global bit lines along a first direction(FIG. 11);

forming a semiconductor layer on the global bit lines (FIG. 13);

patterning the semiconductor layer along a second direction orthogonal to the first direction(FIG. 14);

forming a plurality of gate insulating films on side surfaces of the patterned semiconductor layer(FIG. 15);

forming gate electrodes on the side surfaces of the patterned semiconductor layer(FIG. 16);

forming a plurality of layers of word lines on the patterned semiconductor layer(FIGS. 19&20);

forming a variable resistance material on side surfaces of the word lines; and forming a plurality of bit lines in contact with the variable resistance material and the upper surface of the semiconductor layer (FIG. 23).

[32] A fabricating method of a memory device comprising:

successively forming global bit line film and a semiconductor layer (FIG. 24);

patterning the global bit line film and the semiconductor layer along a first direction (FIG. 25);

filling in grooves generated by the patterning with an insulating film (FIG. 26);

patterning the semiconductor layer and the insulating film along a second direction orthogonal to the first direction (FIG. 26);

forming a plurality of gate insulating films on side surfaces of the patterned semiconductor layer (FIG. 28);

forming a plurality of layers of word lines on the patterned semiconductor layer (FIGS. 19&20);

forming a variable resistance material on side surfaces of the word lines (FIG. 23); and forming a plurality of bit lines in contact with the variable resistance material and the upper surface of the semiconductor layer (FIG. 23).

[33] The method according to [32], wherein the gate electrode fills in a groove between adjacent patterned semiconductor layers (FIG. 16).

[34] The method according to [32], wherein the gate electrode does not fill in a groove between adjacent patterned semiconductor layers (FIG. 79).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a substrate;
   a CMOS circuit configured to perform operations to a memory element;
   a memory array disposed above the CMOS circuit; and
   a electrically connecting portion between the CMOS circuit and the memory array,
   wherein the memory array comprises:
      a plurality of first wirings provided above the substrate, and extending horizontally;
      a plurality of second wirings extending horizontally;
      a plurality of third wirings extending vertically;
      at least one memory element integrally formed between a third wiring of the plurality of third wirings and its crossing second wiring; and
      at least one selector which selectively electrically couples the third wiring to one of the plurality of first wirings.

2. The device according to claim 1, wherein the plurality of first wirings are disposed below the memory element.

3. The device according to claim 1, wherein the selector is disposed below the memory element.

4. The device according to claim 1, wherein the plurality of second wirings are configured in a plurality of first layers, each of the plurality of first layers including second wirings, and
   the plurality of third wirings are configured in a plurality of rows such that the plurality of rows of the plurality of third wirings are interleaved with the second wirings of the plurality of first layers and a row of the plurality of third wirings is positioned between each consecutive pair of second wirings in each of the plurality of first layers.

5. The device according to claim 4, wherein the memory array has a unit memory cell footprint of $2F^2$, where F is the minimum feature size of the memory array.

6. The device according to claim 4, wherein each of the second wirings belongs to one of two second wiring groups in the first layer,
the same voltage is applied to the second wirings belonging to the same second wiring group during the operation, and
the two adjacent second wirings belong to the mutually different second wiring groups.

7. The device according to claim 6, wherein the at least one selector comprises selectors, one of the selectors includes a semiconductor layer and gates formed on two side surfaces of the semiconductor layer facing each other with gate insulating films interposed therebetween.

8. The device according to claim 7, wherein first one of the selectors shares one of the gates with second one of the selectors adjacent to the first one of the selectors.

9. The device according to claim 8, wherein one of the selectors is associated with one of the plurality of third wirings connected to the memory element which is selected to be read data,
a selection voltage is applied to one of the gates provided on the two side surfaces, and
a non-selection voltage is applied to another of the gates.

10. The device according to claim 4, wherein each of the second wirings belongs to one of three or more second wiring groups in the first layer,
a same voltage is applied to the second wirings belonging to a same second wiring group during the operation, and
three adjacent second wirings belong to the mutually different second wiring groups.

11. The device according to claim 10, wherein the at least one selector comprises selectors, one of the selectors includes a semiconductor layer and gates formed on two side surfaces of the semiconductor layer facing each other with gate insulating films interposed therebetween.

12. The device according to claim 11, wherein first one of the selectors shares one of the gates with second one of the selectors adjacent to the first one of the selectors.

13. The device according to claim 12, wherein the at least one selector comprises selectors, one of the selectors is associated with one of the plurality of third wirings connected to the memory element which is selected to be read data,
a selection voltage is applied to one of the gates provided on the two side surfaces, and
a non-selection voltage is applied to another of the gates.

14. The device according to claim 12, wherein a selection voltage is applied to one of the gates provided on one of the two side surfaces of one of the selectors associated with one of the plurality of third wirings connected to the memory element which is not connected to the selected second wiring, and
the selection voltage is applied to one of the gates provided on one of the two side surfaces of another one of the selectors associated with the one of the plurality of third wirings connected to the memory element which is to be read data in the data reading.

15. The device according to claim 14, wherein the selected second wiring and the one applied with the selection voltage of the gates are not vertically aligned.

16. The device according to claim 1, wherein the selector comprises vertical field-effect transistor.

17. The device according to claim 1, wherein the memory element comprises a resistive change memory film.

18. A memory device comprising:
first wirings extending along a first direction;
two or more groups of second wirings separated from each other, the second wirings extending along a second direction crossing the first direction;
a third wiring between the groups of second wirings, the third wiring extending along a third direction different from the first direction and the second direction;
at least one variable resistivity layer between the third wiring and a second wiring of the groups of second wirings, the variable resistivity layer functioning as a memory element; and
at least one selector between the third wiring and one of the first wirings,
wherein the selector includes:
a semiconductor layer coupled with the third wiring and the one of the first wirings, and
a pair of gates on two side surfaces of the semiconductor layer facing each other in the first direction with gate insulating layers therebetween.

19. The device according to claim 18, wherein the at least one selector comprises selectors, first one of the selectors shares one of the gates with second one of the selectors adjacent to the first one of the selectors.

20. The device according to claim 19, wherein one of the selectors is associated with one of the third wirings connected to the memory element which is selected to be read data,
a selection voltage is applied to one of the gates provided on the two side surfaces, and
a non-selection voltage is applied to another of the gate.

* * * * *